(12) United States Patent
Morii et al.

(10) Patent No.: US 8,569,839 B2
(45) Date of Patent: Oct. 29, 2013

(54) SEMICONDUCTOR DEVICE AND MANUFACTURING METHOD THEREOF

(75) Inventors: Katsumi Morii, Kanagawa (JP); Yoshitaka Otsu, Kanagawa (JP); Kazuma Onishi, Kanagawa (JP); Tetsuya Nitta, Kanagawa (JP); Tatsuya Shiromoto, Kanagawa (JP); Shigeo Tokumitsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 261 days.

(21) Appl. No.: 13/010,417

(22) Filed: Jan. 20, 2011

(65) Prior Publication Data

US 2011/0175205 A1     Jul. 21, 2011

(30) Foreign Application Priority Data

Jan. 20, 2010    (JP) .................................. 2010-010085

(51) Int. Cl.
     *H01L 21/8238*      (2006.01)
     *H01L 21/70*      (2006.01)

(52) U.S. Cl.
     USPC .......... 257/374; 257/501; 257/506; 257/510; 257/E29.02; 257/E21.545; 438/221; 438/421

(58) Field of Classification Search
     USPC .......... 438/221, 421; 257/374, 501, 506, 510, 257/E29.02, E21.545, E21.546
     See application file for complete search history.

(56) References Cited

U.S. PATENT DOCUMENTS

| 7,560,781 B2 * | 7/2009 | Gotoh et al. ................ 257/369 |
| 7,652,346 B2 * | 1/2010 | Suzuki et al. ................ 257/510 |
| 2002/0040994 A1 | 4/2002 | Nitta et al. |
| 2007/0117306 A1 | 5/2007 | Oyamatsu |

FOREIGN PATENT DOCUMENTS

| JP | 04-290246 | 10/1992 |
| JP | 2002-083866 | 3/2002 |
| JP | 2002-118256 | 4/2002 |
| JP | 2004-247463 | 9/2004 |
| JP | 2007-142276 | 6/2007 |
| JP | 2008-021675 | 1/2008 |

* cited by examiner

*Primary Examiner* — Minh-Loan T Tran
(74) *Attorney, Agent, or Firm* — McDermott Will & Emery LLP

(57) ABSTRACT

To provide a semiconductor device that can be manufactured using a simple process without ensuring a high embedding property; and a manufacturing method of the device. In the manufacturing method of the semiconductor device according to the invention, a semiconductor substrate having a configuration obtained by stacking a support substrate, a buried insulating film, and a semiconductor layer in order of mention is prepared first. Then, an element having a conductive portion is completed over the main surface of the semiconductor layer. A trench encompassing the element in a planar view and reaching the buried insulating film from the main surface of the semiconductor layer is formed. A first insulating film (interlayer insulating film) is formed over the element and in the trench to cover the element and form an air gap in the trench, respectively. Then, a contact hole reaching the conductive portion of the element is formed in the first insulating film.

5 Claims, 61 Drawing Sheets

WIDTH OF TRENCH DTR AT CENTER OF WAFER: 0.8 μm (CAD SIZE)

WIDTH OF TRENCH DTR AT CENTER OF WAFER: 0.9 μm (CAD SIZE)

WIDTH OF TRENCH DTR AT CENTER OF WAFER: 1.0 μm (CAD SIZE)

WIDTH OF TRENCH DTR AT CENTER OF WAFER: 1.1 μm (CAD SIZE)

SEMICONDUCTOR DEVICE AND MANUFACTURING METHOD THEREOF

CROSS-REFERENCE TO RELATED APPLICATIONS

The disclosure of Japanese Patent Application No. 2010-10085 filed on Jan. 20, 2010 including the specification, drawings and abstract is incorporated herein by reference in its entirety.

BACKGROUND OF THE INVENTION

The present invention relates to a semiconductor device and a manufacturing method thereof, in particular, to a semiconductor device having a trench and a manufacturing method of the device.

For example, Japanese Patent Laid-Open No. 2002-118256 discloses an element isolation (deep trench isolation: DTI) structure obtained by filling an insulating film in a trench with a high aspect ratio.

According to the technology described in the document, first, a trench is formed in the surface of a semiconductor substrate. A first insulating film is then formed over the surface of the semiconductor substrate so as to embed the trench with the film. The first insulating film is then anisotropically etched to form, in the first insulating film, an opening reaching the trench. By this etching, an upper end corner portion of the opening of the first insulating film has a gradient smaller than that of the upper end corner portion of the trench. Further, the anisotropic etching reduces the thickness of the first insulating film over the surface of the semiconductor substrate. A second insulating film is then formed over the surface of the semiconductor substrate to embed the opening with the film.

After formation of the DTI structure as described above, electron elements such as MOSFET (metal oxide semiconductor field effect transistor) are formed on the semiconductor substrate.

[Patent Document 1]
Japanese Patent Laid-Open No. 2002-118256

SUMMARY OF THE INVENTION

In the above method, the trench with a high aspect ratio should be embedded with the first and second insulating films. This requires twice deposition of insulating films and anisotropic etching for widening the upper end portion of the opening, leading to extension of a flow time. As a result, the above-described method needs much processing time and cost.

In addition, when the trench has an air gap therein, there is a fear of the air gap portion being exposed from the surface of the substrate by the wet processing conducted subsequently. When the air gap portion inside the trench is exposed from the surface of the substrate, a resist material and the like enter the air gap portion from the exposed portion and they inevitably remain without being removed. The resist material and the like in the air gap portion jet out and appear as contaminants in the step performed later, which may be a cause of pattern defects.

With the above problems in view, the present invention has been made. An object of the present invention is to provide a semiconductor device that can be manufactured using a simple process without ensuring a high embedding property; and manufacturing method of the device.

The manufacturing method of a semiconductor device according to one example of the invention is equipped with the following steps. First, a semiconductor substrate having a support substrate, a buried insulating film, and a semiconductor layer stacked in order of mention are prepared. An element having a conductive portion on the main surface of the semiconductor layer is completed. A trench that surrounds the element in a planar view in such a manner that it reaches the buried insulating film from the main surface of the semiconductor layer, is formed. A first insulating film over the element and in the trench to cover the element and to form an air gap in the trench is formed. In the first insulating film, a hole reaching the conductive portion of the element is formed.

In the present example, a trench is formed after completion of the element so that no resist penetrates in the trench during formation of the element. It is therefore possible to realize a semiconductor device not requiring to ensure a high burying property in a simple process, and a manufacturing method of the device.

In addition, the semiconductor substrate has a stack structure of a support substrate, a buried insulating film, and a semiconductor layer and a trench reaches the buried insulating film, extending from the main surface of the semiconductor layer. It is therefore possible to enhance the isolation capacity.

DESCRIPTION OF THE PREFERRED EMBODIMENTS

Embodiments of the present invention will hereinafter be described referring to drawings.

(Embodiment 1)

Figure 1:
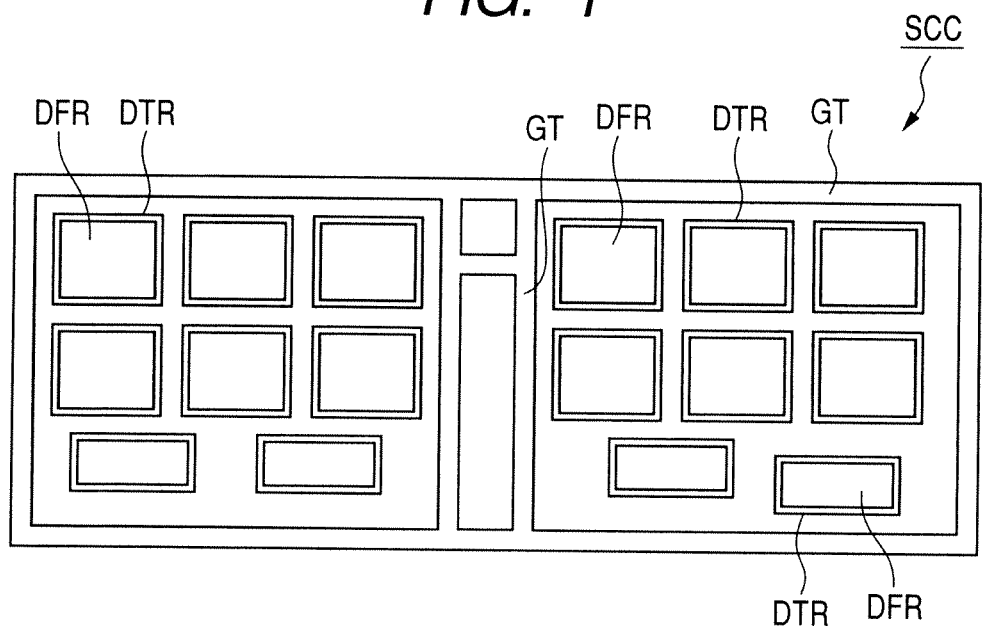
FIG. 1 is a schematic plan view illustrating the configuration of a semiconductor device in chip form according to Embodiment 1 of the present invention.

As illustrated in FIG. 1, the semiconductor device of the present embodiment can be applied to, for example, BiC-DMOS (bipolar complementary double-diffused metal oxide semiconductor). A semiconductor chip SCC of this BiC-DMOS has, for example, a logic portion in which low-breakdown-voltage CMOS (complementary MOS) transistors have been integrated and an output driver portion using a high breakdown voltage element. In the output driver portion, element formation regions DFR which are formation regions for individual elements are each surrounded by a trench DTR having a DTI structure in planar view. In addition, a plurality of the element formation regions DFR is surrounded by a gettering site in a planar view.

Figure 2:
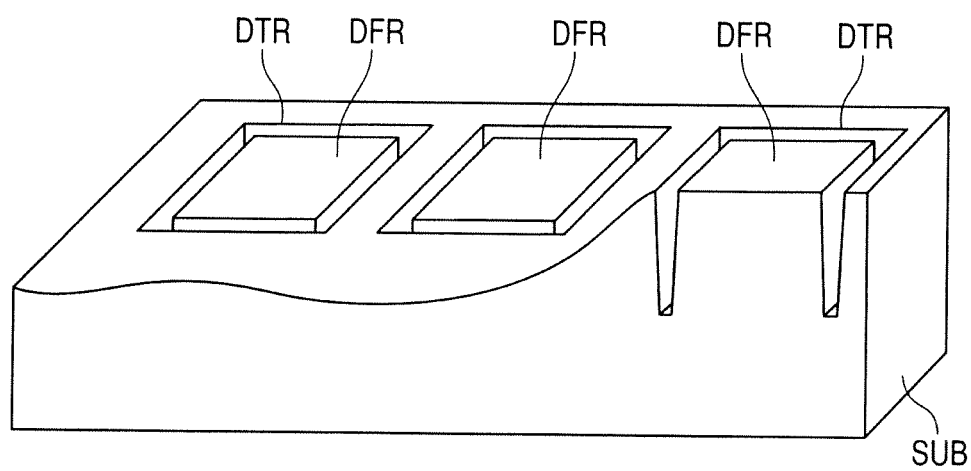
FIG. 2 is a partially cutaway perspective view illustrating the element isolation region of FIG. 1 surrounded with a trench in a planar view.

As illustrated in FIG. 2, for example, in the output driver portion, the element formation regions DFR for individual high-breakdown-voltage elements are surrounded two-dimensionally by the trench DTR having a DTI structure. This trench DTR is formed in the surface of a semiconductor substrate SUB.

Figure 3:
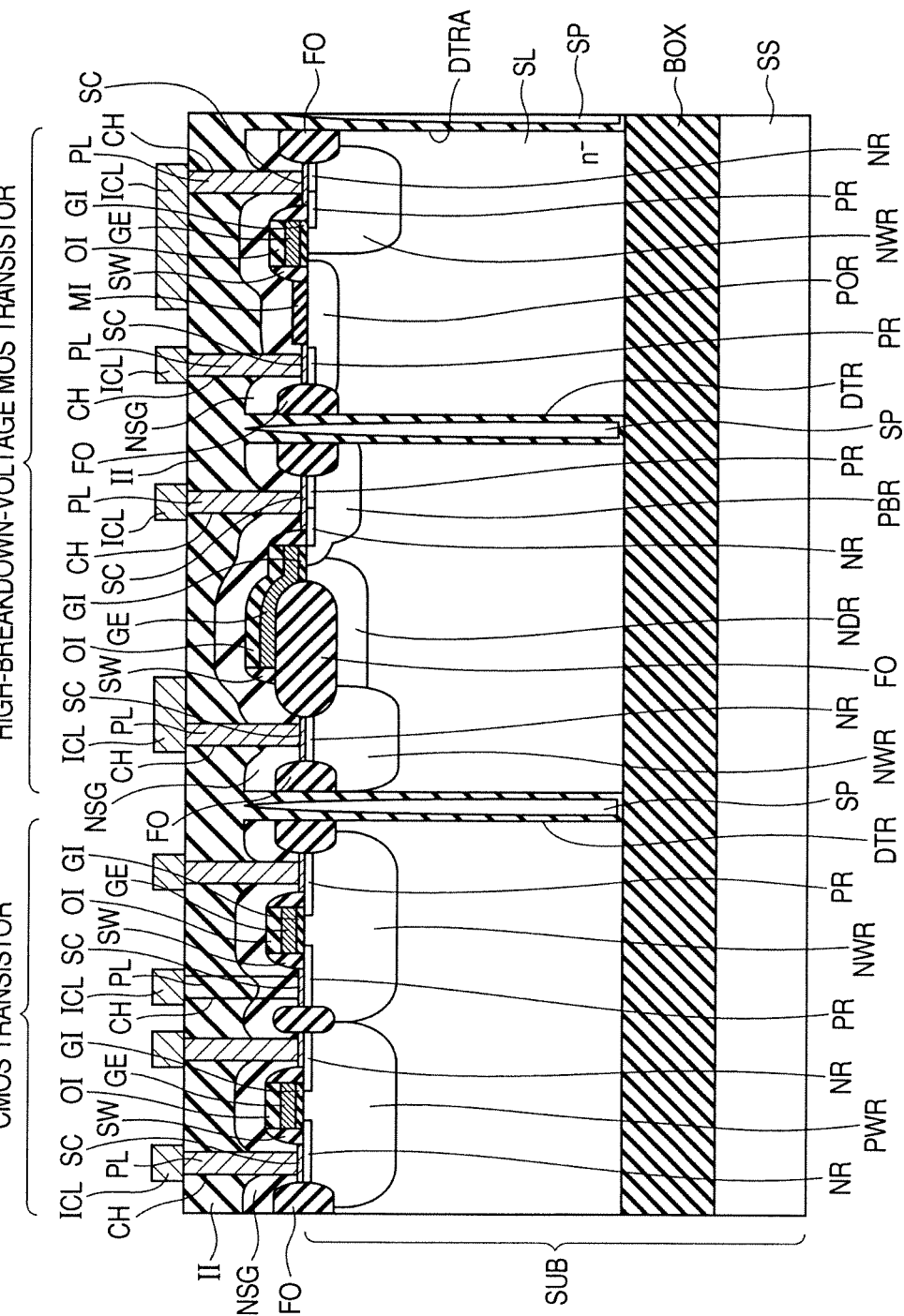
FIG. 3 is a schematic cross-sectional view illustrating the configuration of the semiconductor device according to Embodiment 1 of the present invention.

As illustrated in FIG. 3, the semiconductor substrate SUB is an SOI (silicon on insulator) substrate having a stacked configuration of a support substrate SS, a buried insulating film BOX, and a semiconductor layer SL in order of mention (from the lower side to the upper side in FIG. 3). The support substrate SS is made of, for example, a p type silicon substrate; the buried insulating film BOX is made of, for example, a silicon oxide film; and the semiconductor layer SL is made of, for example, an n$^-$ silicon layer. The semiconductor layer SL has, on the main surface (upper surface in FIG. 3) thereof, elements such as CMOS transistor and high-breakdown-voltage MOS transistor. These elements have conductive portions, for example, an n$^+$ region NR, a p$^+$ region PR, and a gate electrode layer GE.

A trench DTR having a DTI structure is formed so as to surround therewith the element formation region DFR for a CMOS transistor, a high-breakdown-voltage MOS transistor, or the like in a planar view and penetrate the semiconductor layer SL from the main surface of the semiconductor layer SL. This means that the trench DTR extends in a perpendicular direction of FIG. 3 so that it reaches the buried insulating film BOX from the main surface on the upper side of the semiconductor layer SL. The trench DTR surrounds therewith the individual element formation regions DFR to electrically isolate between the individual element formation regions DFR.

As illustrated in FIG. 3, the CMOS transistor has an nMOS transistor on the left side and a pMOS transistor on the right side in combination. The nMOS transistor has mainly a p well region PWR, an $n^+$ region NR as a source or drain region, a gate insulating film GI, and a gate electrode layer GE. The pMOS transistor has mainly an n well region NWR, a $p^+$ region PR as a source or drain region, a gate insulating film GI, and a gate electrode layer GE.

Due to the presence of the trench DTR at the center portion of the high-breakdown-voltage MOS transistor, there are two elements, one is on the left side and the other is on the right side of the trench DTR. The high-breakdown-voltage MOS transistor on the left side has mainly an n well region NWR, an n type region NDR, a p type region PBR, an $n^+$ region NR as a source or drain region, a $p^+$ type contact region PR, a gate insulating film GI, and a gate electrode layer GE. The high-breakdown-voltage MOS transistor on the right side has mainly a p type offset region POR, an n well region NWR, a $p^+$ region PR as a source or drain region, a gate insulating film GI, and a gate electrode layer GE.

In the present embodiment, the $n^+$ region NR or $p^+$ region PR preferably has, over the surface thereof, a silicide layer SC, but the silicide layer SC may be omitted.

The high-breakdown-voltage MOS transistor on the right side has, over the p type offset region POR thereof, a mask insulating layer MI. The semiconductor layer SL has, over the main surface thereof, a field oxide film FO having, for example, a thickness of 400 nm in order to electrically isolate between two elements adjacent to each other.

An underlying oxide film NSG (second insulating film) and an interlayer insulating film II (first insulating film) cover therewith the CMOS transistor and the high-breakdown-voltage MOS transistor. The underlying oxide film NSG is formed over the main surface of the semiconductor layer SL (meaning "over the main surface of the substrate SUB") to give a thickness of, for example, 300 nm. The underlying oxide film NSG is, for example, a silicon oxide film not doped with an impurity.

The interlayer insulating film II is formed over the underlying oxide film NSG and in the trench DTR in order to cover the underlying oxide film NSG and at the same time, to form an air gap SP inside the trench DTR. The interlayer insulating film II, similar to the underlying oxide film NSG, is formed to cover the semiconductor chip SCC.

This means that the insulating film II formed in the trench DTR is the interlayer insulating film II formed over the high-breakdown-voltage MOS transistor. The trench DTR is not completely embedded with the insulating film II and the trench DTR has therein an air gap (void) SP.

This air gap SP may have a height almost equal to the depth of the trench. The trench DTR has preferably an aspect ratio (depth/width) of 1 or greater. The width of the trench DTR is preferably 0.3 μm or greater based on the breakdown voltage of 80 V.

The interlayer insulating film II is composed of, for example, a stack structure of BP-TEOS (boro-phospho-tetra-ethyl-ortho-silicate) film and a silicon oxide film formed thereover by plasma CVD (chemical vapor deposition). The BP-TEOS film contained in the interlayer insulating film II may be any film insofar as it contains an impurity selected from Group III elements and Group V elements such as P-TEOS (PSG: phosphorus silicon glass) and B-TEOS (BSG: boro silicate glass).

The underlying oxide film NSG and the interlayer insulating film II have therein a contact hole CH and the contact hole CH has therein a plug conductive layer PL. The interlayer insulating film II has thereover an interconnect layer ICL. The interconnect layer ICL is electrically coupled to conductive portions (the $n^+$ region NR and the $p^+$ region PR as a source region or a drain region, and the gate electrode layer GE) of the element via the plug conductive layer PL in the contact hole CH. In other words, the contact hole CH is a hole formed in the underlying oxide film NSG and the interlayer insulating film II and it extends and reaches the conductive portion of the element. When the silicide layer SC is formed over the $n^+$ region NR and the $p^+$ region PR, the contact hole CH reaches the silicide layer SC. When the silicide layer is not formed, the contact hole CH reaches the $n^+$ region NR and the $p^+$ region PR.

A manufacturing method of, as the semiconductor device of the present embodiment, a semiconductor chip SCC having the CMOS transistor and the high-breakdown-voltage MOS transistor illustrated in FIG. 3 will next be described referring to FIGS. 4 to 12.

Figure 4:
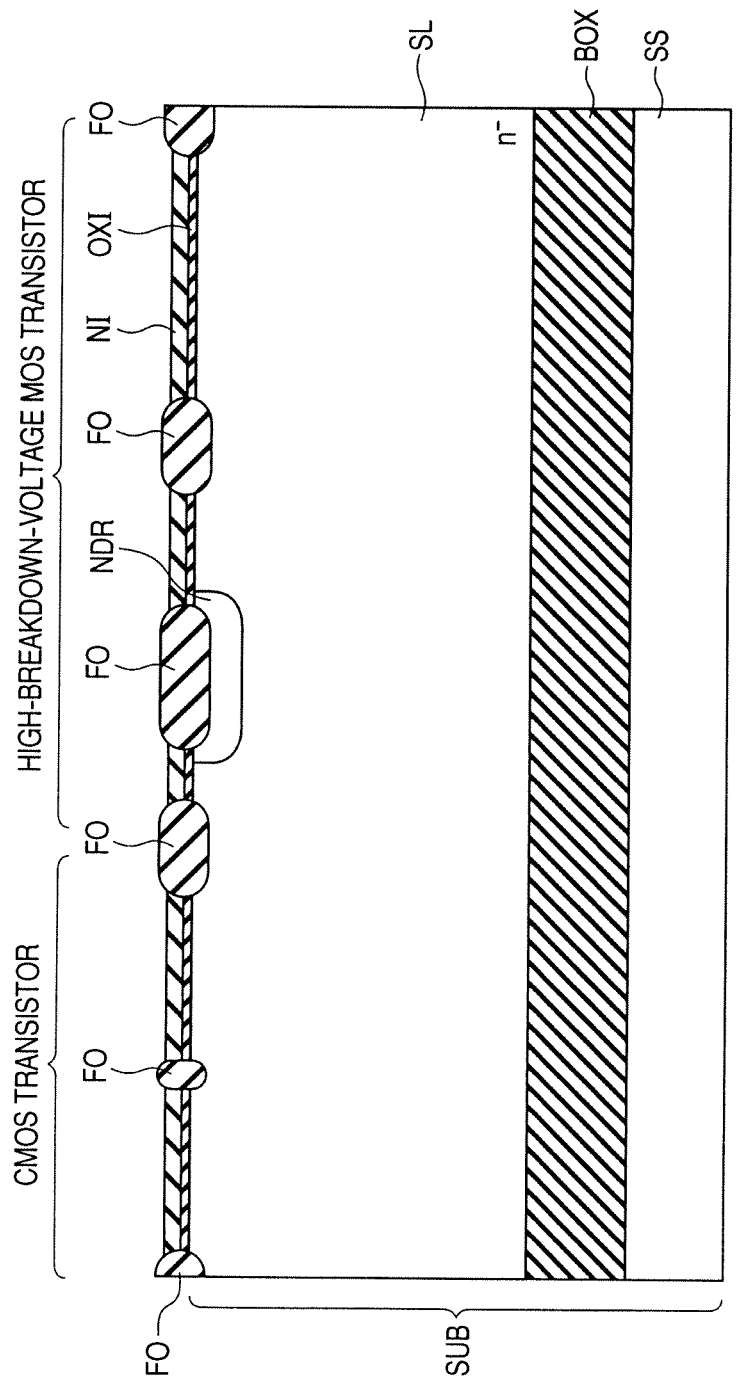
FIG. 4 is a schematic cross-sectional view illustrating a first step of a manufacturing method of the semiconductor device according to Embodiment 1 of the present invention.

As illustrated in FIG. 4, first, a semiconductor substrate SUB is prepared as an SOI substrate having a support substrate SS, a buried insulating film BOX, and a semiconductor layer SL stacked one after another in order of mention. The semiconductor layer SL has therein an n type region NDR, a field oxide film FO, and the like. This field oxide film FO is formed by stacking an oxide film OXI and a nitride film NI, in order of mention, over the main surface of the semiconductor layer SL, selectively removing the nitride film NI, and the thermally oxidizing a portion exposed from the nitride film NI. Then, the nitride film NI and the oxide film OXI are removed to expose the main surface of the semiconductor layer SL having no field oxide film FO thereover.

Figure 5:
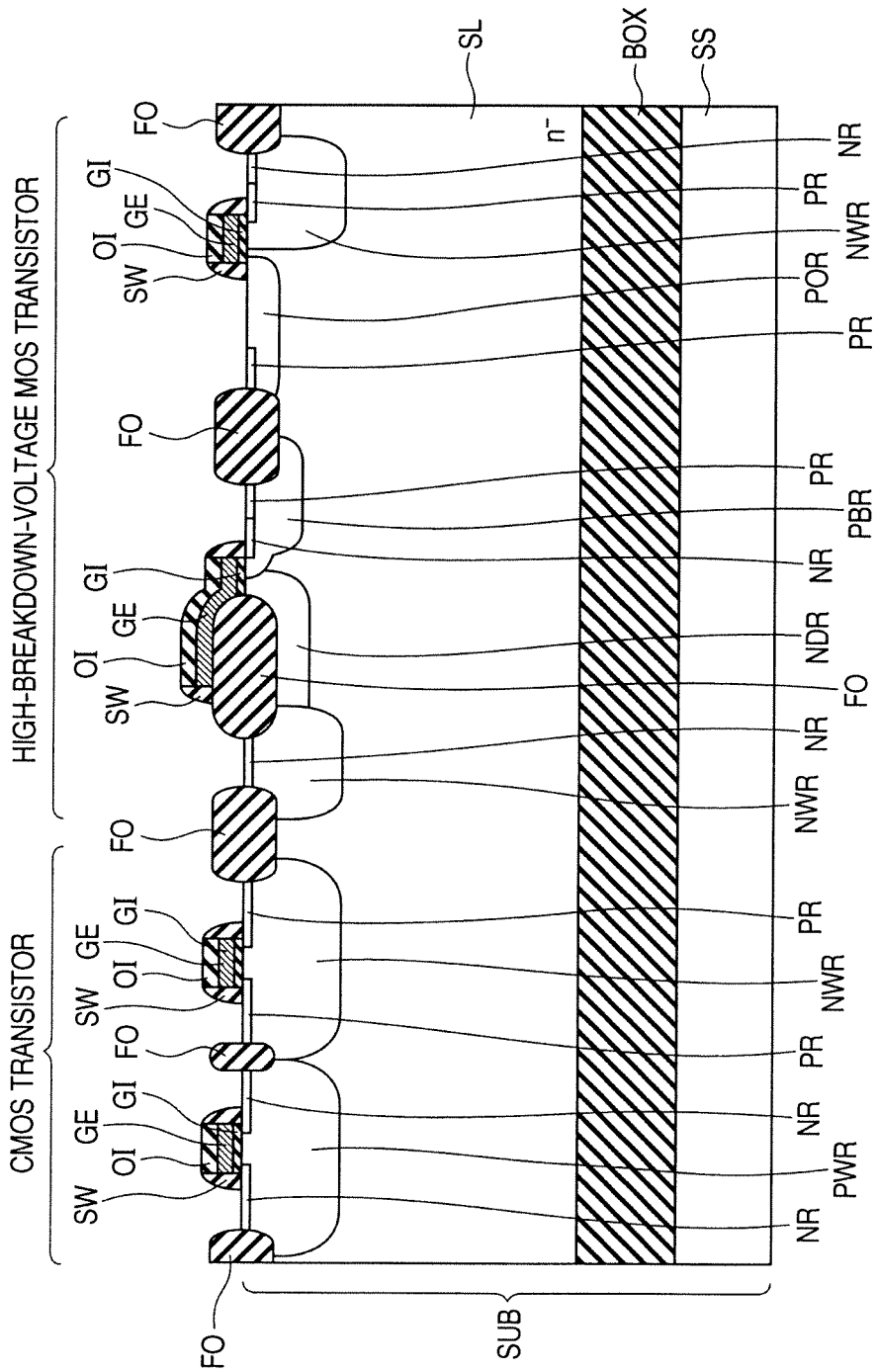
FIG. 5 is a schematic cross-sectional view illustrating a second step of the manufacturing method of the semiconductor device according to Embodiment 1 of the present invention.

As illustrated in FIG. 5, an n well region NWR, a p well region PWR, an n type region NDR, a p type region PDR, a p type offset region POR, a gate insulating film GI, a gate electrode layer GE, an oxide insulating film OI, an $n^+$ region NR, a $p^+$ region PR, a sidewall insulating film SW, and the like are formed.

As a result, formation of individual elements (such as high-breakdown-voltage MOS transistor and CMOS transistor) is completed over the main surface of the semiconductor layer SL (the surface of the semiconductor substrate SUB). Completion of the individual elements means that these elements are completed as described below.

The transistor on the left side in FIG. 5 which is a high-breakdown-voltage MOS transistor is formed to have an n well region NWR, an n type region NDR, a p type region PBR, an $n^+$ region NR as a source or drain region, a $p^+$ region PR as a contact region, a gate insulating film GI, and a gate electrode layer GE.

The transistor on the right side in FIG. 5 which is a high-breakdown-voltage MOS transistor is formed to have an n well region NWR, a p type offset region POR, a $p^+$ region PR as the source or drain region, an $n^+$ region NR as a contact region, a gate insulating film GI, and a gate electrode layer GE.

As the CMOS transistor, a pMOS transistor and an nMOS transistor are completed. The pMOS transistor is formed to have an n well region NWR, a pair of $p^+$ regions PR as source and drain regions, a gate insulating film GI, and a gate electrode layer GE. The nMOS transistor has a p well region PWR, a pair of n+ regions NR as source and drain regions, a gate insulating film GI, and a gate electrode layer GE.

Figure 6:
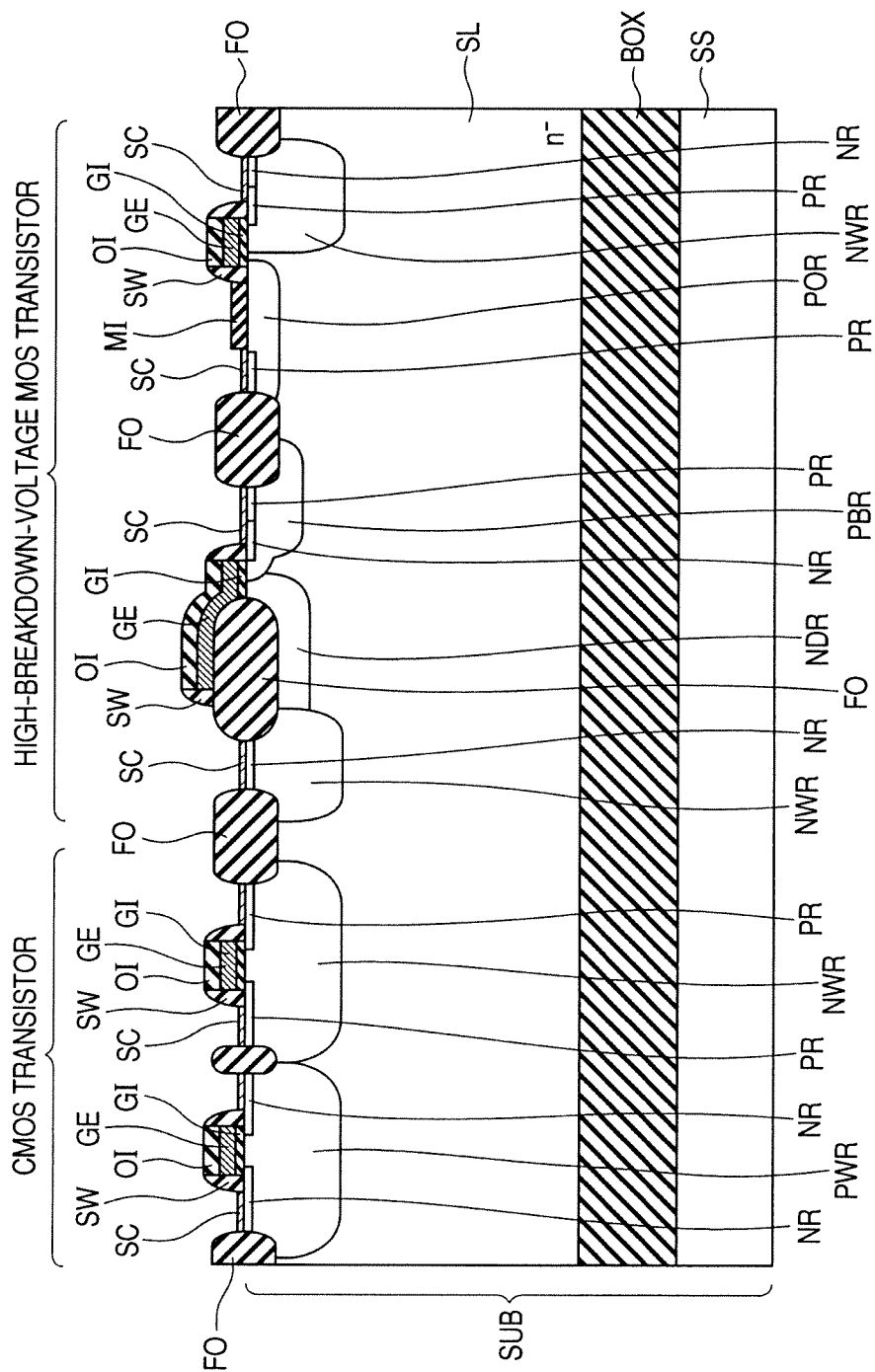
FIG. 6 is a schematic cross-sectional view illustrating a third step of the manufacturing method of the semiconductor device according to Embodiment 1 of the present invention.

Referring to FIG. 6, a silicide layer SC is formed over the surface of each of the n+ regions NR and the p+ regions PR. The silicide layer SC is formed by forming a refractory metal layer to cover the whole surface of the semiconductor layer SL and then heat treating the layer to cause a reaction between the refractory metal and silicon. At this time, formation of a mask insulating layer MI in advance over the main surface of the semiconductor layer SL prevents a contact between the main surface of the semiconductor layer SL and the refractory metal layer at the position where the mask insulating layer MI has been formed so that no silicide layer SC is formed there. After formation of the silicide layer SC, the refractory metal layer which has remained unreacted is removed.

Figure 7:
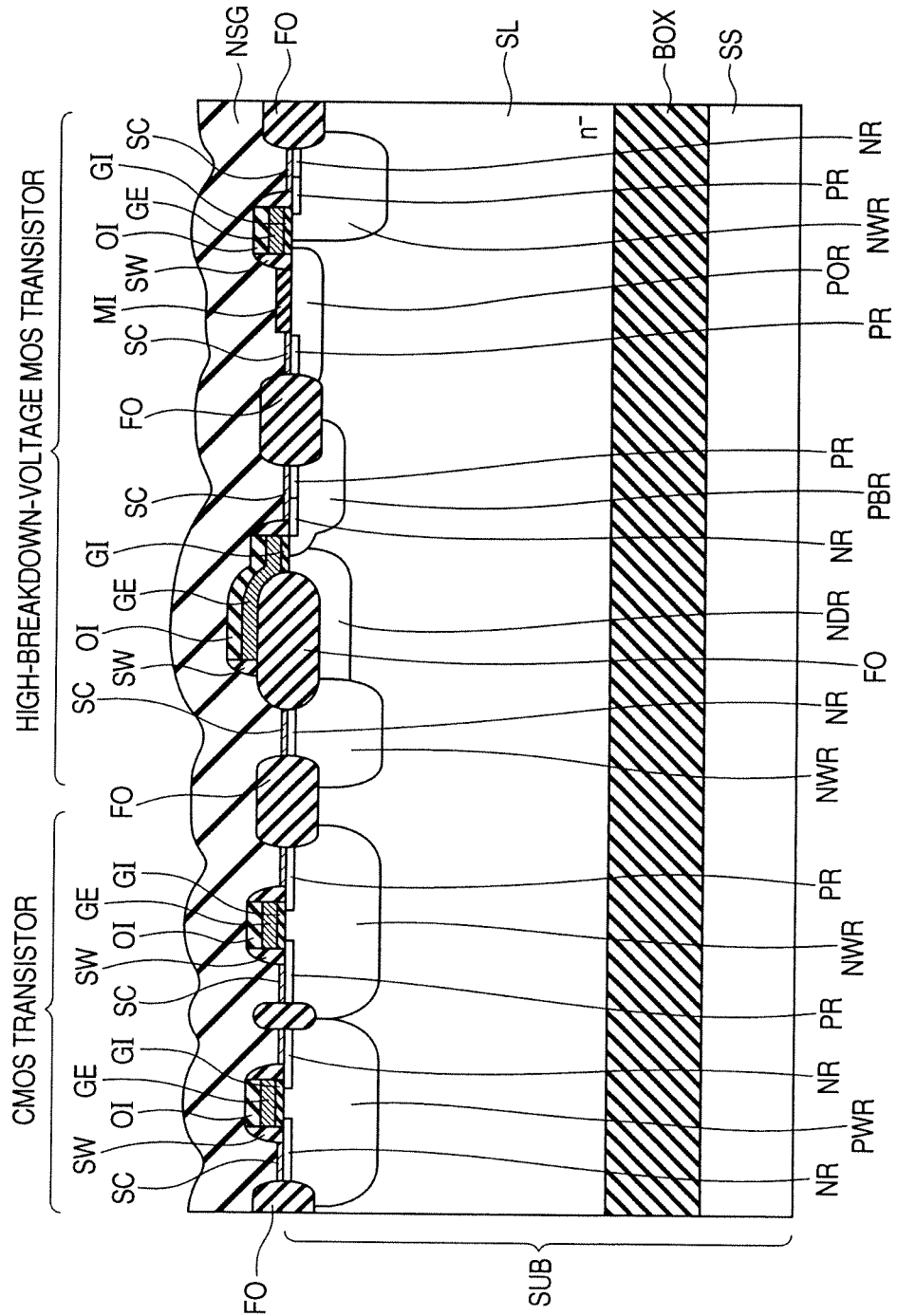
FIG. 7 is a schematic cross-sectional view illustrating a fourth step of the manufacturing method of the semiconductor device according to Embodiment 1 of the present invention.

As illustrated in FIG. 7, an underlying oxide film NSG is formed to cover each of the elements. The underlying oxide film NSG is made of, for example, a non-doped silicon oxide film having a thickness of 600 nm.

Figure 8:
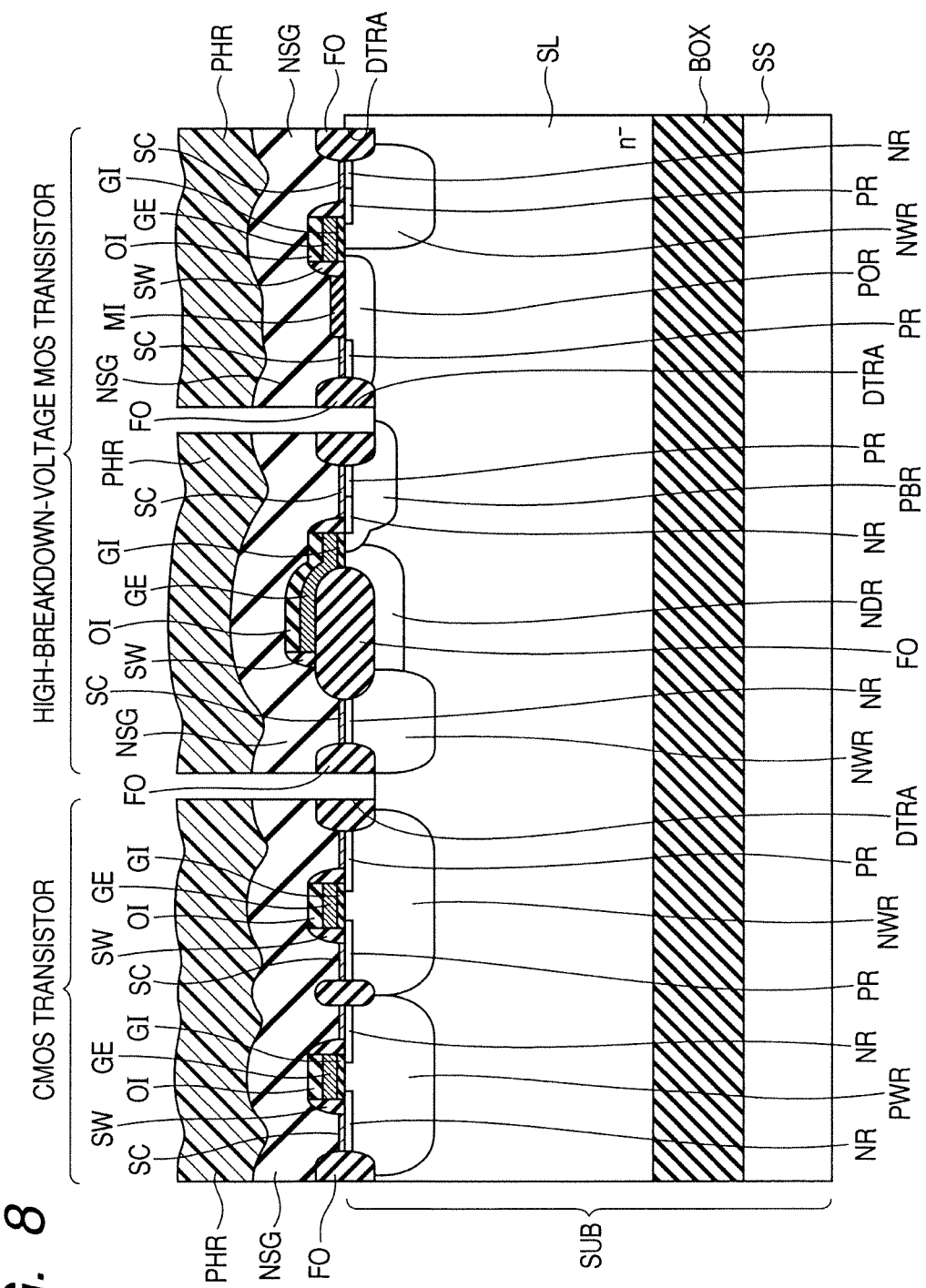
FIG. 8 is a schematic cross-sectional view illustrating a fifth step of the manufacturing method of the semiconductor device according to Embodiment 1 of the present invention.

As illustrated in FIG. 8, a photoresist PHR is applied to the underlying oxide film NSG to cover it.

This photoresist PHR is patterned by common used photolithography. With the resulting patterned photoresist PHR as a mask, the underlying oxide film NSG and the field oxide film FO are anisotropically etched in order of mention. As a result, a trench DTR A penetrating through the underlying oxide film NSG and the field oxide film FO is formed. Then, the photoresist PHR is removed by ashing or the like method.

Figure 9:
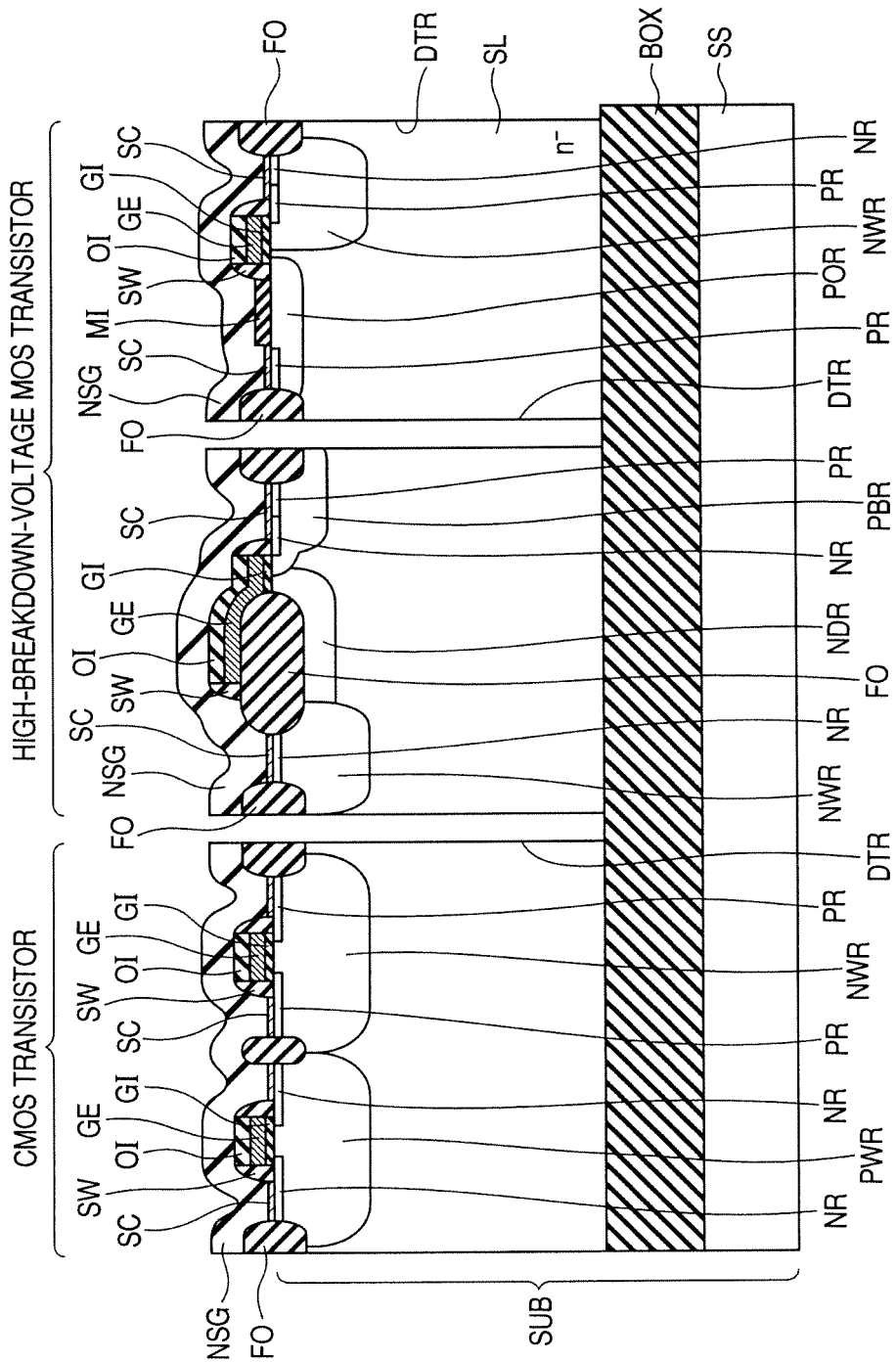
FIG. 9 is a schematic cross-sectional view illustrating a sixth step of the manufacturing method of the semiconductor device according to Embodiment 1 of the present invention.

As illustrated in FIG. 9, with the underlying oxide film NSG as a mask, the semiconductor layer SL is anisotropically etched to selectively remove a portion of the semiconductor substrate SUB (semiconductor layer SL) immediately below the trench DTRA. As a result, a trench DTR extending from the main surface of the semiconductor substrate SUB (semiconductor layer SL) and reaching the buried insulating film BOX is formed.

By this etching, a predetermined thickness of the underlying oxide film NSG is removed by etching, whereby the thickness of the film reduces to about half of the original thickness of 600 nm, that is, for example, 300 nm.

In order to prevent solid-phase dispersion of an impurity such as Group III element or Group V element in the semiconductor layer SL in view of the properties of the element to be formed, it is preferred to form a protective insulating film (liner film) on the sidewall in order to prevent solid-phase diffusion thereinto. The liner film is, for example, preferably a silicon oxide film or a silicon nitride film formed, for example, by thermal oxidation, nitriding, or plasma CVD.

Figure 10:
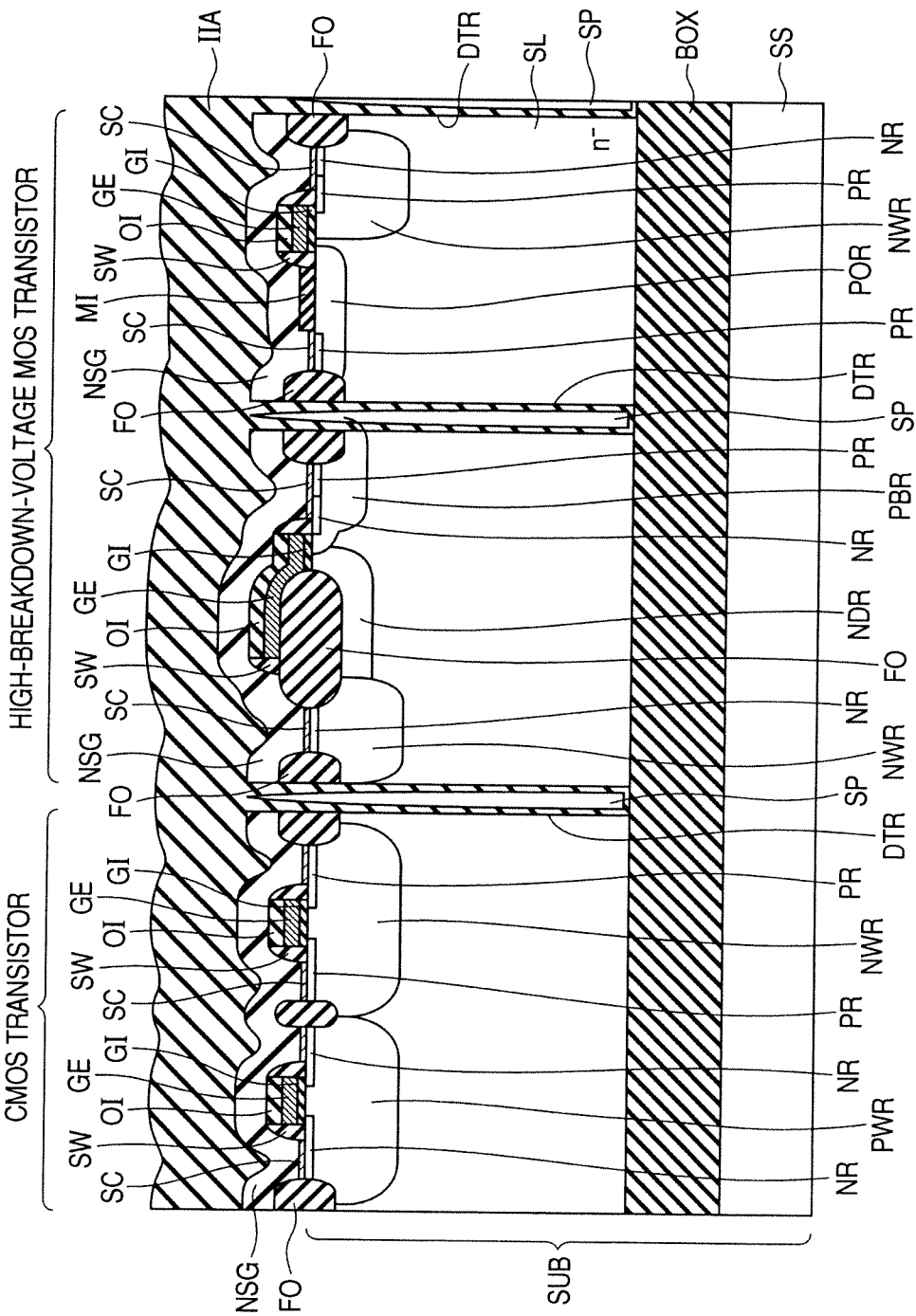
FIG. 10 is a schematic cross-sectional view illustrating a seventh step of the manufacturing method of the semiconductor device according to Embodiment 1 of the present invention.

As illustrated in FIG. 10, an insulating film IIA (first insulating film) is formed over each of the elements and in the trench DTR in order to cover each of the elements and at the same time, to form an air gap SP in the trench DTR. This insulating film IIA is made of, for example, BP-TEOS having a thickness of 1320 nm. The upper surface of this insulating film IIA is polished and removed by CMP (chemical mechanical polishing).

Figure 11:
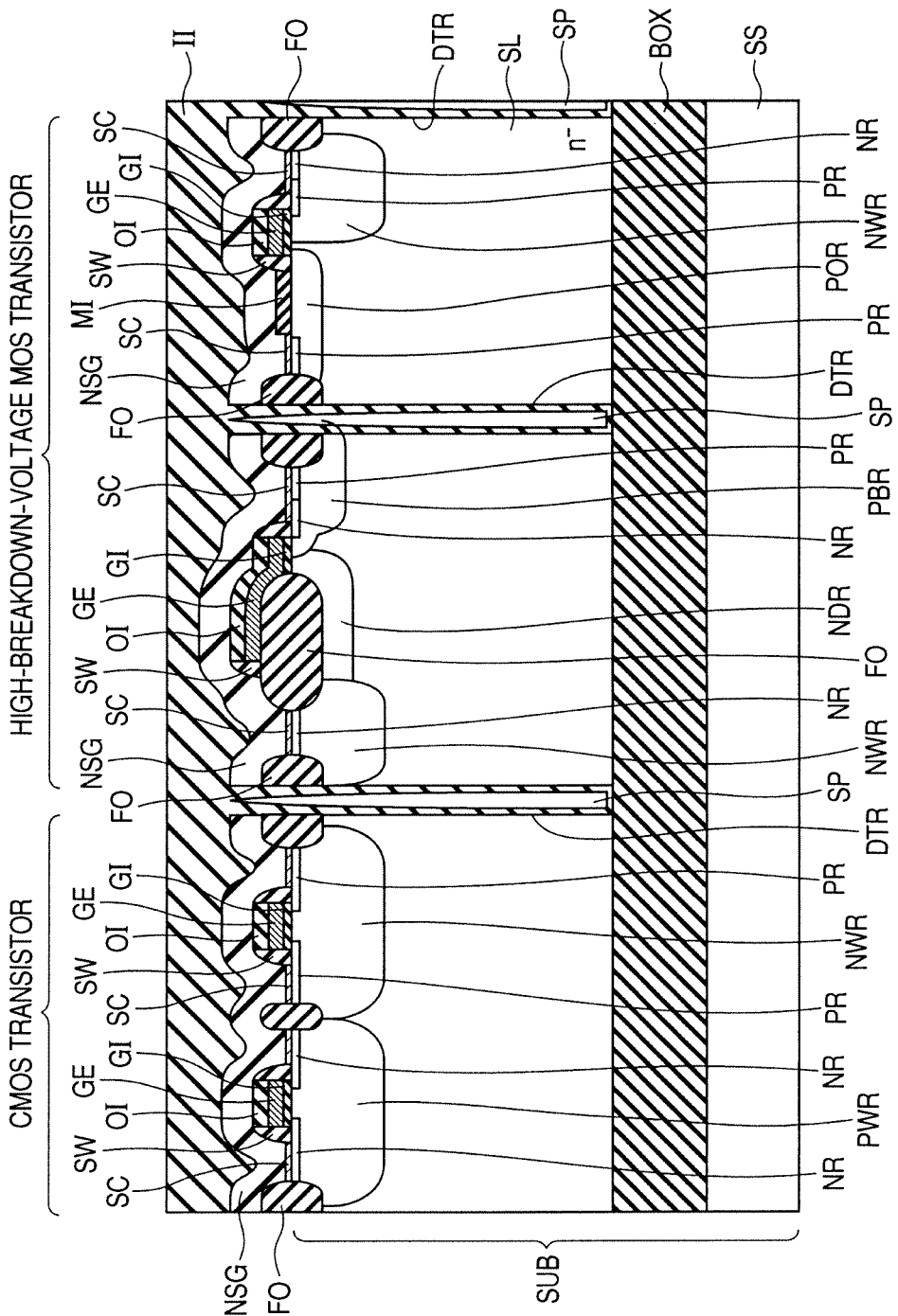
FIG. 11 is a schematic cross-sectional view illustrating an eighth step of the manufacturing method of the semiconductor device according to Embodiment 1 of the present invention.

As illustrated in FIG. 11, the upper surface of the insulating film II is planarized into an interlayer insulating film II by the above-described CMP. By polishing, for example, by 640 nm by using CMP, the thickness of the interlayer insulating film II is reduced to, for example, 680 nm.

Figure 12:
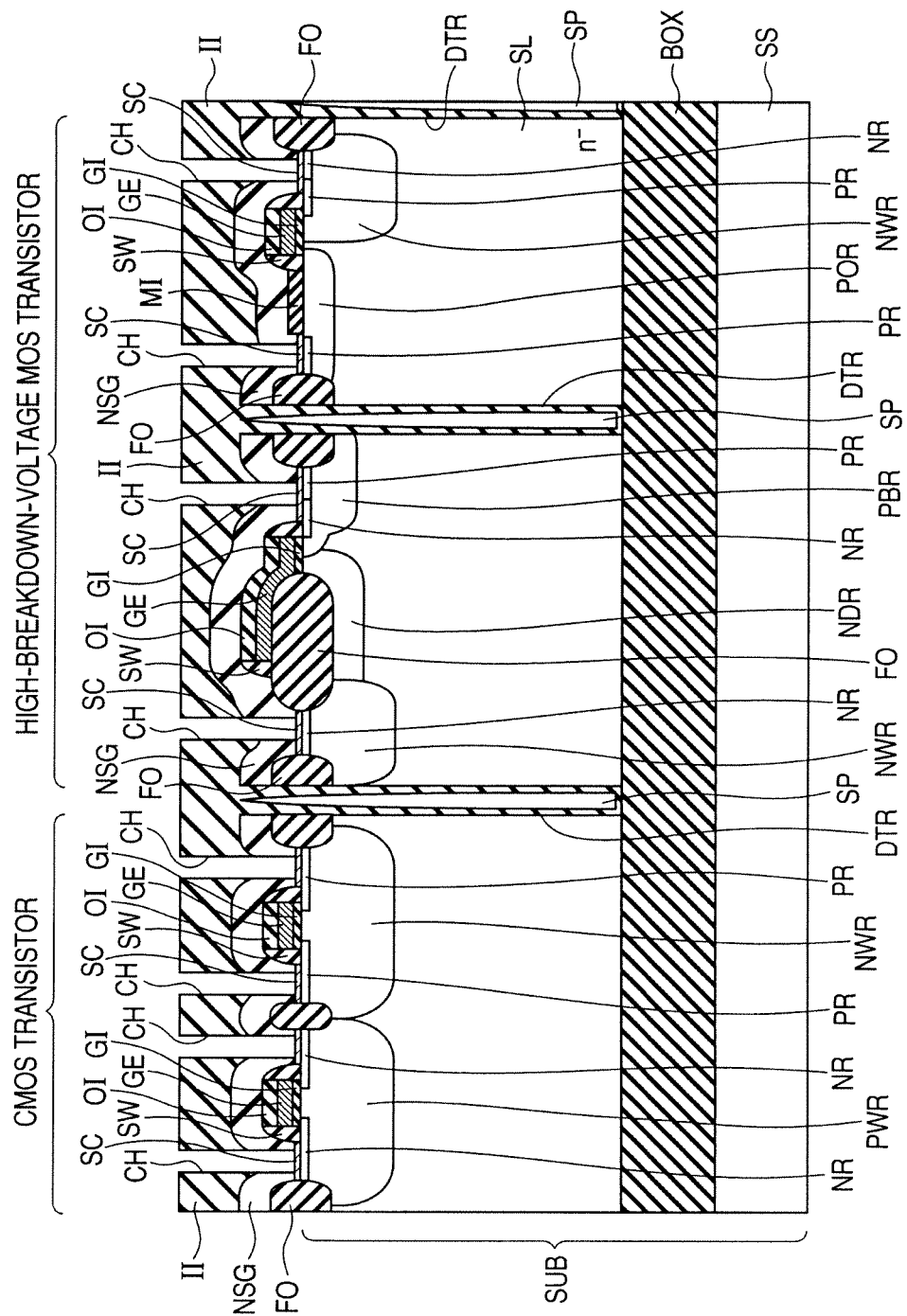
FIG. 12 is a schematic cross-sectional view illustrating a ninth step of the manufacturing method of the semiconductor device according to Embodiment 1 of the present invention.

As illustrated in FIG. 12, a contact hole CH (hole) penetrating through the interlayer insulating film II and the underlying oxide film NSG and reaching the surface (surface of the silicide layer S) of the semiconductor substrate SUB is formed by commonly used photolithography and etching.

The surface of the silicide layer S formed, for example, over the surface of the source region or drain region is exposed from this contact hole CH.

As illustrated in FIG. 3, a plug conductive layer PL is formed in the contact hole CH. Then, an interconnect layer ICL is formed over the interlayer insulating film II so as to electrically couple the conductive portions of each of the elements via the plug conductive layer PL.

The plug conductive layer PL and the interconnect layer ICL are preferably a thin metal film made of, for example, aluminum and it may be a thin film stack of titanium and tungsten. Or, it may have a configuration obtained by stacking a thin aluminum film over a titanium nitride (TIN) thin film formed as a barrier metal.

As described above, the semiconductor device of the present embodiment as illustrated in FIG. 3 is manufactured. Next, investigation results of a difference in the properties between a DTI structure having an air gap in the trench DTR and that having no air gap in the trench DTR will next be described.

An evaluation wafer was prepared in order to study the properties of the semiconductor device of the present embodiment. The breakdown voltage of a sample of a semiconductor chip placed over the surface of the wafer was evaluated.

Figure 13:
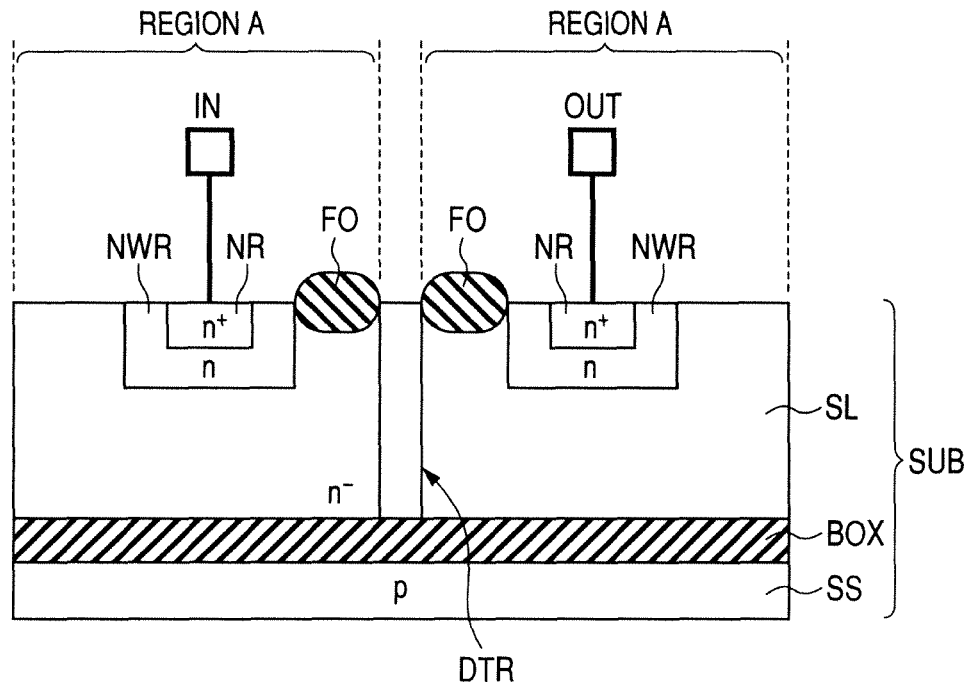
FIG. 13 is a schematic cross-sectional view illustrating the configuration of a TEG for analyzing and evaluating the properties of a semiconductor device.

Each semiconductor chip has therein an evaluation TEG as illustrated FIG. 13. As illustrated in FIG. 13, this evaluation TEG has, in a planar view, a region A and a region G isolated from the region A by the DTI structure. The regions A and B have each an n well region NWR formed over the main surface of the semiconductor layer SL and an n+ region NR formed in the surface in the n well region NWR.

With an increase of the width of the trench DTR from 0.6 μm to 1.0 μm, the voltage at which a leakage current shows a drastic rise increases from about 400V to about 600V. It has been found that when the width of the trench DTR increases, the leakage current is suppressed and the breakdown voltage of the trench DTR increases. A graph showing the relationship between the width of the trench DTR (DTI width) and the breakdown voltage of each TEG is shown in FIG. 14.

Figure 14:
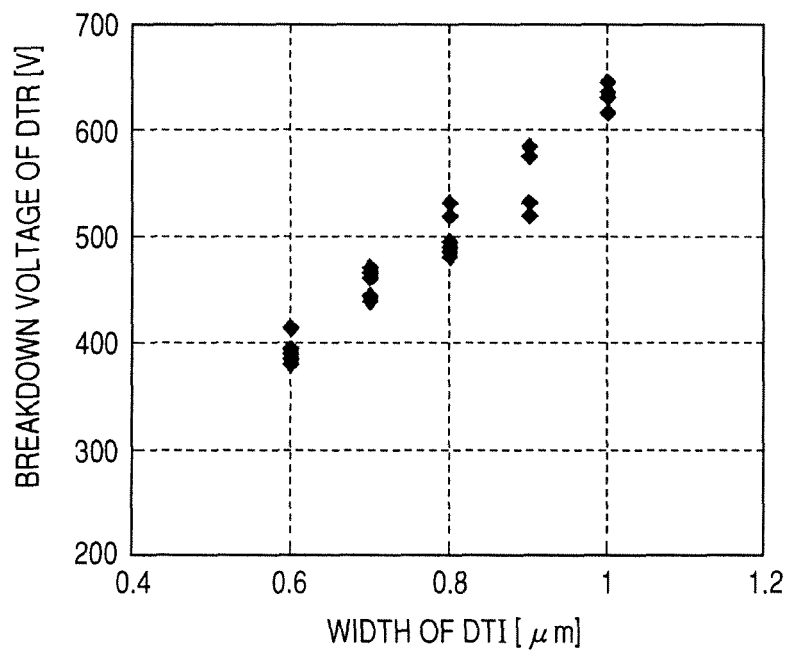
FIG. 14 is a graph showing the relationship between the width of a trench having a DTI structure and a breakdown voltage of the trench.

As illustrated in FIG. 14, with an increase in the width of the trench DTR from 0.6 μm to 1.0 μm, the breakdown voltage of the trench DTR increases from about 400V to about 600V. From the graph, it has been found that an increase in the width of the trench DTR by 0.1 μm raises the breakdown voltage of the trench DTR by 60V on average. FIG. 14 has revealed that the greater the width of the trench DTR, the higher the breakdown voltage of the trench DTR.

Investigation results on the stress on the surface of the semiconductor layer SL in the vicinity of the trench DTR will next be described.

The stress was measured by forming a resistor composed of an impurity region on the surface of the semiconductor layer SL in the vicinity of the trench DTR and measuring the resistance of it. Described specifically, the stress was measured by utilizing the fact that a sheet resistor SHR placed, in a planar view, parallel to the trench DTR as illustrated in FIGS. 15 and 16 and a sheet resistor SHR placed, in a planar view, orthogonal to the trench DTR as illustrated in FIGS. 17 and 18 show different characteristics due to the influence of the stress.

Figure 15:
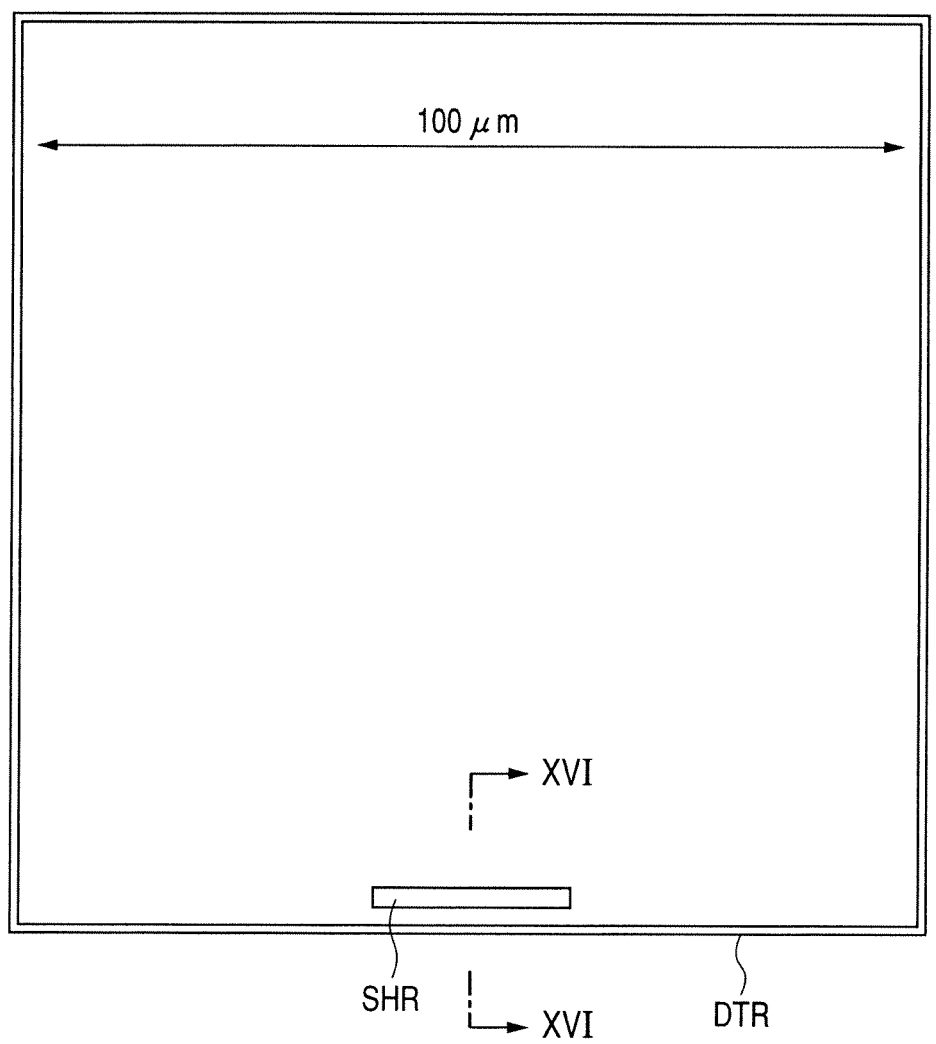
FIG. 15 is a schematic plan view illustrating the configuration of a TEG having sheet resistance extending in a direction parallel to the extending direction of the trench.
Figure 16:
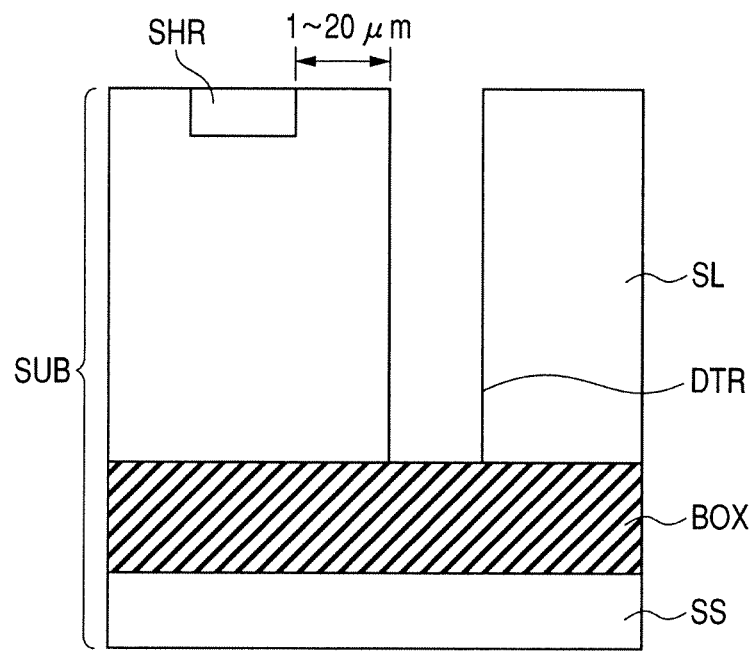
FIG. 16 is a schematic cross-sectional view taken along a line XVI-XVI of FIG. 15.
Figure 17:
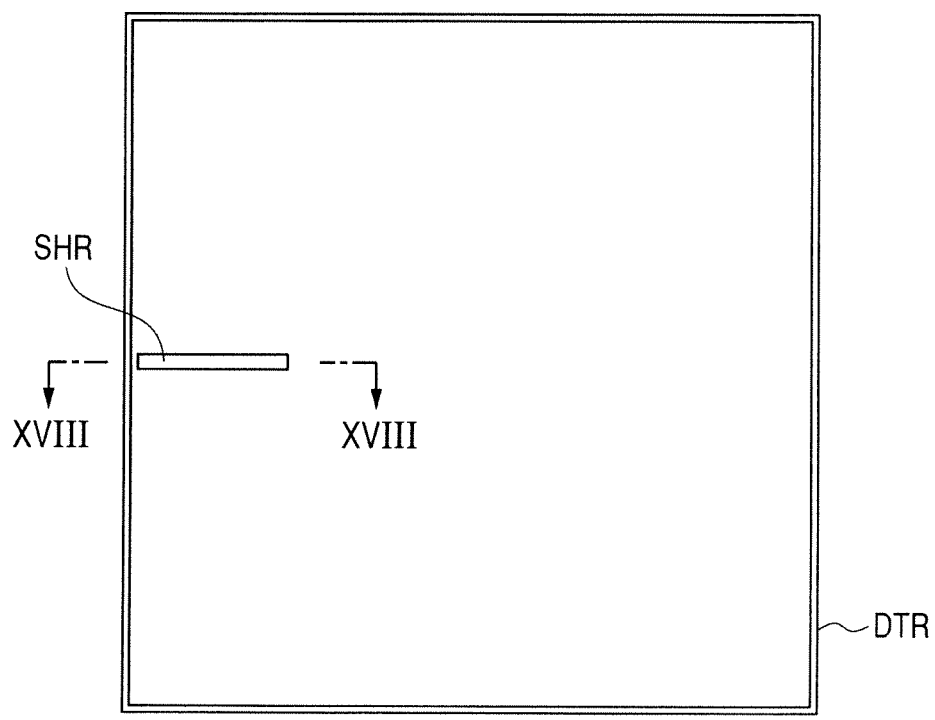
FIG. 17 is a schematic plan view illustrating the configuration of a TEG having sheet resistance extending in a direction perpendicular to the extending direction of the trench.
Figure 18:
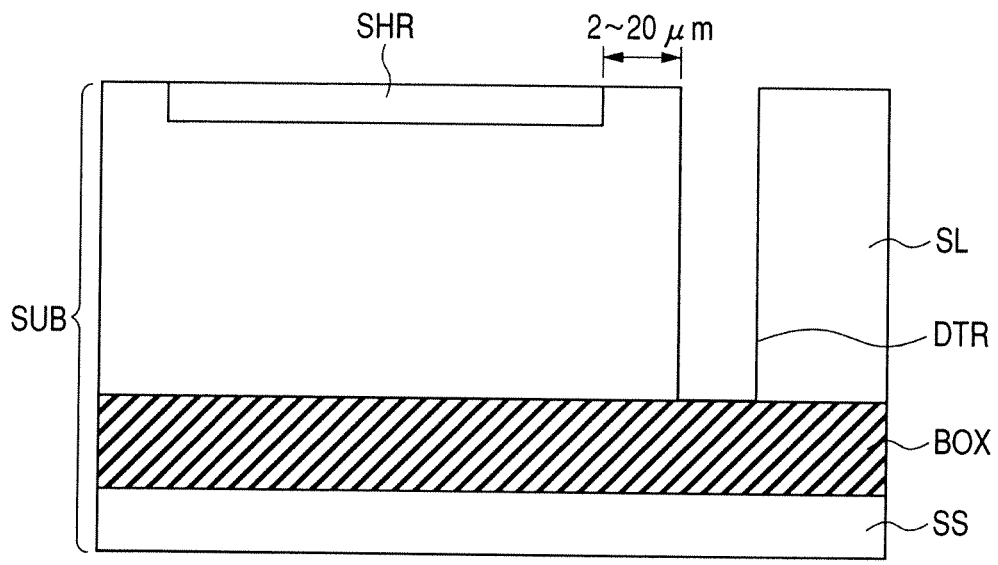
FIG. 18 is a schematic cross-sectional view taken along a line XVIII-XVIII of FIG. 17.

In each of the parallel arrangement TEG of FIG. 15 and the orthogonal arrangement TEG of FIG. 17, the trench DTR has a depth of about 5 μm and a width of about 0.8 μm. The semiconductor layer SL surrounded with the trench DTR has a planar shape of about 100 μm×about 100 μm. In addition, in each of the parallel arrangement TEG of FIG. 15 and the orthogonal arrangement TEG of FIG. 17, the sheet resistor SHR has a planar shape of about 20 µm×about 2 µm and the sheet resistor SHR has a depth (diffusion depth) of about 0.6 µm.

In each of the parallel arrangement TEG of FIG. 15 and the orthogonal arrangement TEG of FIG. 17, an electric current is caused to flow in a longitudinal direction of the planar shape of the sheet resistor SHR. This means that, in the parallel arrangement TEG of FIG. 15, a stress is applied in a direction perpendicular to the electric current direction of the sheet resistor SHR and in the orthogonal arrangement TEG of FIG. 17, a stress is applied in a direction parallel to the electric current direction of the sheet resistor SHR.

The resistance of the sheet resistor SHR was determined by measuring the electric current flowing to the sheet resistor SHR when a voltage was applied to the sheet resistor SHR. In addition, this measurement was performed by changing the distance between the sheet resistor SHR and the trench DTR within a range of from 1 to 20 µm in the parallel arrangement TEG illustrated in FIG. 15 or 16 and by changing the distance between the sheet resistor SHR and the trench DTR within a range of from 2 to 20 µm in the orthogonal arrangement TEG illustrated in FIG. 17 or FIG. 18.

When the trench DTR had no air gap SP therein, a change in the resistance became marked with a decrease in the distance between the sheet resistor SHR and the trench DTR. In particular, when the sheet resistor SHR is placed "in parallel to DTR" as illustrated in FIG. 15 or 16, a change in the resistance of the sheet resistor SHR approaches 15% when the distance from the trench DTR is 1 µm.

When the trench DTR had an air gap SP therein, on the other hand, almost no change in the resistance of the sheet resistor SHR was observed even if the distance between the sheet resistor SHR and the trench DTR changed. This means that a stress inside the trench DTR decreases when the trench DTR has an air gap SP formed therein. It has therefore been found that generation of a stress on the surface of the semiconductor layer SL can be suppressed by forming an insulating film in the trench DTR so as to cause an air gap SP to appear in the trench DTR.

The effect and advantage of the present embodiment will next be described. According to the present embodiment, as illustrated in FIGS. 4 to 9, the trench DTR of the DTI structure is formed after completion of elements such as high-breakdown-voltage MOS transistor so that an interlayer insulating film II can be embedded in the trench DTR. This makes it possible to greatly reduce the number of steps of the manufacturing method because it eliminates the necessity of separately forming an insulating film to be embedded in the trench DTR and an interlayer insulating film.

After completion of the elements such as high-breakdown-voltage MOS transistor, the trench DTR of the DTI structure is formed. The exposure frequency of the surface of the insulating film embedded in the trench DTR is smaller in the production flow after completion of the elements than that in the production flow before completion of the elements. Even if the trench DTR has an air gap SP therein, exposure of the air gap SP from the surface is suppressed. Accordingly, contaminants from the resist or the like do not enter the air gap SP exposed from the surface, making it possible to prevent generation of pattern defects due to ejection of the contaminants from the air gap SP during production.

In addition, as illustrated in FIG. 14, positive formation of the air gap SP in the trench DTR makes it possible to suppress a leakage current of the elements isolated with the DTI structure, thereby enhancing the breakdown voltage.

A stress of the semiconductor layer SL in the vicinity of the trench DTR can be reduced by positively forming the air gap SP in the trench DTR, because the air gap SP which is a void can relax the stress generated due to a difference in thermal expansion coefficient between the silicon oxide film in the trench DTR and silicon. The reduction in the stress of the semiconductor layer SL in the vicinity of the trench DTR leads to suppression of generation of crystal defects in the semiconductor layer SL.

Further, the trench DTR of the DTI structure is formed after completion of the elements such as high-breakdown-voltage MOS transistor so that contaminants (such as metal impurities) CNT formed inside the semiconductor layer SL and the like in the element formation region DFR (refer to FIG. 1) during formation of the elements can be collected in a gettering site GT (refer to FIG. 1). This will next be described referring to FIGS. 19 to 21.

Figure 19:
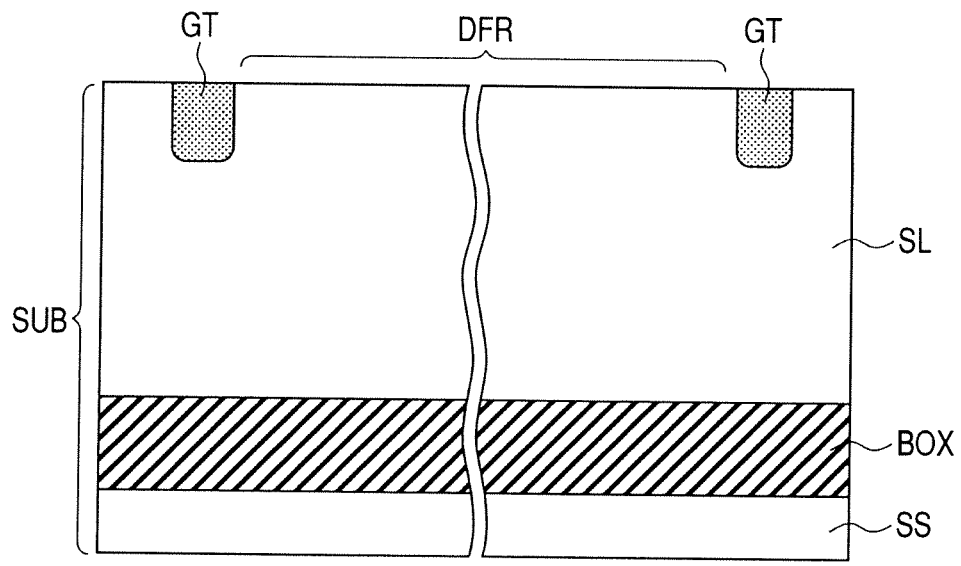
FIG. 19 is a schematic cross-sectional view illustrating the configuration of the semiconductor substrate in Embodiment 1 of the present invention in which a gettering site surrounding an element formation region has been formed.

As illustrated in FIG. 19, the gettering site GT is formed so as to encompass therewith the element formation region DFR of the semiconductor substrate SUB in which the element is to be formed finally. Then, as illustrated in FIG. 20, a field oxide film FO is formed, followed by the formation of a trench DTR so that it penetrates the field oxide film FO and the semiconductor layer SL as illustrated in FIG. 21.

Figure 20:
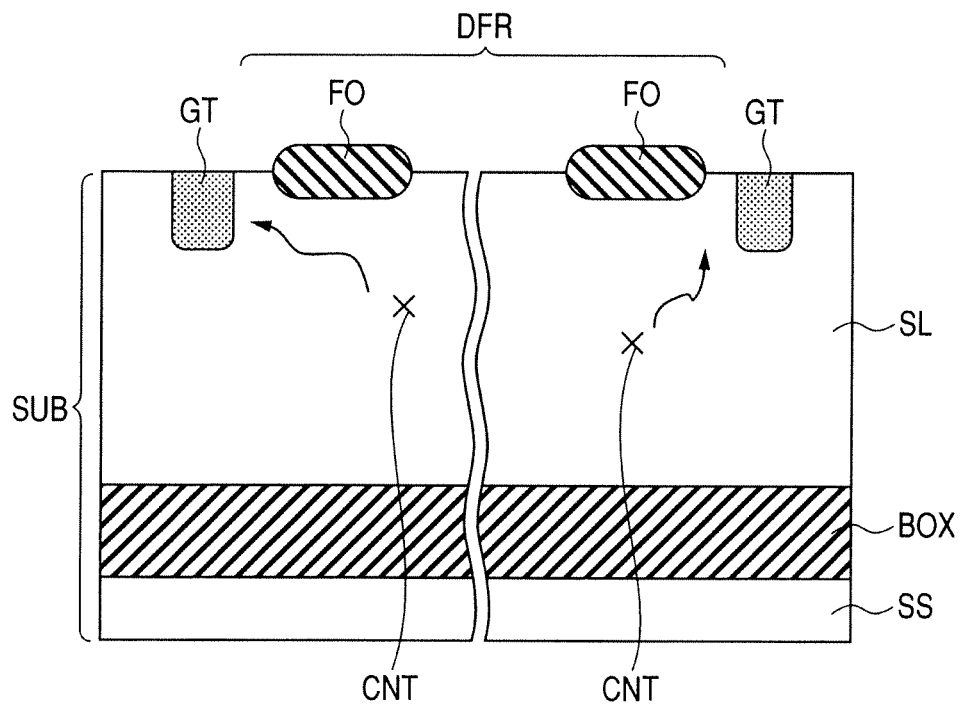
FIG. 20 is a schematic cross-sectional view illustrating the configuration of the semiconductor substrate of FIG. 19 in which a field oxide film has been formed.
Figure 21:
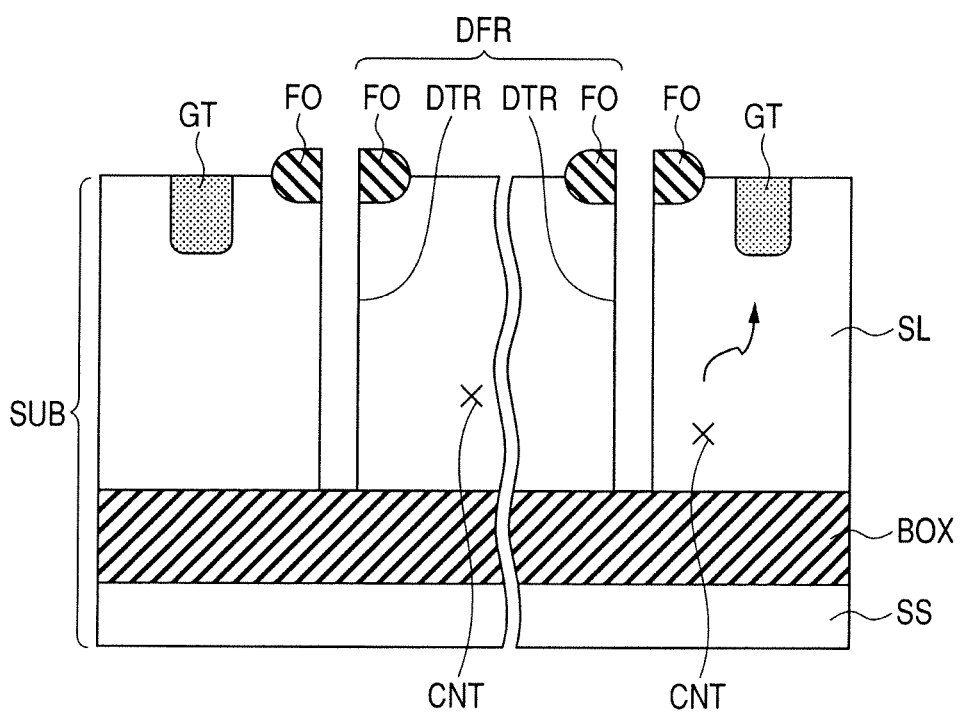
FIG. 21 is a schematic cross-sectional view illustrating the configuration of the semiconductor substrate of FIG. 20 in which a trench has been formed.

For example, as illustrated in FIG. 20, when contaminants CNT enter the semiconductor layer SL prior to the formation of the trench DTR, the contaminants CNT transfer inside the semiconductor layer SL and are absorbed in the gettering site GT by the heat treatment applied to the semiconductor substrate SUB during processing. When the contaminants CNT enter the semiconductor layer SL in the element formation region DFR surrounded with the trench DTR after the formation of the trench DTR as illustrated in FIG. 21, however, the contaminants CNT cannot transfer to the gettering site GT even by the heat treatment in the subsequent step. This means that the contaminants CNT remain in a region (element formation region DFR) surrounded with the trench DTR. Since retention of the contaminants CNT in the semiconductor layer SL may deteriorate the properties of the element formed on the surface of the semiconductor substrate SUB, high efficiency gettering is preferred.

The manufacturing method according to this embodiment in which the trench DTR is formed after formation of the element in the element formation region DFR, time spent for gettering of the contaminants CNT can be extended. This enables more complete gettering of the contaminants CNT from the semiconductor layer SL.

Further, in the present embodiment, the semiconductor substrate SUB has a buried insulating film BOX (silicon oxide film) laid over the support substrate SS. By forming a diffusion region along the wall surface of the trench DTR, it is possible to prevent a leakage current passing through a damage layer formed on the side surface of the trench DTR, which will next be described referring to FIGS. 22(A) and (B) and FIGS. 23(A) and (B).

First, prevention of a leakage current in the case where the semiconductor substrate is not an SOI substrate but a bulk silicon substrate will be described referring to FIGS. 22(A) and (B).

Figure 22A:
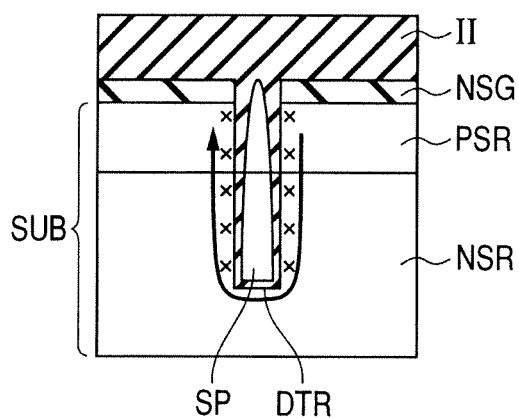
FIGS. 22(A) and 22(B) are schematic cross-sectional views illustrating a buried-insulating-film free bulk semiconductor substrate in which a trench has been formed and an etching damage has been formed along the side surface of the trench.

As illustrated in FIG. 22(A), when a trench DTR is formed in the semiconductor substrate SUB, damages (crystal defects) due to etching appear on the wall portion of the trench DTR. If there is a pn junction between an n type semiconductor region NSR and a p type semiconductor region PSR on the wall portion of the trench DTR, a leakage current is generated at the pn junction portion via these etching damages.

Figure 22B:
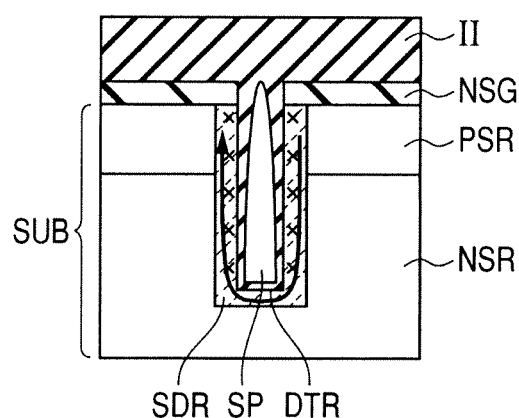

Formation of an n type or p type diffusion region SDR as illustrated in FIG. 22(B) on the wall portion of the trench DTR where etching damages appear can be thought as one measure for preventing generation of this leakage current. This means that when the diffusion region SDR is formed, no pn junction is formed at a portion contiguous to the trench DTR, leading to prevention of generation of a leakage current at the pn junction.

When the diffusion region SDR is formed in the bulk silicon substrate used as the semiconductor substrate SUB, there is a fear of the diffusion region SDR electrically coupling p type semiconductor regions PSR to each other and electrical isolation with the trench DTR therefore loses its meaning. When the bulk silicon substrate is used as the semiconductor substrate SUB, therefore, heat treatment for crystallinity recovery becomes necessary in order to eliminate crystal defects due to the etching damage, making production steps complicated.

Figure 23A:
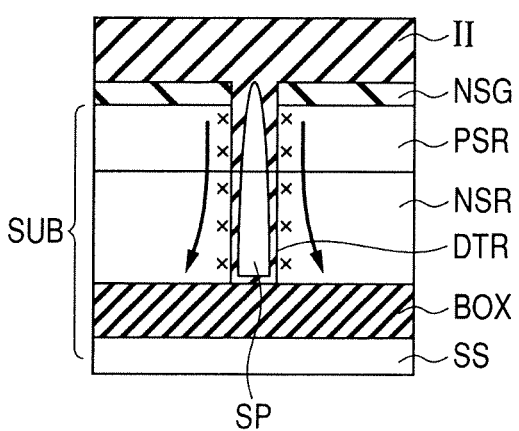
FIGS. 23(A) and 23(B) are schematic cross-sectional views illustrating a buried-insulating-film having semiconductor substrate in which a trench has been formed and an etching damage has been formed along the side surface of the trench.
Figure 23B:
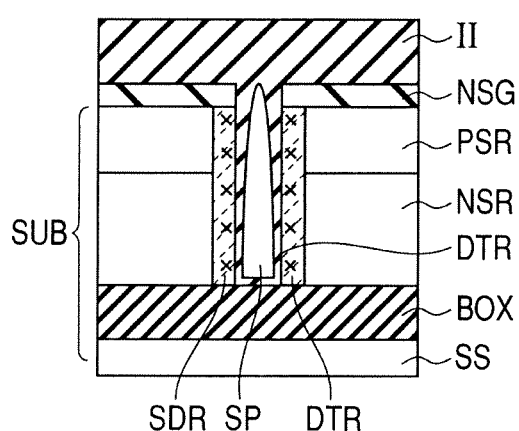

Referring to FIGS. 23(A) and (B), prevention of a leakage current in the case where a semiconductor substrate SUB is made of an SOI substrate will next be described. As illustrated in FIG. 23(A), even if the semiconductor substrate SUB is made of an SOI substrate, when there is a pn junction portion between an n type semiconductor region NSR and a p type semiconductor region PSR at a portion contiguous to the wall portion of the trench DTR, a leakage current occurs at the pn junction portion via the etching damage on the wall portion of the trench DTR. As illustrated in FIG. 23(B), however, it is possible to prevent positioning of the pn junction at the portion contiguous to the wall portion of the trench DTR by forming the diffusion region SDR along the wall portion of the trench DTR. As a result, generation of a leakage current via the etching damage can be prevented at the pn junction portion.

In addition, since in the present embodiment, the semiconductor substrate SUB is an SOI substrate and the trench DTR is formed to reach the buried insulating film BOX, the diffusion regions SDR formed on both sides of the trench DTR are electrically isolated with the buried insulating film BOX. The p type semiconductor regions PSR on both sides of the trench DTR are therefore not electrically coupled to each other also with these diffusion regions SDR.

Further, the diffusion region SDR can be formed by solid-phase diffusion of an impurity (Group III element or Group V element such as boron or phosphorus) contained in the interlayer insulating film II. In this case, an additional step for implanting another impurity ion for the formation of the diffusion region SDR is not required and the production steps can be simplified. In addition, heat treatment for the crystallinity recovery is not required, making it possible to simplify the production steps further.

The solid-phase diffusion of an impurity such as Group III element into the semiconductor layer SL from the side surface of the trench DTR is performed very uniformly. This means that the potential in the solid-phase diffusion region SDR is almost constant within the region. It is therefore possible to prevent a leakage current from passing through the solid-phase diffusion region SDR, particularly, between a plurality of rows of the etching damages.

In addition, by using the semiconductor substrate SUB made of an SOI substrate as in this embodiment, a true breakdown voltage of the trench DTR based on the electric field in the trench DTR can be analyzed. For example, even in a semiconductor device having a trench DTR in a bulk semiconductor substrate SUB having no buried insulating film BOX, presence of an air gap SP in the trench DTR decreases the electric field in the trench DTR and improves the breakdown voltage of the trench DTR. However, the term "breakdown voltage" as used herein means the breakdown voltage of the pn junction formed by the p type semiconductor region PSR and the n type semiconductor region NSR illustrated in FIG. 22 and there is an error between it and the true breakdown voltage of the trench DTR. When the semiconductor substrate SUB is equipped with a buried insulating film BOX, on the other hand, a true breakdown voltage in the trench DTR can be found with precision.

(Embodiment 2)

The present embodiment is different from Embodiment 1 in the configuration and production method of the trench DTR and the underlying oxide film NSG. The configuration of the present embodiment will next be described.

Figure 24:
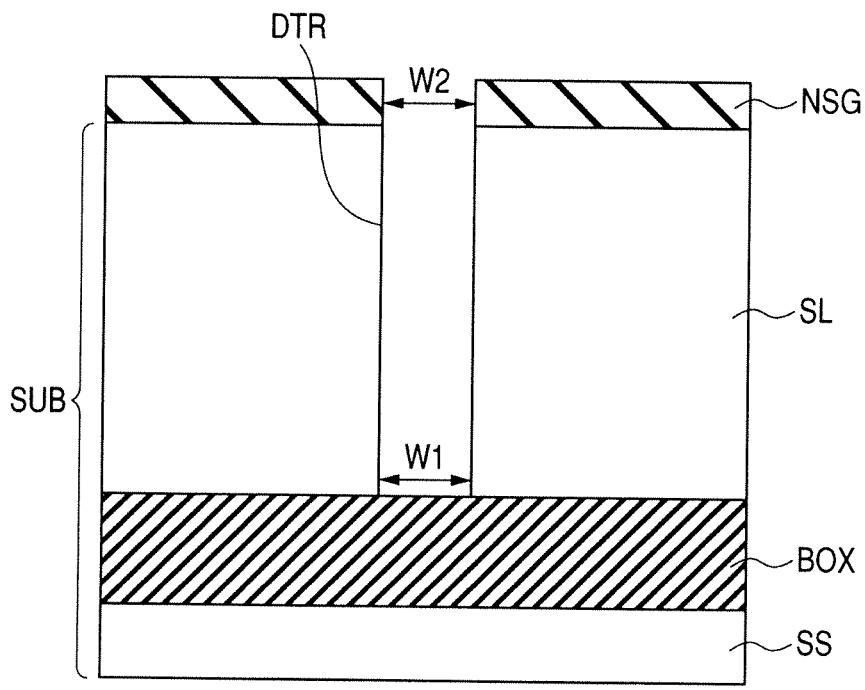
FIG. 24 is a schematic cross-sectional view illustrating the shape of the trench of the semiconductor device according to Embodiment 1 of the present invention.

In Embodiment 1, as illustrated in FIG. 24, a width W1 of the trench DTR in the semiconductor layer SL is almost equal to a width W2 of the underlying oxide film NSG. On the other hand, in the trench DTR of Embodiment 2, the width W1 of the bottom portion (the lowermost part) of the trench DTR is greater than the width W2 (width of an opening penetrating through the underlying oxide film NSG) of the trench DTR in the underlying oxide film NSG (second insulating film) as can be seen from FIGS. 25 and 26.

Figure 25:
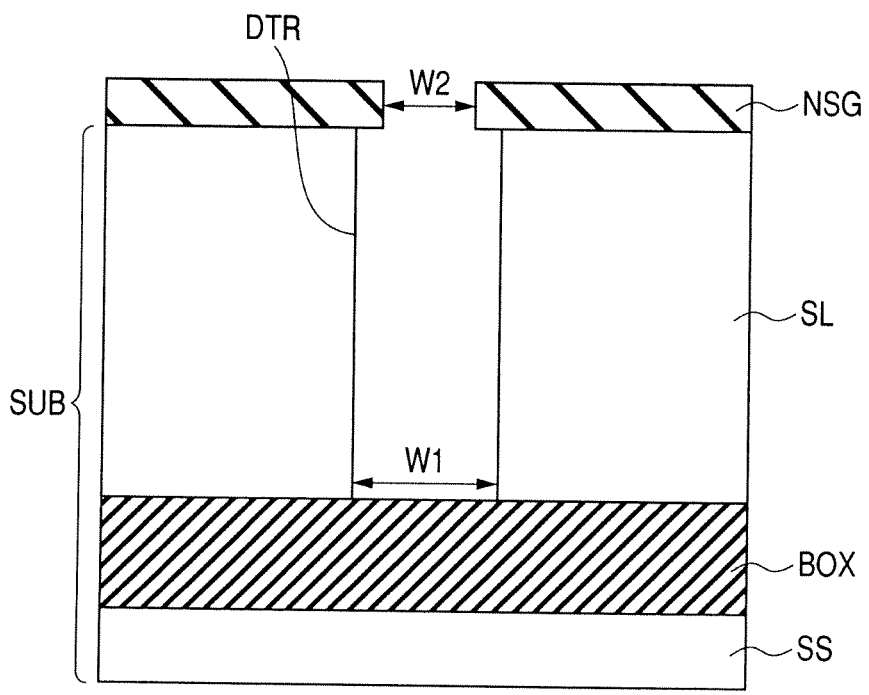
FIG. 25 is a schematic cross-sectional view illustrating the shape of a trench of one example of a semiconductor device according to Embodiment 2 of the present invention.
Figure 26:
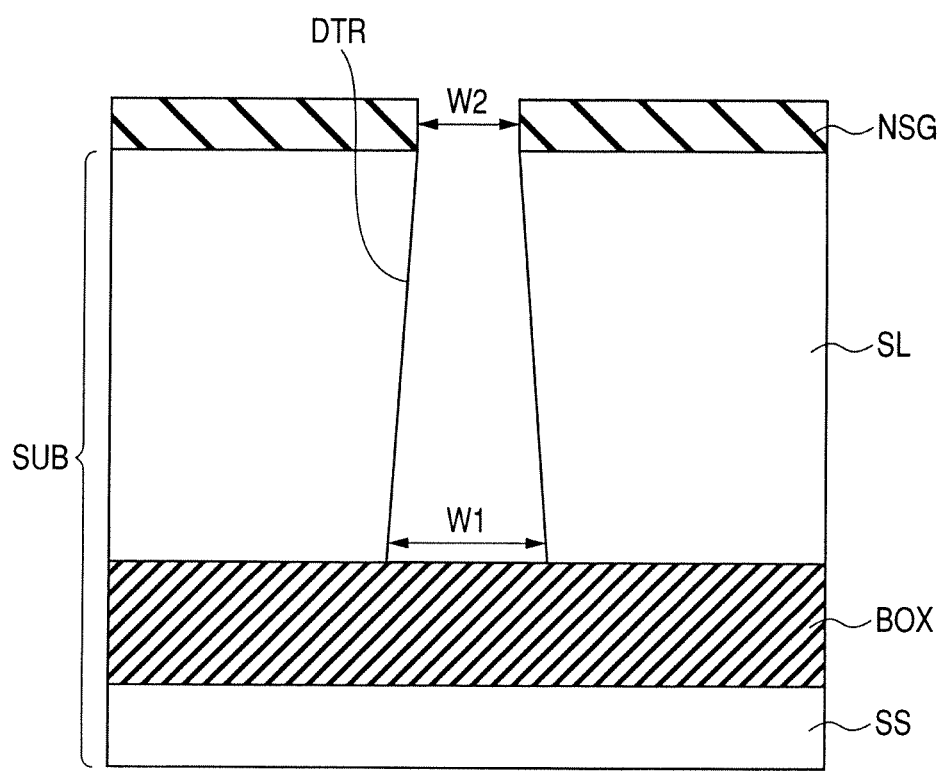
FIG. 26 is a schematic cross-sectional view illustrating the shape of a trench of another example of the semiconductor device according to Embodiment 2 of the present invention.

Supposing that the width W2 of the opening (the trench DTR in the underlying oxide film NSG) of the underlying oxide film NSG as illustrated in FIGS. 25 and 26 is as large as the width W2 of the opening of the underlying oxide film NSG of FIG. 24 in Embodiment 1. As illustrated in FIG. 25, the width W1 of the trench DTR in the semiconductor layer SL may be almost uniform over the depth direction of the trench DTR and at the same time, may be greater than the width W2 of the trench DTR in the underlying oxide film NSG. Alternatively, the width W1 of the trench DTR in the semiconductor layer SL may be, as illustrated in FIG. 26, wider as it approaches the bottom portion of the trench DTR (as it approaches the buried insulating film BOX).

Figure 27:
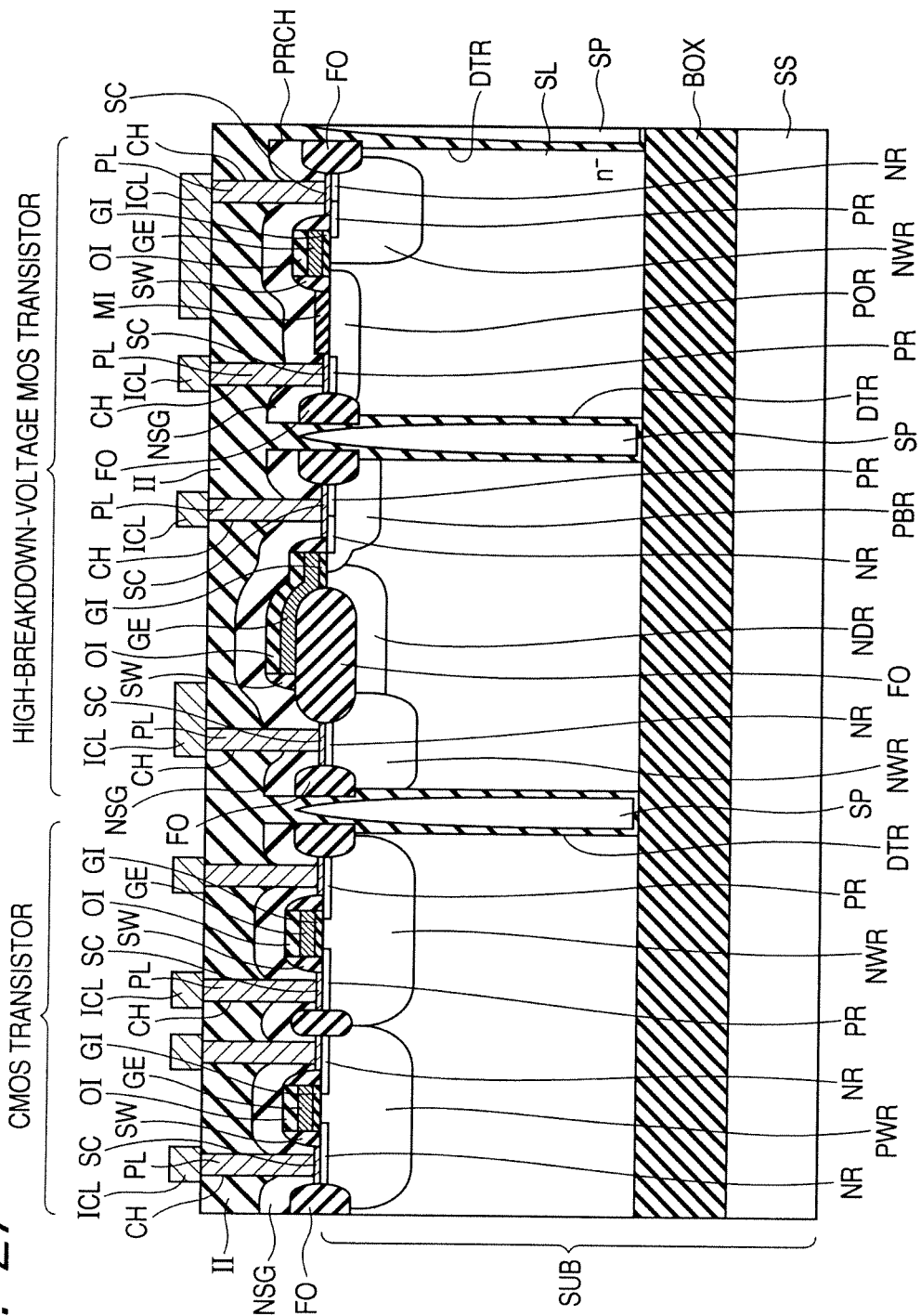
FIG. 27 is a schematic cross-sectional view illustrating the configuration of the one example of the semiconductor device according to Embodiment 2 of the present invention.
Figure 28:
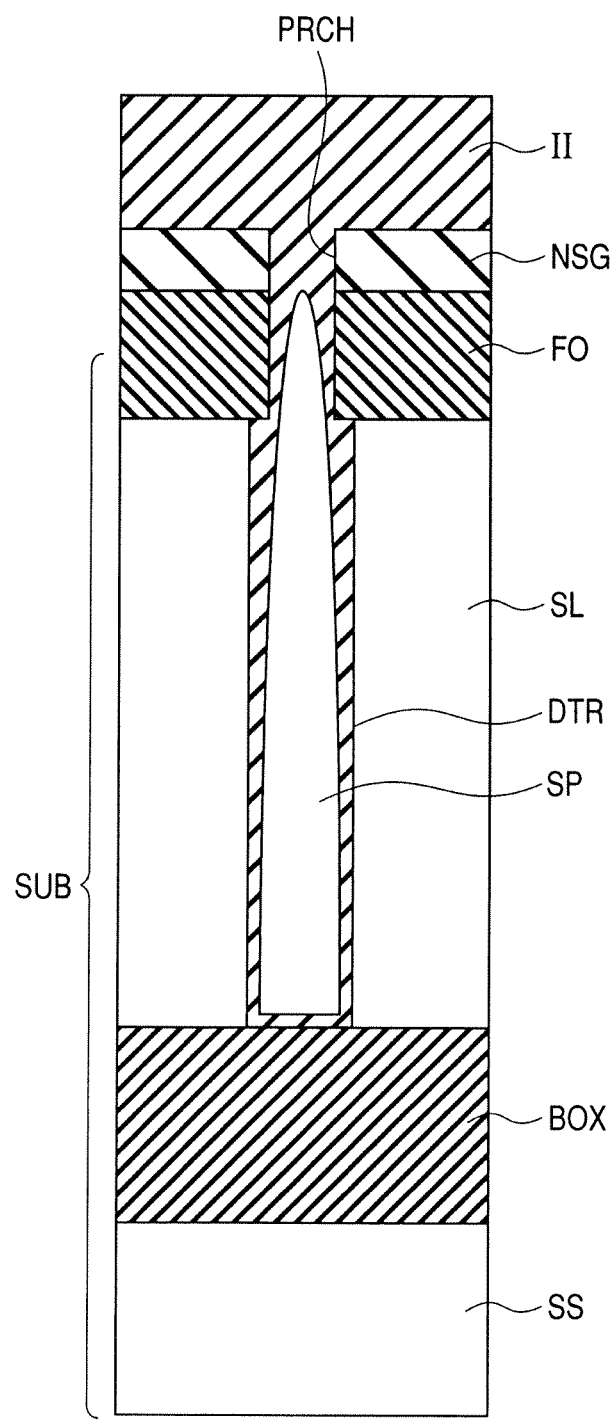
FIG. 28 is an enlarged cross-sectional view illustrating a portion of the trench of FIG. 27.
Figure 29:
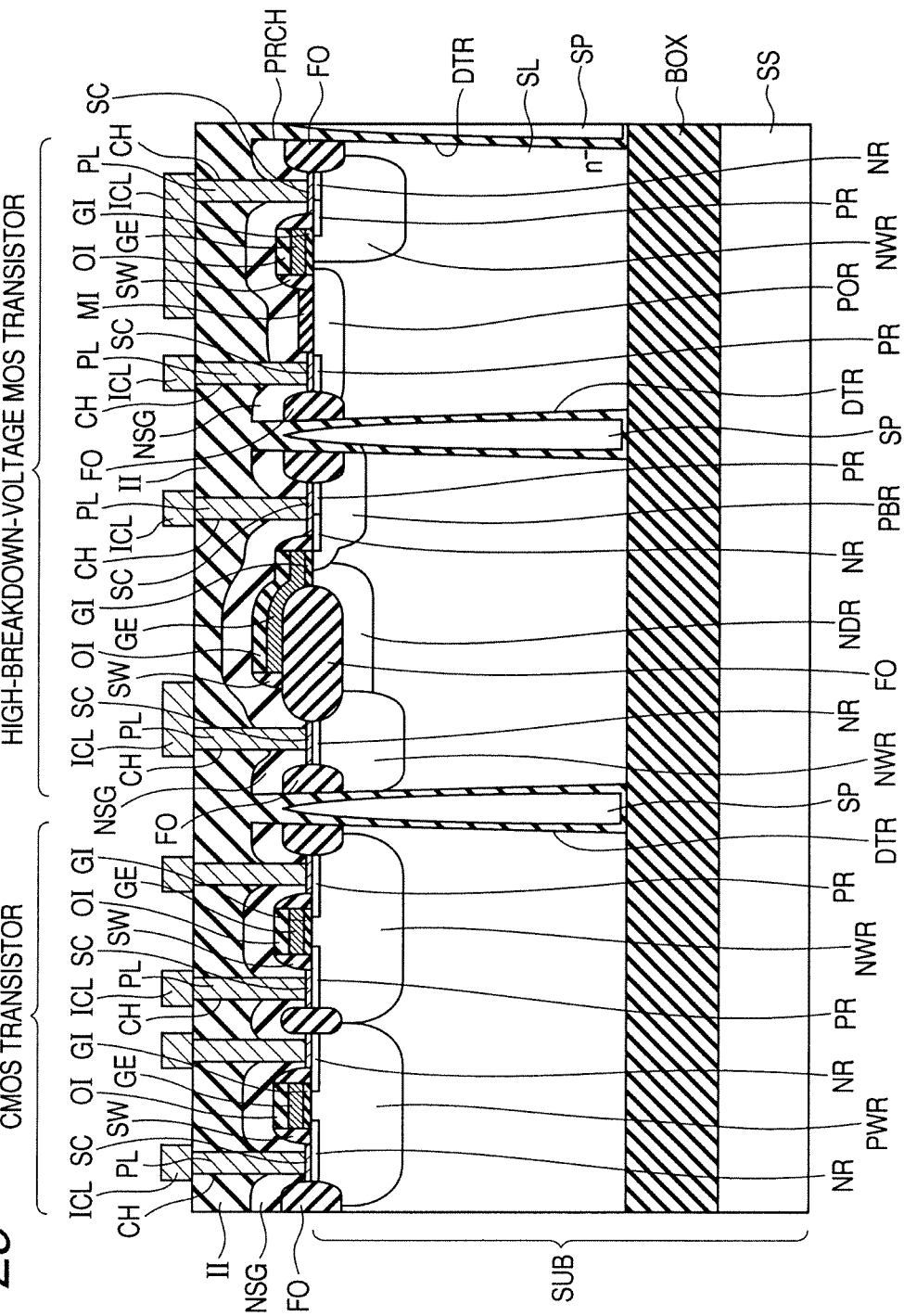
FIG. 29 is a schematic cross-sectional view illustrating the configuration of the another example of the semiconductor device according to Embodiment 2 of the present invention.
Figure 30:
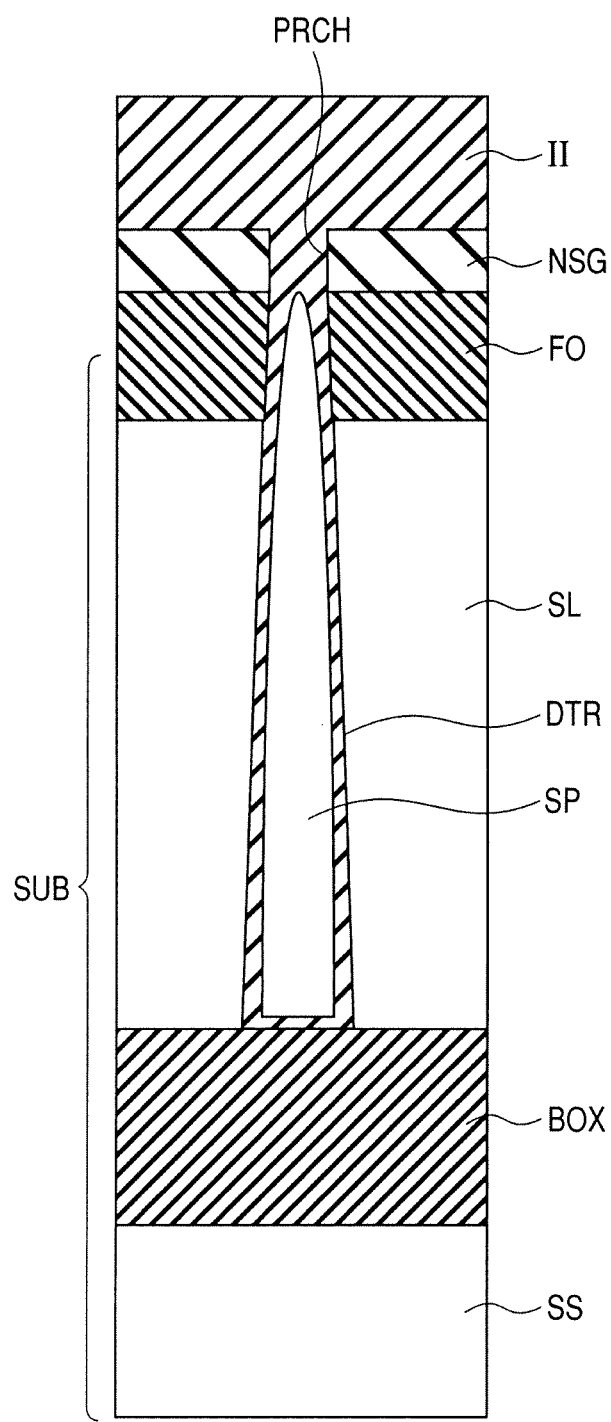
FIG. 30 is an enlarged cross-sectional view illustrating a portion of the trench of FIG. 29.

In FIGS. 24 to 26, only the shape of the trench DTR is illustrated and the interlayer insulating film II in the trench DTR or the field oxide film FO are omitted from the drawings for convenience of description. A semiconductor device having a trench DTR with the shape as illustrated in FIG. 25 has a mode as illustrated in FIG. 27 and an enlarged view of the vicinity of the trench DTR is as illustrated in FIG. 28. A semiconductor device having a trench DTR with the shape as illustrated in FIG. 26 has a mode as illustrated in FIG. 29 and an enlarged view of the vicinity of the trench DTR is as illustrated in FIG. 30. FIGS. 27 and 29 correspond to FIG. 3 of Embodiment 1. The width of the opening PRCH of the underlying oxide film NSG illustrated in FIGS. 28 and 30 is almost equal to the width of the opening of the underlying oxide film NSG in Embodiment 1.

Since the configuration of the present embodiment is almost similar to the configuration of Embodiment 1 except for the above-described points so that in FIGS. 27 to 30, members same as those in Embodiment 1 will be identified by like reference numerals and description on them is not repeated.

Figure 31:
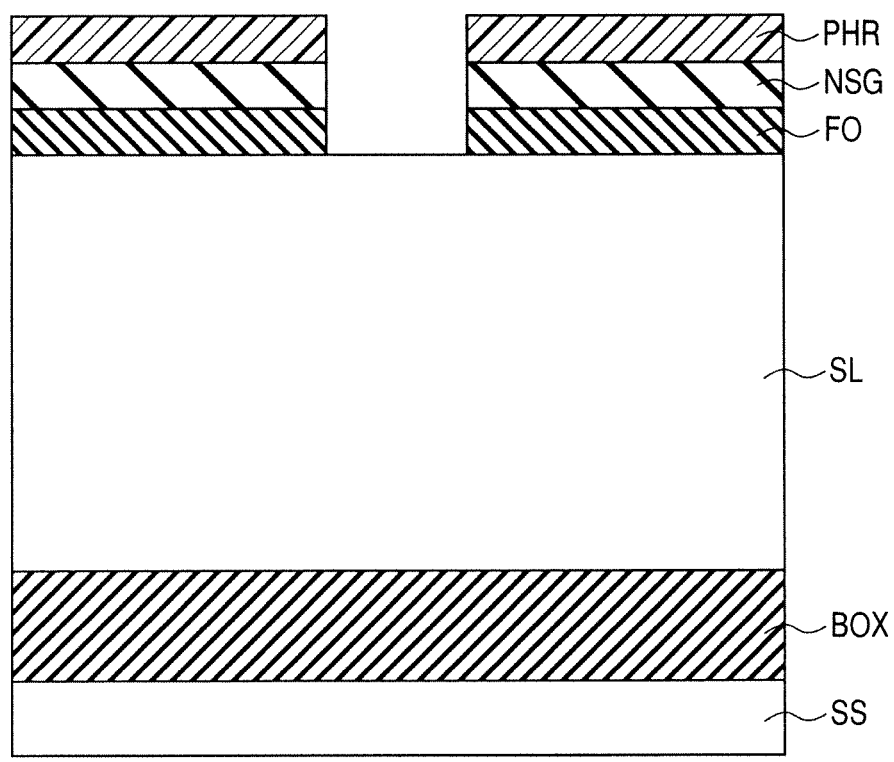
FIG. 31 is a schematic cross-sectional view after formation of a trench (opening) in a layer above a semiconductor layer but prior to the formation of a trench in the semiconductor layer.

A manufacturing method of the present embodiment will next be described. The manufacturing method of the present embodiment includes steps similar to those of Embodiment 1 which are illustrated in FIGS. 4 to 8. A simplified and enlarged view of the configuration in the vicinity of the trench DTRA of FIG. 8 is illustrated in FIG. 31. The photoresist PHR is then removed. With the underlying oxide film NSG as a mask, the semiconductor layer SL is etched to form a trench DTR reaching the buried insulating film BOX. The trench DTR having a shape as illustrated in FIG. 25 or FIG. 26 is formed by changing the etching method or conditions employed for the formation of the trench DTR in Embodiment 1.

Described specifically, in the formation of the wide trench DTR as illustrated in FIG. 25, the formation of the trench DTR under the conditions similar to those of Embodiment 1 is followed by wet etching to increase the width of the trench DTR. By this wet etching, the semiconductor layer SL made of silicon is removed preferentially to the underlying oxide film NSG and the field oxide film FO made of a silicon oxide film to increase the width of the trench DTR in the semiconductor layer SL.

In the formation of the trench DTR having a tapered shape as illustrated in FIG. 26, on the other hand, etching conditions of the semiconductor layer SL after removal of the photoresist PHR following the state of FIG. 31 is different from the etching conditions of Embodiment 1. As one example of the etching for forming the trench DTR of Embodiment 1, an argon (Ar) gas, an $SF_6$ (sulfur hexafluoride) gas, and an $O_2$ (oxygen) gas are supplied at 50 sccm, 60 sccm, and 25 sccm, respectively, under the pressure of 4 Pa and supply of a high-frequency power of 40 W is retained for 120 seconds. On the other hand, as one example of the etching for forming the trench DTR of the present embodiment having a tapered shape as illustrated in FIG. 26, an Ar gas, an $SF_6$ gas, and an $O_2$ gas are supplied at 250 sccm, 50 sccm, and 30 sccm, respectively, under the pressure of 3 Pa and supply of a high-frequency power of 50 W is retained for 160 seconds.

Figure 32:
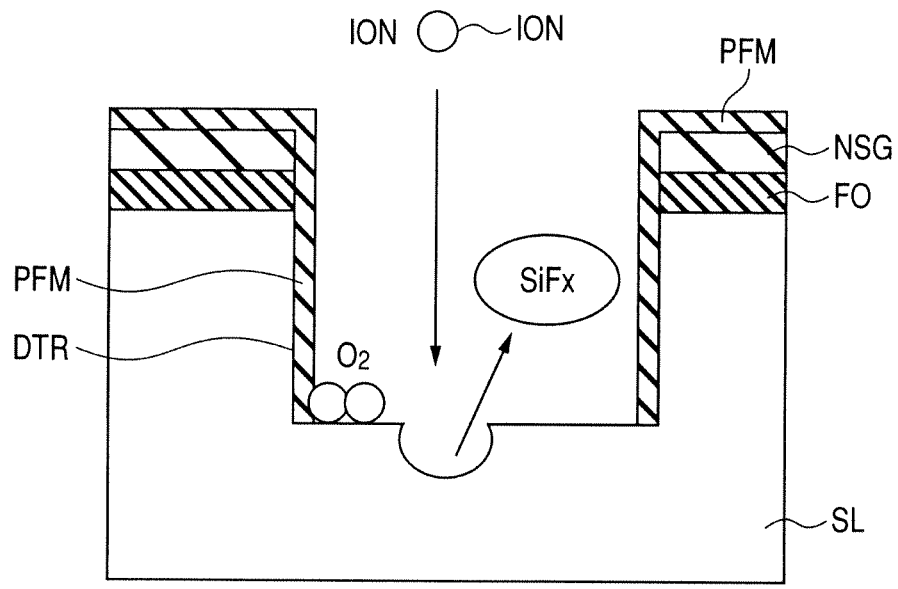
FIG. 32 is a schematic cross-sectional view illustrating a principle based on which the semiconductor layer is etched.

Upon etching of the semiconductor layer SL made of silicon, silicon Si and a fluorine (F) ion ION in the $SF_6$ gas react to generate $SiF_x$ as illustrated in FIG. 32. Formation of $SiF_x$ leads to etching of Si from the semiconductor layer SL.

In addition, the reaction between silicon Si and an $O_2$ gas leads to formation of a sidewall protective film PFM on the side surface of the trench. The sidewall protective film PFM suppresses deep etching in the horizontal direction of FIG. 32. This means that due to the formation of the sidewall protective film PFM, etching does not proceed in the lateral direction of FIG. 32, but proceeds in the vertical direction of FIG. 32 (to effect deep etching). The argon gas is added to neutralize the above reaction.

Figure 33:
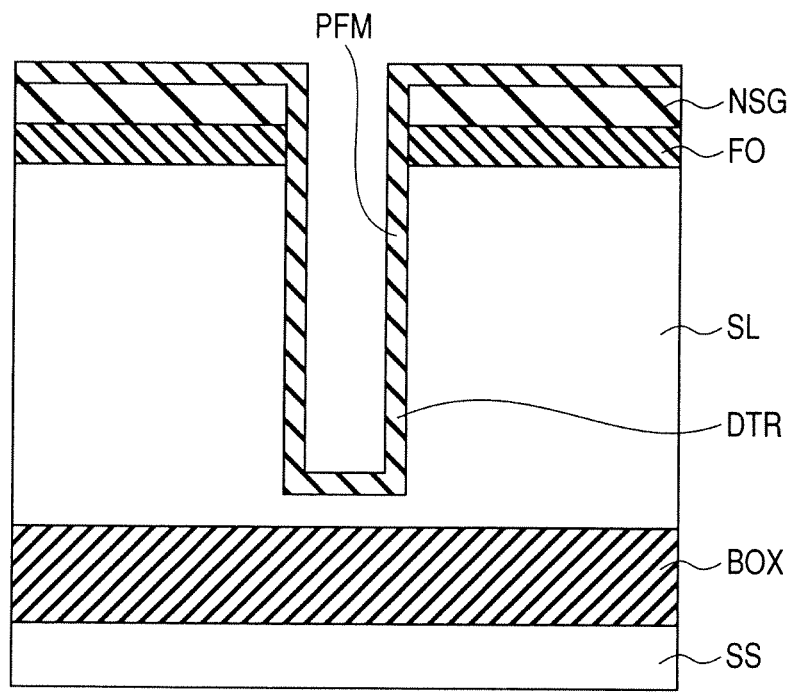
FIG. 33 is a schematic cross-sectional view after etching of the semiconductor layer in FIG. 32.
Figure 34:
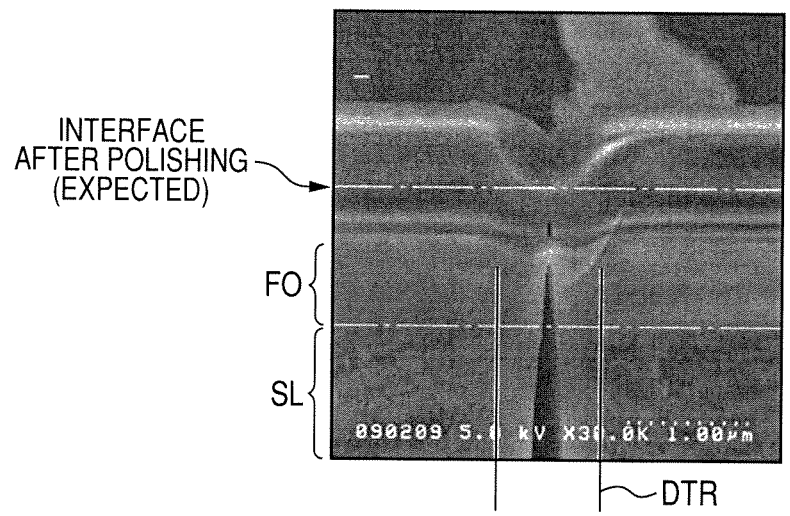
FIG. 34 is a photograph showing the cross-section of an upper portion of a trench having a DTI width of 0.8 μm at the center of a wafer.
Figure 35:
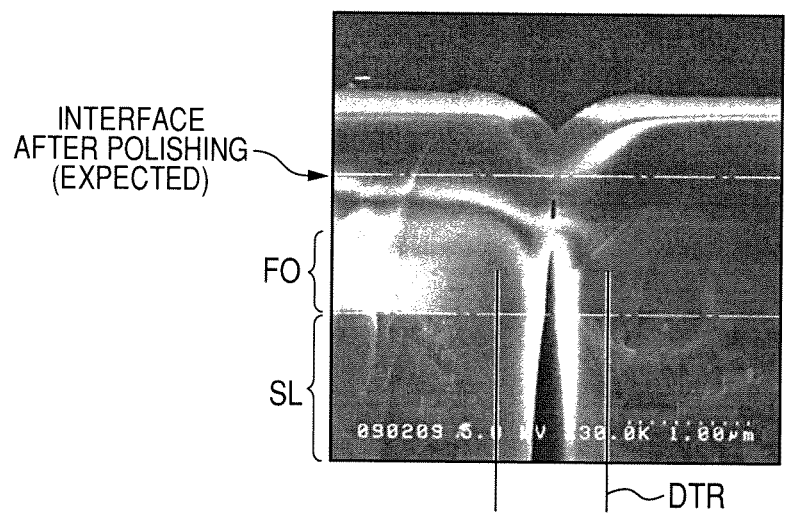
FIG. 35 is a photograph showing the cross-section of an upper portion of a trench having a DTI width of 0.9 μm at the center of a wafer.

In such a manner, the semiconductor layer SL immediately below a region of the underlying oxide film NSG and the like in which a trench has been made is etched selectively as illustrated in FIG. 33 and the trench DTR is formed. Adoption of the above etching conditions of the present embodiment in such an etching mechanism enables to form a trench DTR having a tapered shape as illustrated in FIG. 26.

By employing steps similar to those of Embodiment 1 illustrated in FIGS. 10 to 12, the semiconductor device of Embodiment 2 is manufactured.

The effect and advantage of the present embodiment will next be described. In the present embodiment, since the width W1 at the bottom of the trench DTR is large, a large breakdown voltage can be secured and at the same time, since the opening width W2 of the trench DTR is small, it is possible to prevent exposure of the air gap SP in the trench DTR which will otherwise occur by the etching performed thereafter. This will hereinafter be described.

An increase in the width of the trench DTR in Embodiment 1 enables to improve the breakdown voltage of the trench DTR.

Figure 36:
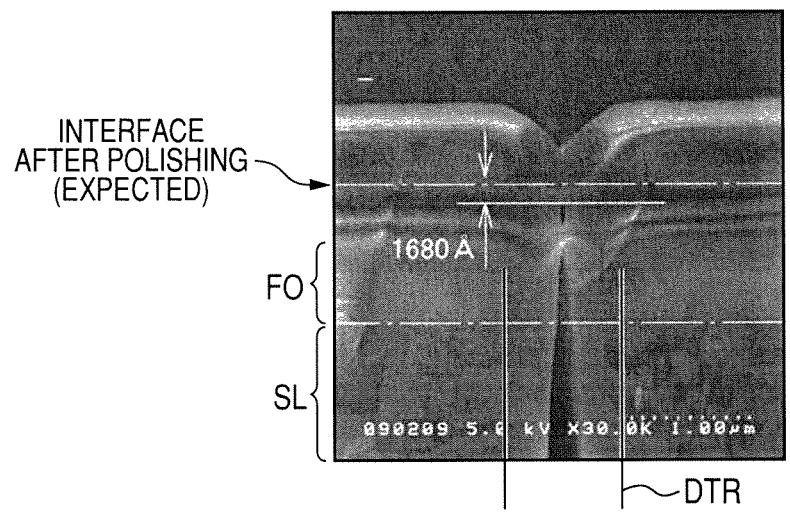
FIG. 36 is a photograph showing the cross-section of an upper portion of a trench having a DTI width of 1.0 μm at the center of a wafer.
Figure 37:
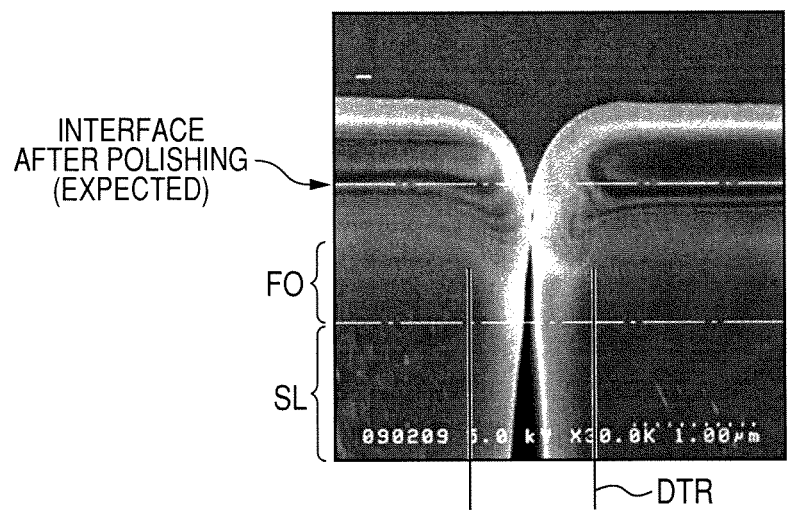
FIG. 37 is a photograph showing the cross-section of an upper portion of a trench having a DTI width of 1.1 μm at the center of a wafer.
Figure 38:
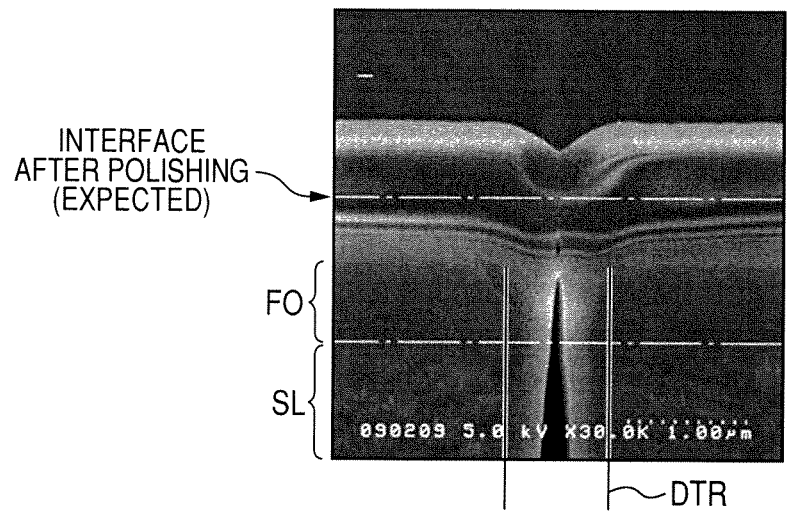
FIG. 38 is a photograph showing the cross-section of an upper portion of a trench having a DTI width of 0.8 μm at the periphery of a wafer.
Figure 39:
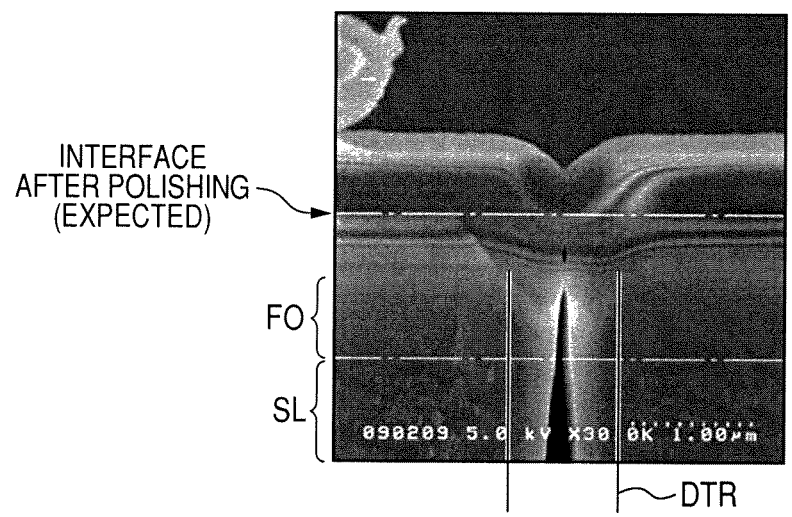
FIG. 39 is a photograph showing the cross-section of an upper portion of a trench having a DTI width of 0.9 μm at the center of a wafer.
Figure 40:
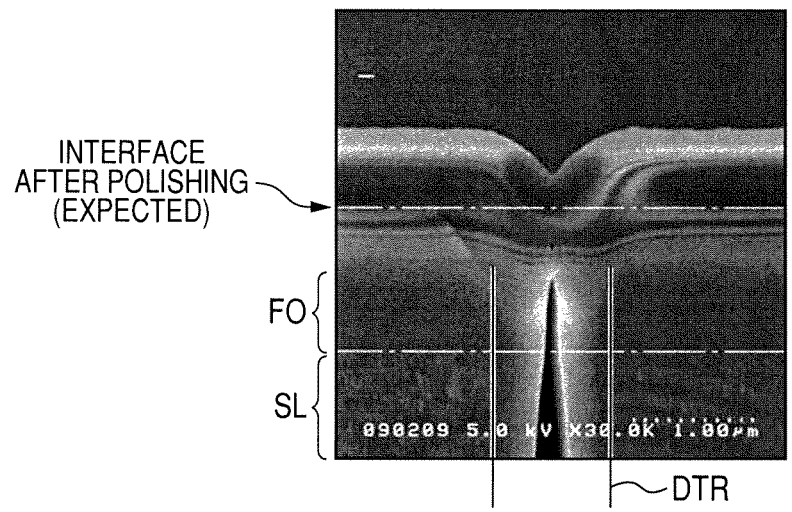
FIG. 40 is a photograph showing the cross-section of an upper portion of the trench having a DTI width of 1.0 μm at the center of a wafer.
Figure 41:
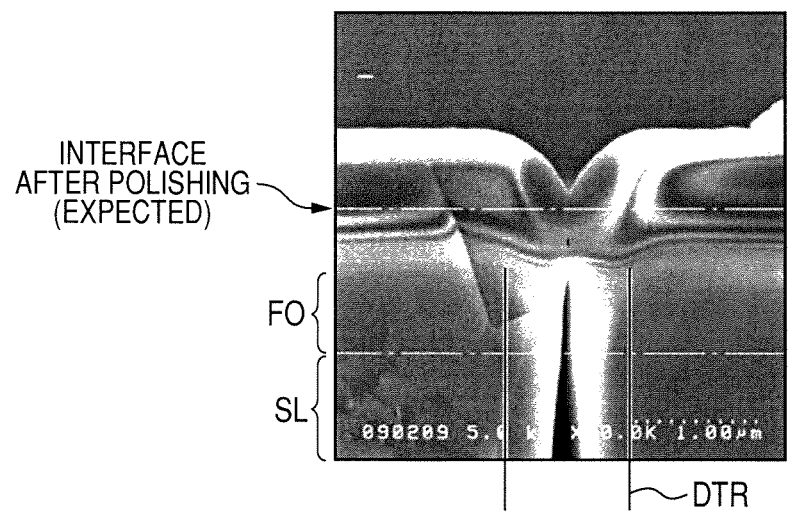
FIG. 41 is a photograph showing the cross-section of an upper portion of a trench having a DTI width of 1.1 μm at the periphery of a wafer.

It is however apparent from FIGS. 34 to 37 that with an increase in the width of the trench DTR, in terms of the size upon designing with CAD, at the center of the wafer from 0.8 to 1.0 μm, the top (air gap top SPT) of the air gap SP in the trench DTR approaches the interface to be polished by CMP and the air gap is not capped sufficiently when the width of the trench DTR is 1.1 μm. It has also been found from FIGS. 38 to 41 that when the width of the trench DTR, in terms of the size upon designing with CAD, at the periphery of the wafer increases from 0.8 to 1.1 μm, the top of the air gap SP similarly approaches the interface to be polished by CMP. In the configuration of Embodiment 1, therefore, an increase in the width of the trench DTR reduces the distance from the air gap top SPT to the upper surface of the interlayer insulating film II. There is sometimes a possibility of the air gap top SPT penetrating through the upper surface of the interlayer insulating film II. This occurs because as the width of the trench DTR is greater, the air gap top SPT exists at a position higher than the upper surface of the semiconductor layer SL. As one example, as illustrated in FIG. 36, the distance, of the element formation region DFR having a trench DTR of 1.0 μm wide, from the air gap top SPT to the top of the underlying oxide film NSG is 1680 Å (168 nm).

Figure 42:
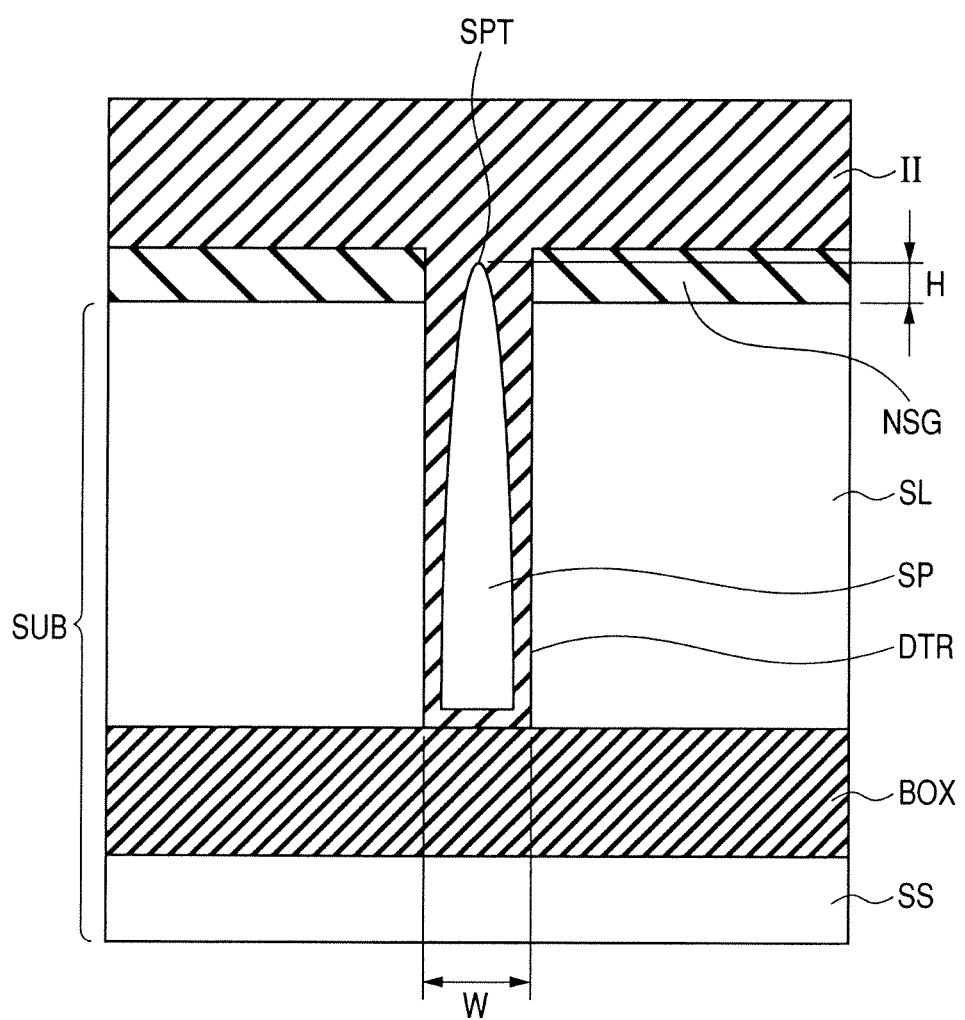
FIG. 42 is a schematic cross-sectional view for describing the width of the trench and the distance from the upper surface of the semiconductor layer to the air gap top, which are shown in the graph of FIG. 43.
Figure 43:
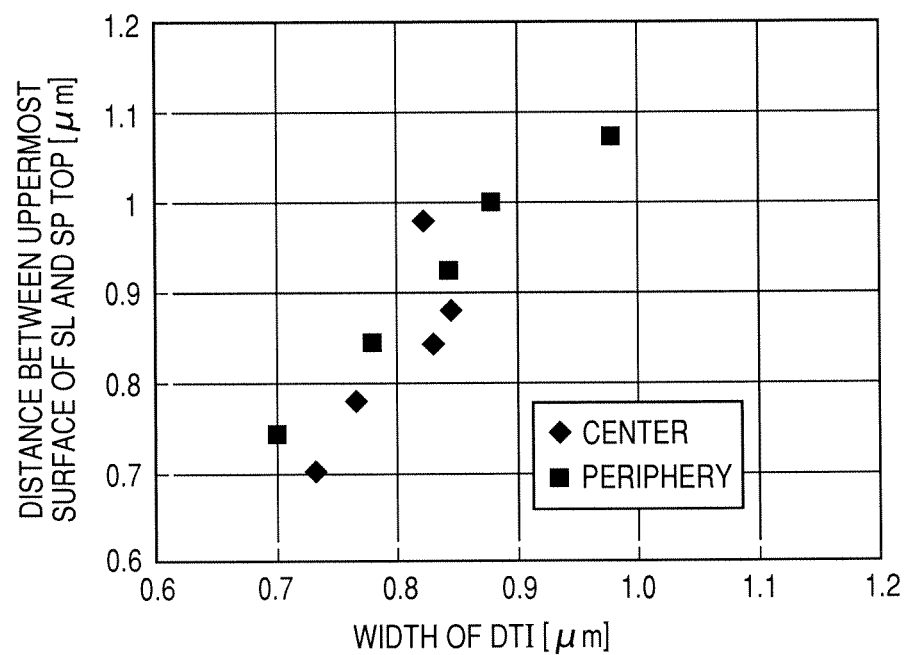
FIG. 43 is a graph showing the relationship between the width of the trench and the height of the air gap top.

In the schematic cross-sectional view of FIG. 42, W represents the width (width of DTI) of the trench DTR and H represents the distance, in a vertical direction, from the upper surface of the semiconductor layer SL to the air gap top SPT. FIG. 43 shows the study results of a change in H with a change in W with regard to the trench DTR formed in the element formation region DFR and in a region peripheral to the element formation region DFR.

In the graph of FIG. 43, the value of W in FIG. 42 is plotted along the abscissa and the value of H in FIG. 42 is plotted along the ordinate. Of the plotted marks, a rhomboid ("center") means a trench DTR formed in the element formation region DFR formed in the center region of the semiconductor chip SCC, while a square ("periphery") means a trench DTR formed in the element formation region DFR formed in a peripheral region of the semiconductor chip SCC.

It has been found from the graph of FIG. 43 that in both the "center" and the "periphery", the greater the width of the trench DTR, the greater the distance from the uppermost surface of the semiconductor layer SL to the air gap top (SPT). In other words, the distance from the uppermost surface of the interlayer insulating film II to the air gap top SPT decreases.

When the distance from the air gap top SPT to the upper surface of the interlayer insulating film II decreases because the air gap top SPT exists at a high position, there may occur deformation of the air gap top SPT by the heat treatment conducted in the steps performed later (refer to FIG. 3) such as a step of forming an interconnect layer ICL or a plug conductive layer PL after formation of the interlayer insulating film II.

Figure 44:
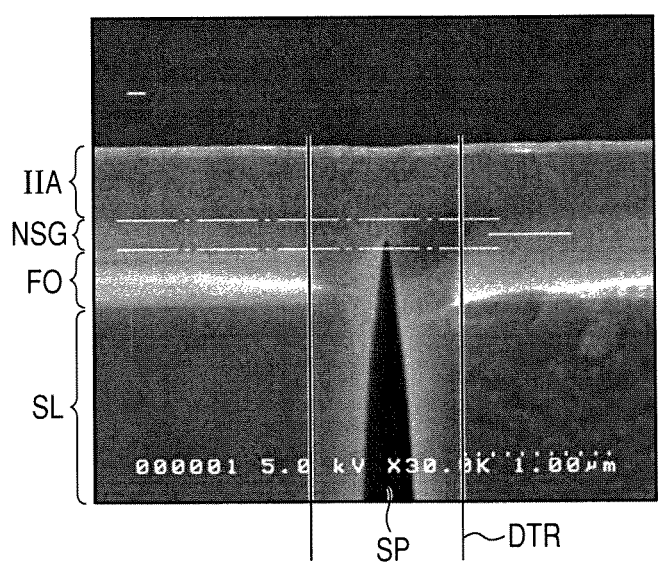
FIG. 44 is a photograph showing the cross-section of an air gap formed normally in the trench.

Described specifically, as can be seen from the air gap SP shown in the photograph of FIG. 44, it is preferred that the distance from the uppermost portion of the interlayer insulating film II to the air gap top SPT is sufficiently high and the air gap top SPT has a sharp pointed cross-sectional shape. In this case, the air gap top SPT has thereon an interlayer insulating film II with a satisfactory thickness so that there is a low possibility of the air gap top SPT going through the upper surface of the interlayer insulating film II.

Figure 45:
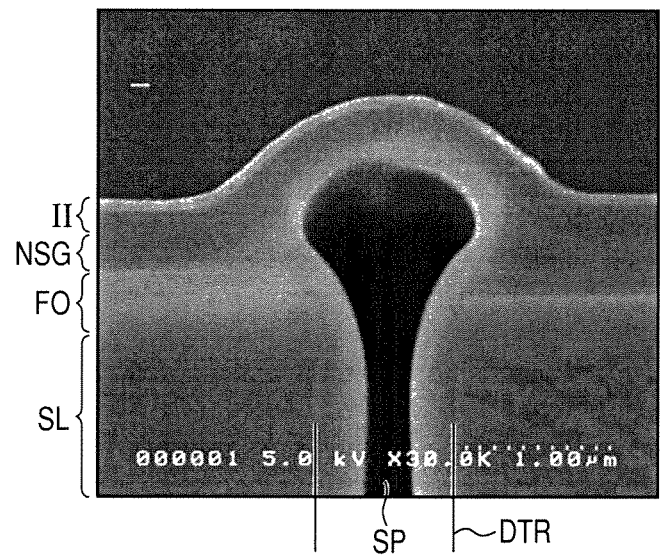
FIG. 45 is a photograph showing one example of the cross-sectional shape of an air gap formed in the trench and having an expanded upper portion.
Figure 46:
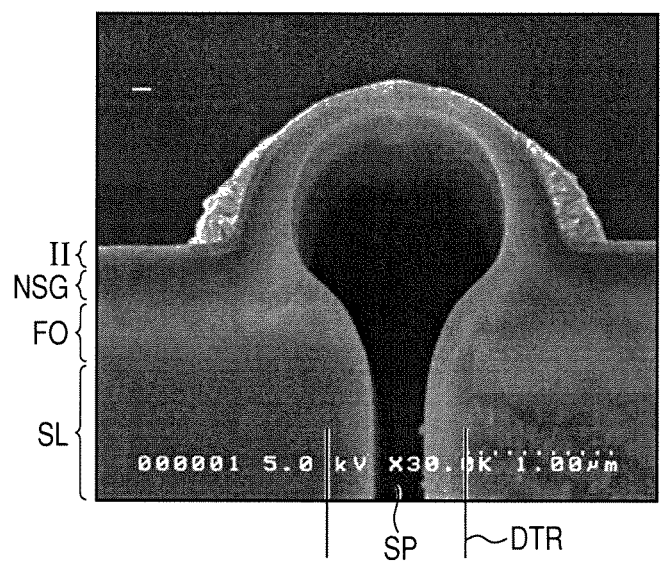
FIG. 46 is a photograph showing the air gap of FIG. 45 having a further expanded upper portion.

When the distance between the air gap top SPT to the interlayer insulating film II is short (when the interlayer insulating film II on the air gap top SPT is thin), heat treatment in the steps performed later such as heat treatment after formation of a thin TiN film expands the air gap top SPT. This occurs due to the expansion of a gas configuring the air gap SP by the heat treatment. FIGS. 45 and 46 illustrate the state after heat treatment at 880° C. of TiN formed by sputtering on the interlayer insulating film II.

Upon etching for forming the interconnect layer ICL or plug conductive layer PL, the thin interlayer insulating film II on the air gap top SPT is also etched. By this etching, there is a possibility of the air gap top SPT going through the interlayer insulating film II.

Figure 47:
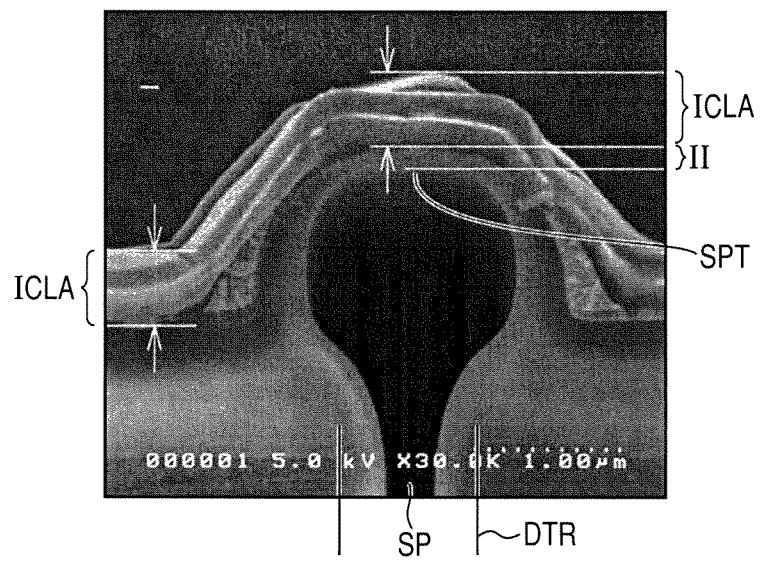
FIG. 47 is a photograph showing one example of the cross-sectional shape of a thin aluminum film formed above the trench by sputtering.

As illustrated in FIG. 47, at the time when a thin aluminum film ICLA (not etched yet) is formed on the interlayer insulating film II on the air gap SP, for example, by sputtering, there is almost no difference in thickness between the thin aluminum film ICLA on the air gap SP and the thin aluminum film ICLA on a region other than the air gap SP.

Figure 48:
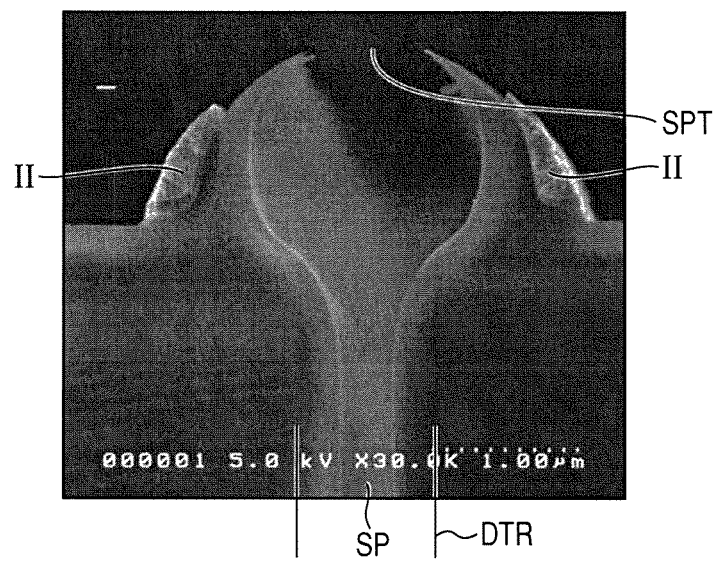
FIG. 48 is a photograph showing one example of the cross-sectional shape of an air gap undergoing a change in shape after removal of the thin aluminum film of FIG. 47 formed above the trench.
Figure 49:
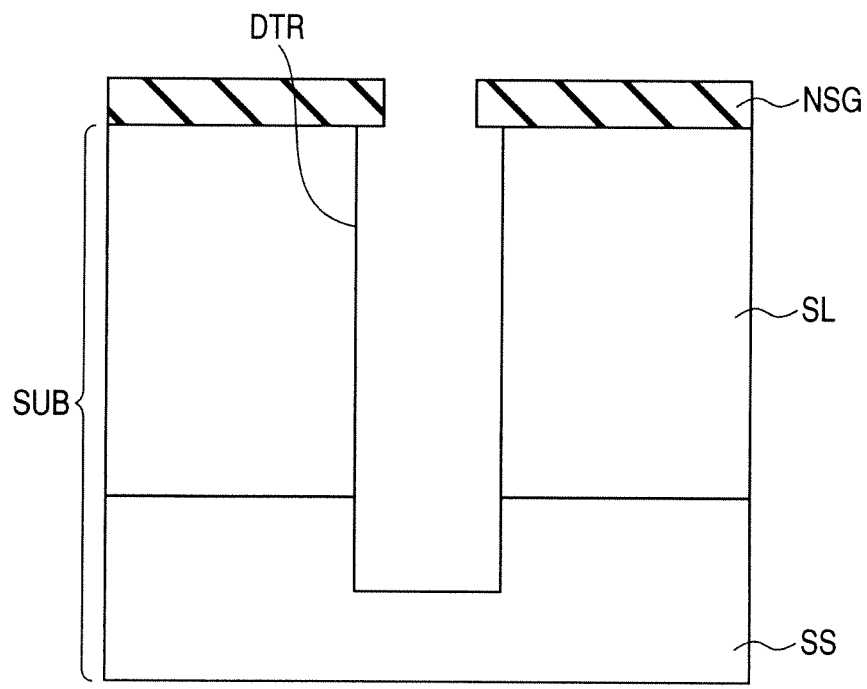
FIG. 49 is a schematic cross-sectional view illustrating the configuration of a bulk semiconductor substrate SUB having no buried insulating film BOX in which a trench similar to that of FIG. 25 has been formed.
Figure 50:
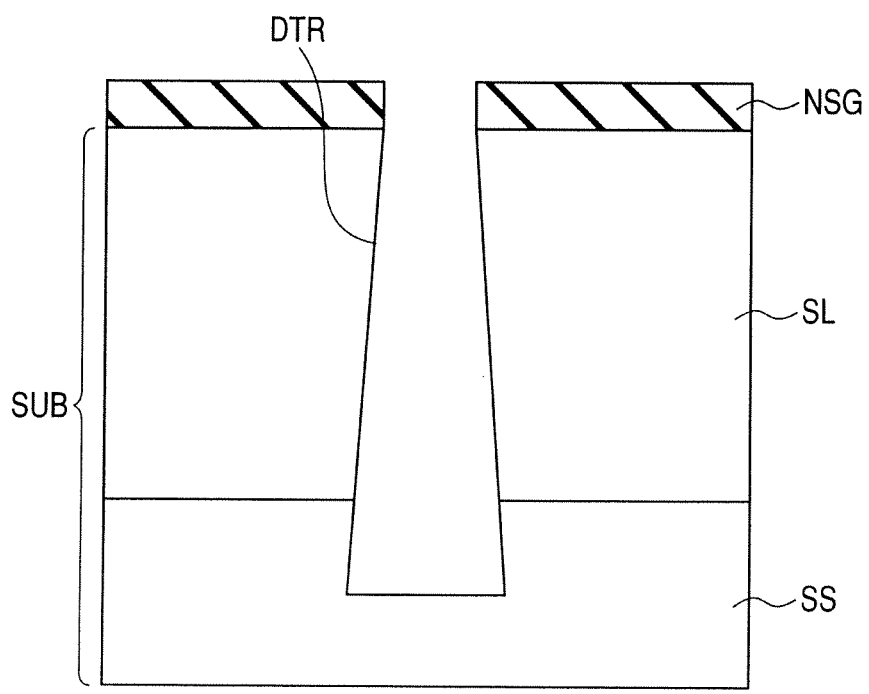
FIG. 50 is a schematic cross-sectional view illustrating the configuration of a bulk semiconductor substrate SUB having no buried insulating film BOX in which a trench similar to that of FIG. 26 has been formed.
Figure 51:
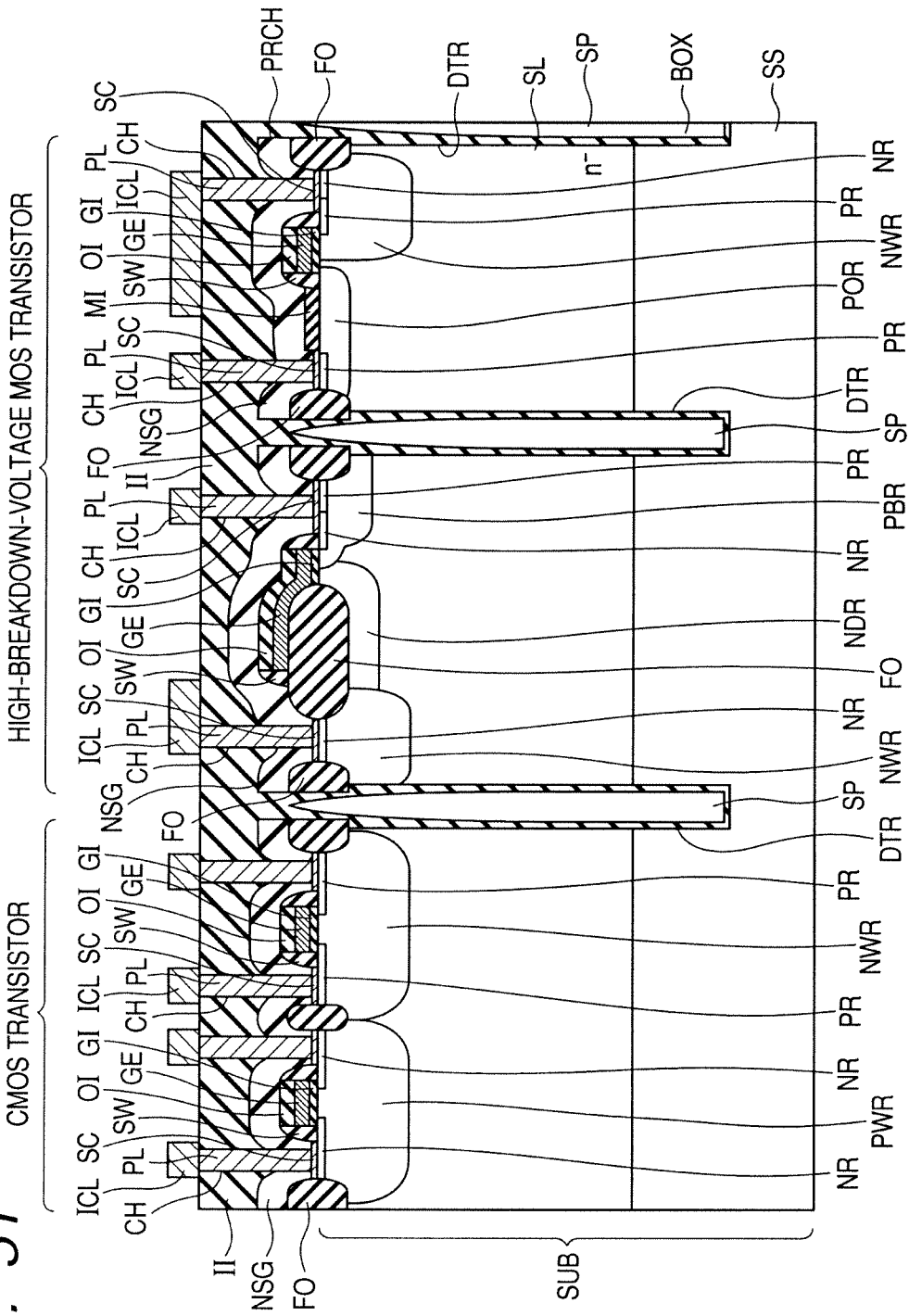
FIG. 51 is a schematic cross-sectional view illustrating the configuration of the one example of the semiconductor device according to Embodiment 2 of the present invention formed using the bulk semiconductor substrate SUB having no buried insulating film BOX.
Figure 52:
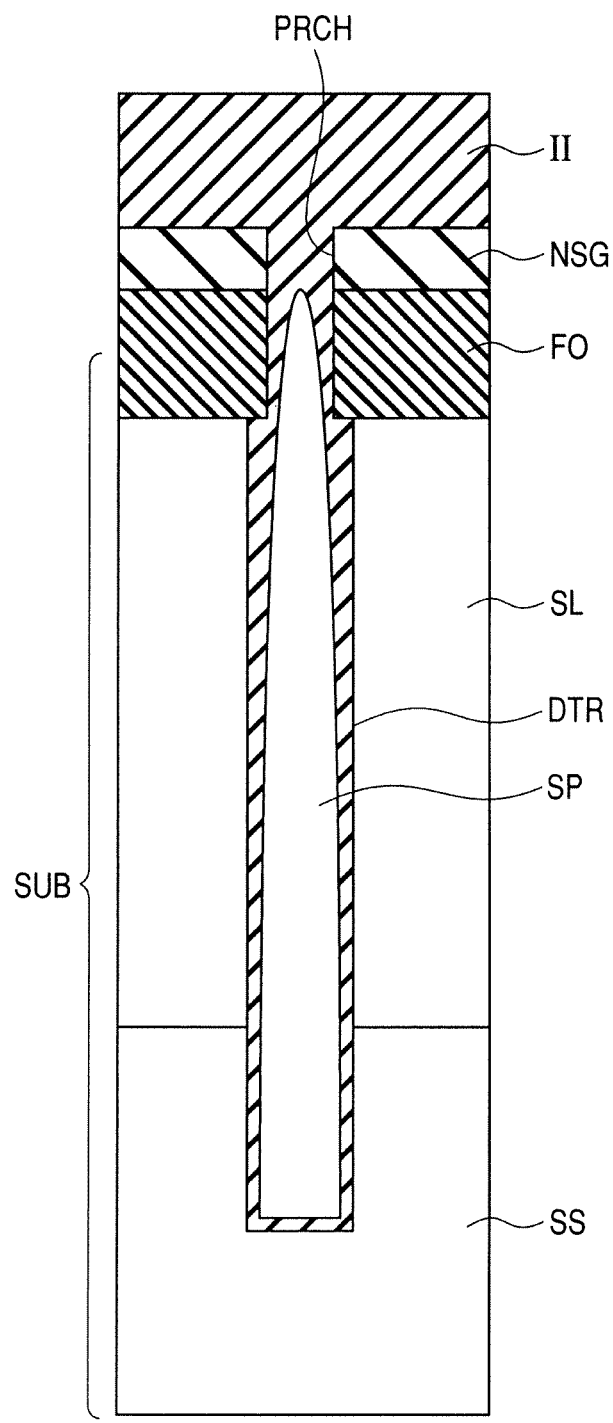
FIG. 52 is an enlarged cross-sectional view of the trench portion of FIG. 51.
Figure 53:
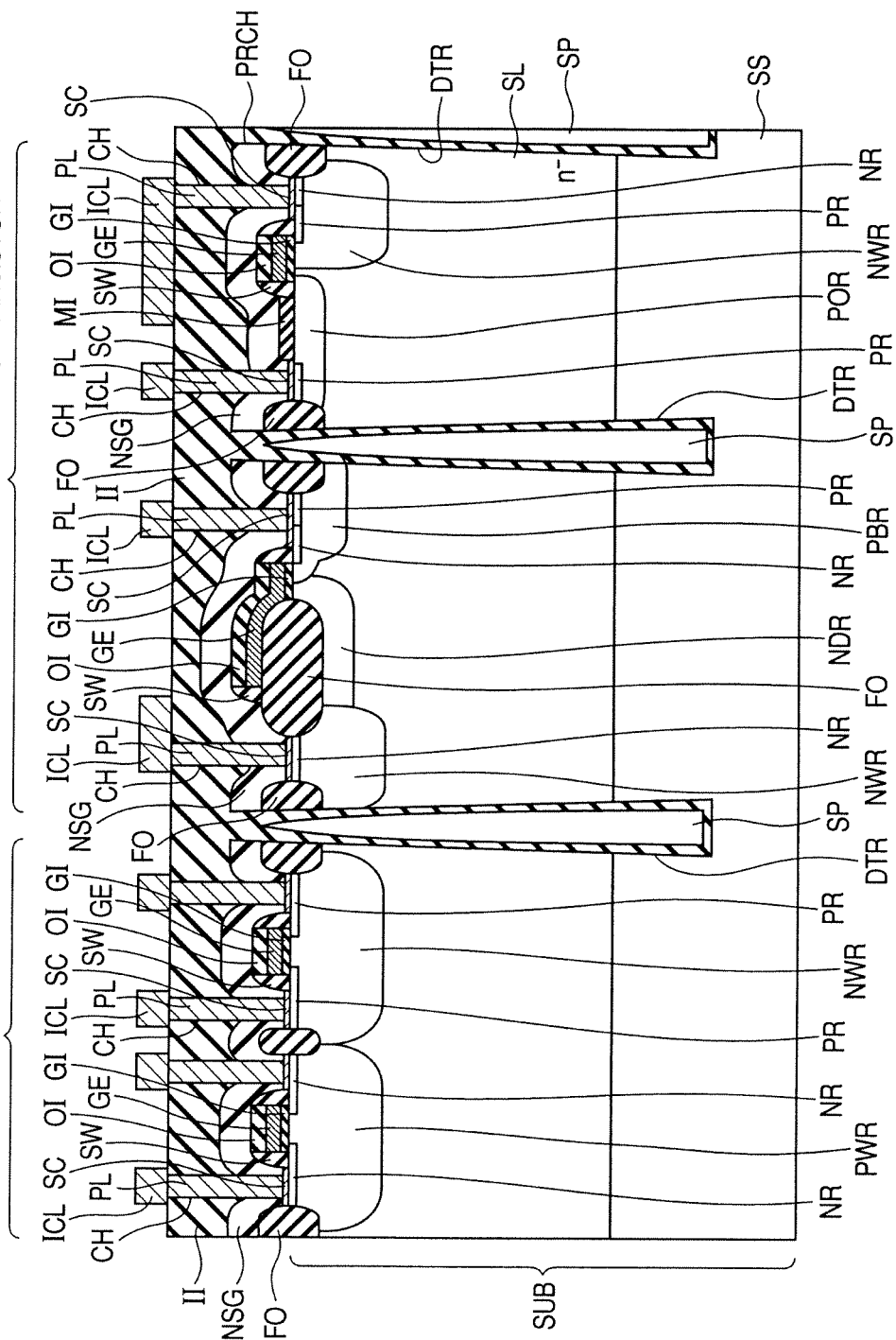
FIG. 53 is a schematic cross-sectional view illustrating the configuration of the another example of the semiconductor device according to Embodiment 2 of the present invention formed using the bulk semiconductor substrate SUB having no buried insulating film BOX.
Figure 54:
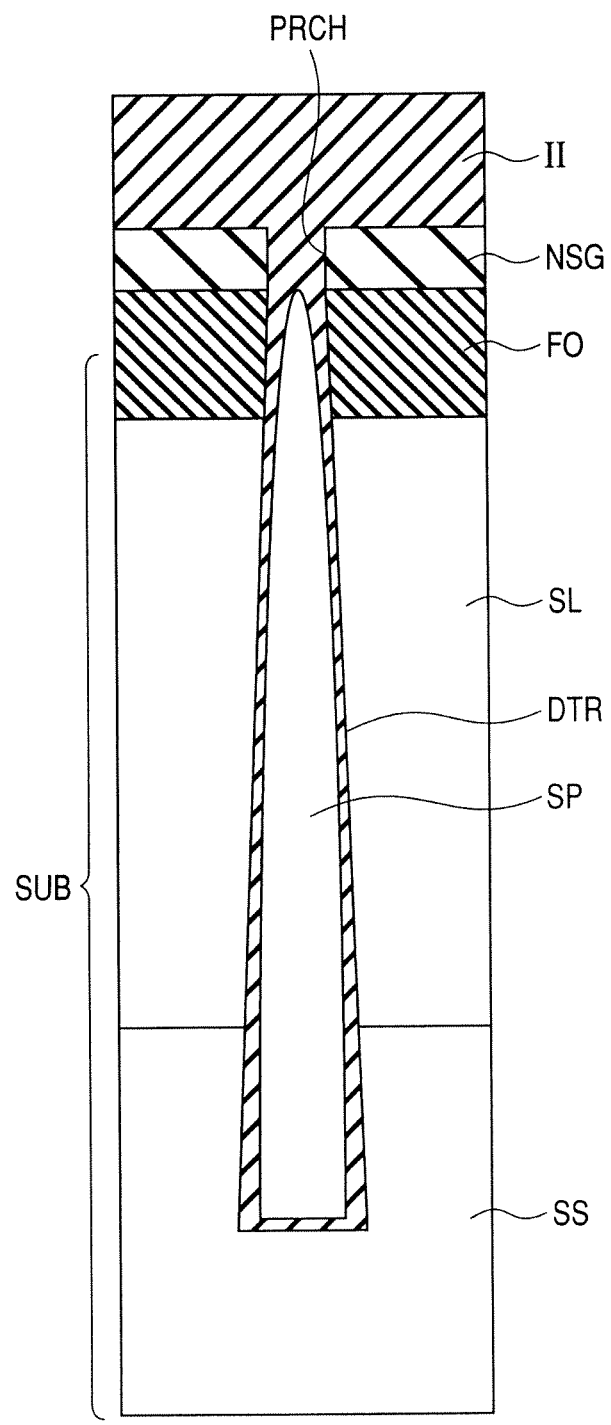
FIG. 54 is an enlarged cross-sectional view of the trench portion of FIG. 53.

When the thin aluminum film ICLA over the trench DTR (over the air gap SP) is removed by patterning of the thin aluminum film ICLA, the interlayer insulating film II is partially removed simultaneously by the etching so that the air gap SP may break through the interlayer insulating film II as illustrated in FIG. 48. This occurs because the thin interlayer insulating film II below the aluminum is etched simultaneously and at the same time, the air gap SP expands at the upper portion thereof. As the upper portion of the air gap SP expands, there is a high possibility of it breaking through the interlayer insulating film II.

Thus, the greater the width of the trench DTR, the higher the position of the air gap top SPT and the thinner the interlayer insulating film II on the air gap top SPT. Then, the upper portion of the air gap undergoes expanding deformation at the time of heat treatment in the steps performed later, which may lead to inconveniences such as breaking through the thin interlayer insulating film II on the air gap SP. When the interlayer insulating film II on the air gap SP is broken, the trench DTR may be embedded completely in the film formation step performed later. In such a case, the function of electrically isolating elements with the trench DTR decreases. It is therefore preferred to decrease the width of the trench DTR.

As in Embodiment 2, at least the width of the opening PRCH of the underlying oxide film NSG formed successively with the trench DTR is made smaller than the width of the trench DTR of the semiconductor layer SL. Conversely, as described above, the width of the opening PRCH of the underlying oxide film NSG is made equal to that of the trench DTR of Embodiment 1 and the width of the trench DTR of the semiconductor layer SL is made greater than the width of the opening PRCH.

This makes it possible to increase the breakdown voltage of the trench DTR because of a large width of the trench DTR and at the same time, suppress an inconvenience, that is, deformation of the upper portion of the air gap SP to go through the interlayer insulating film II because of the width of the opening PRCH smaller than that of the trench DTR.

The trench DTR of Embodiment 2 described above produces advantages similar to those of the trench DTR of Embodiment 1. The trench DTR of Embodiment 2 however may be formed in the semiconductor substrate SUB having no buried insulating film BOX therein. Modes in this case are shown in FIGS. 49 to 54.

Incidentally, deformation of the upper portion of the air gap SP due to expansion can be suppressed by adjusting the heat treatment temperature, after formation of TiN by sputtering as described in FIGS. 45 and 46, to 800° C. or less.

Embodiment 2 of the present invention differs from Embodiment 1 of the present invention only in the above-described points. This means that the configuration, condition, procedure, and advantage of Embodiment 2 not described above all conform to those of Embodiment 1 of the present invention.

(Embodiment 3)

The present embodiment differs from Embodiment 1 in the configuration and manufacturing method of the trench DTR and underlying oxide film NSG. The configuration of this embodiment will next be described.

Figure 55:
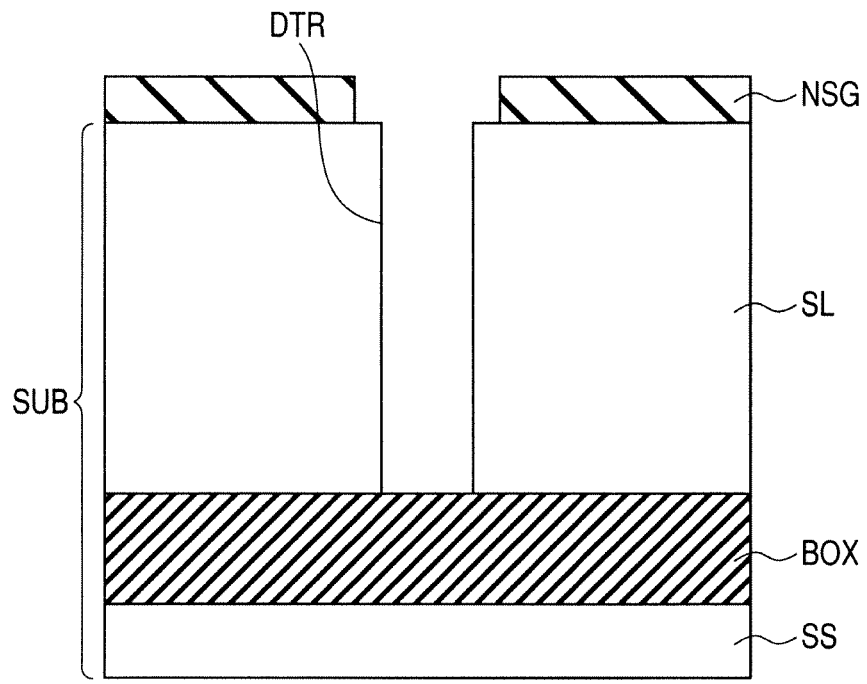
FIG. 55 is a schematic cross-sectional view illustrating the shape of a trench of one example of a semiconductor device according to Embodiment 3 of the present invention.
Figure 56:
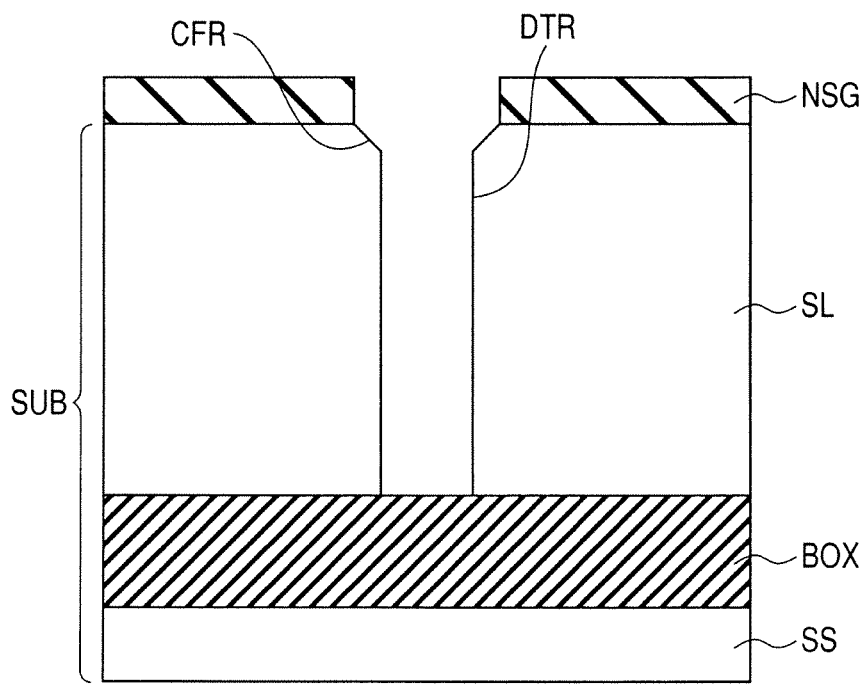
FIG. 56 is a schematic cross-sectional view illustrating the shape of a trench of another example of the semiconductor device according to Embodiment 3 of the present invention.

As illustrated in FIGS. 55 and 56, in the trench DTR of Embodiment 3, the width (the width of an opening penetrating through the underlying oxide film NSG) of the trench DTR in the underlying oxide film NSG (second insulating film) is greater than the width (width, at the upper most portion closest to the underlying oxide film NSG, of the trench DTR formed in the semiconductor layer SL) at the opening ends of the trench DTR. In this point, the trench DTR of Embodiment 3 is different from the trench DTR of Embodiment 1 illustrated in FIG. 24 or the trench DTR of Embodiment 2 illustrated in FIG. 25.

The width (width, at the upper most portion closest to the underlying oxide film NSG, of the trench DTR formed in the semiconductor layer SL) at the opening ends of the trench DTR illustrated in FIGS. 55 and 56 is set equal to the width of the trench DTR of Embodiment 1 illustrated in FIG. 24. The width of the trench DTR in the underlying oxide film NSG may be simply greater than the width at the opening ends of the trench DTR of the semiconductor layer SL as illustrated in FIG. 55. Alternatively, the angular portion in the cross-section of the semiconductor layer SL may have a tapered form as illustrated in FIG. 56.

Figure 57:
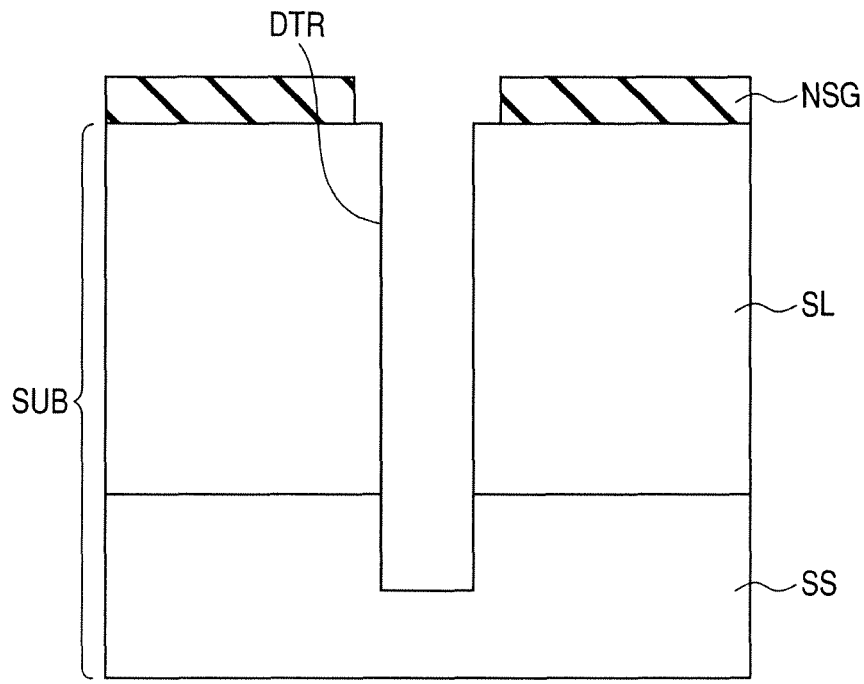
FIG. 57 is a view illustrating the configuration of a bulk semiconductor substrate SUB having no buried insulating film BOX in which a trench similar to that of FIG. 55 has been formed.
Figure 58:
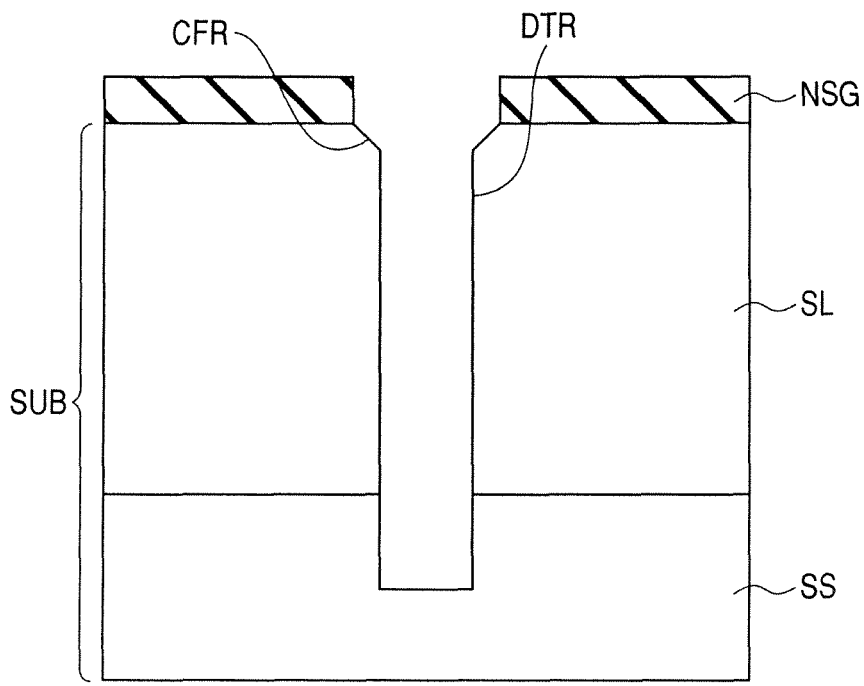
FIG. 58 is a view illustrating the configuration of a bulk semiconductor substrate SUB having no buried insulating film BOX in which a trench similar to that of FIG. 56 has been formed.

Only the shape of the trench DTR is illustrated in FIGS. 55 and 56, and the interlayer insulating film II in the trench DTR or the field oxide film FO are omitted from the drawings for convenience of description. In addition, FIG. 55 or FIG. 56 shows an example of forming the trench DTR of Embodiment 3 by using a semiconductor substrate SUB equipped with a buried insulating film BOX. In Embodiment 3, however, the trench DTR may be formed in the bulk semiconductor substrate SUB made of silicon having no buried insulating film BOX therein similar to Embodiment 2. In this case, FIG. 55 and FIG. 56 correspond to FIG. 57 and FIG. 58, respectively.

Figure 59:
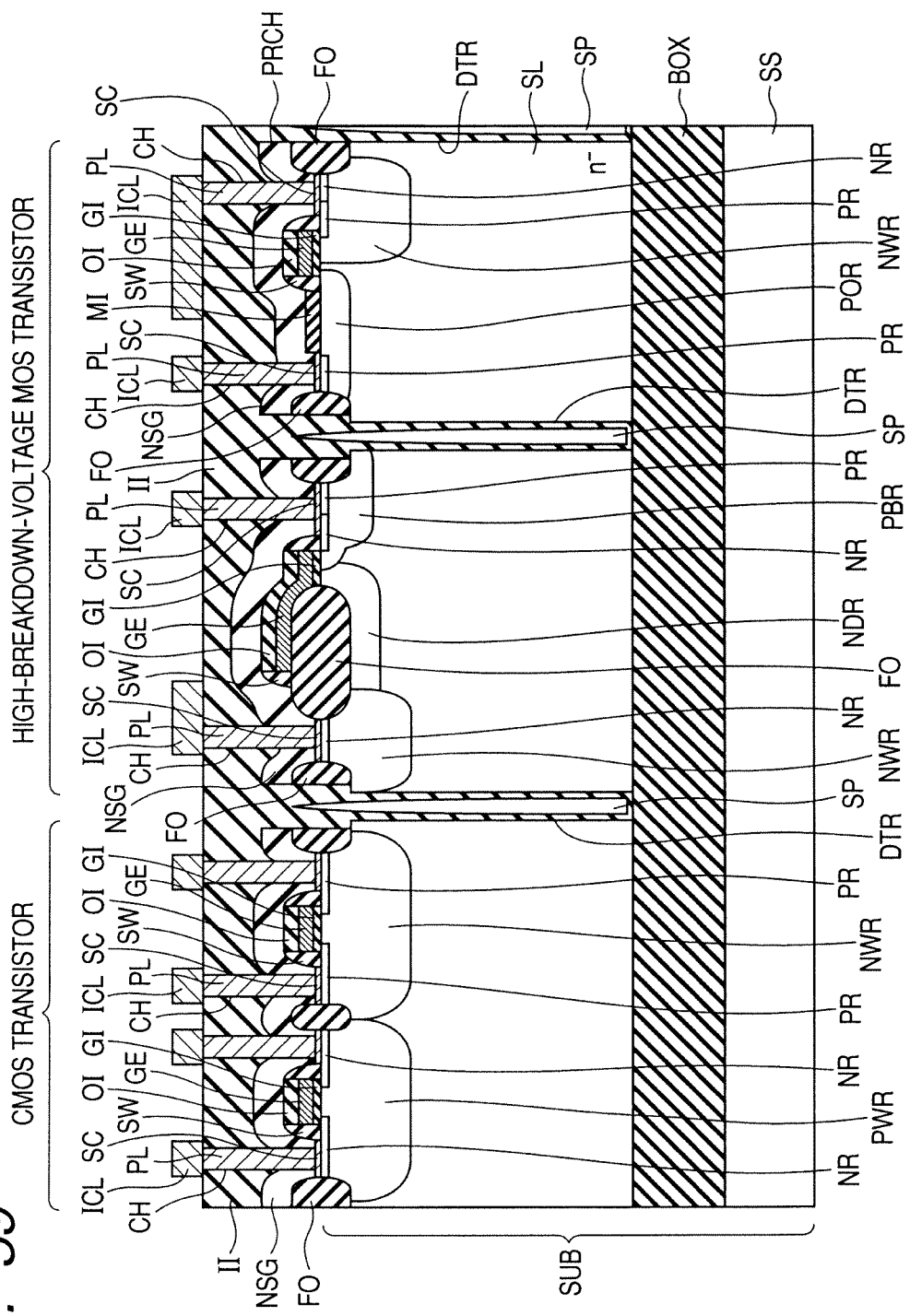
FIG. 59 is a schematic cross-sectional view illustrating the configuration of the one example of the semiconductor device according to Embodiment 3 of the present invention.
Figure 60:
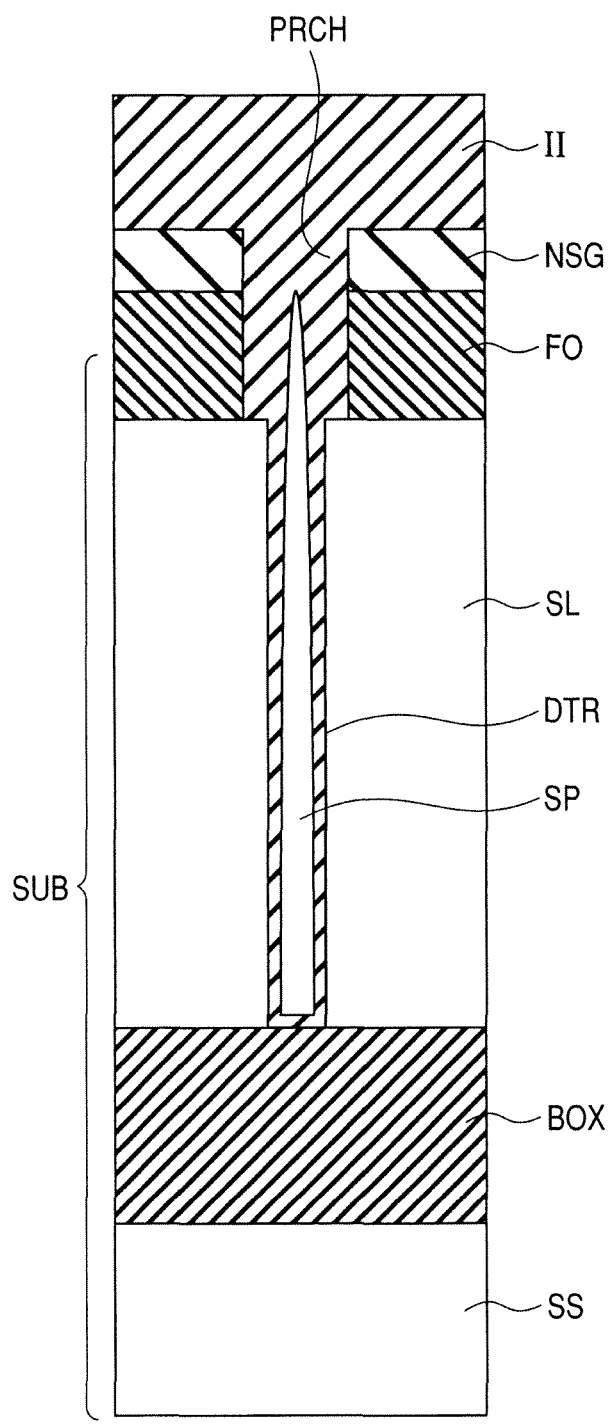
FIG. 60 is an enlarged cross-sectional view of the trench portion of FIG. 59.
Figure 61:
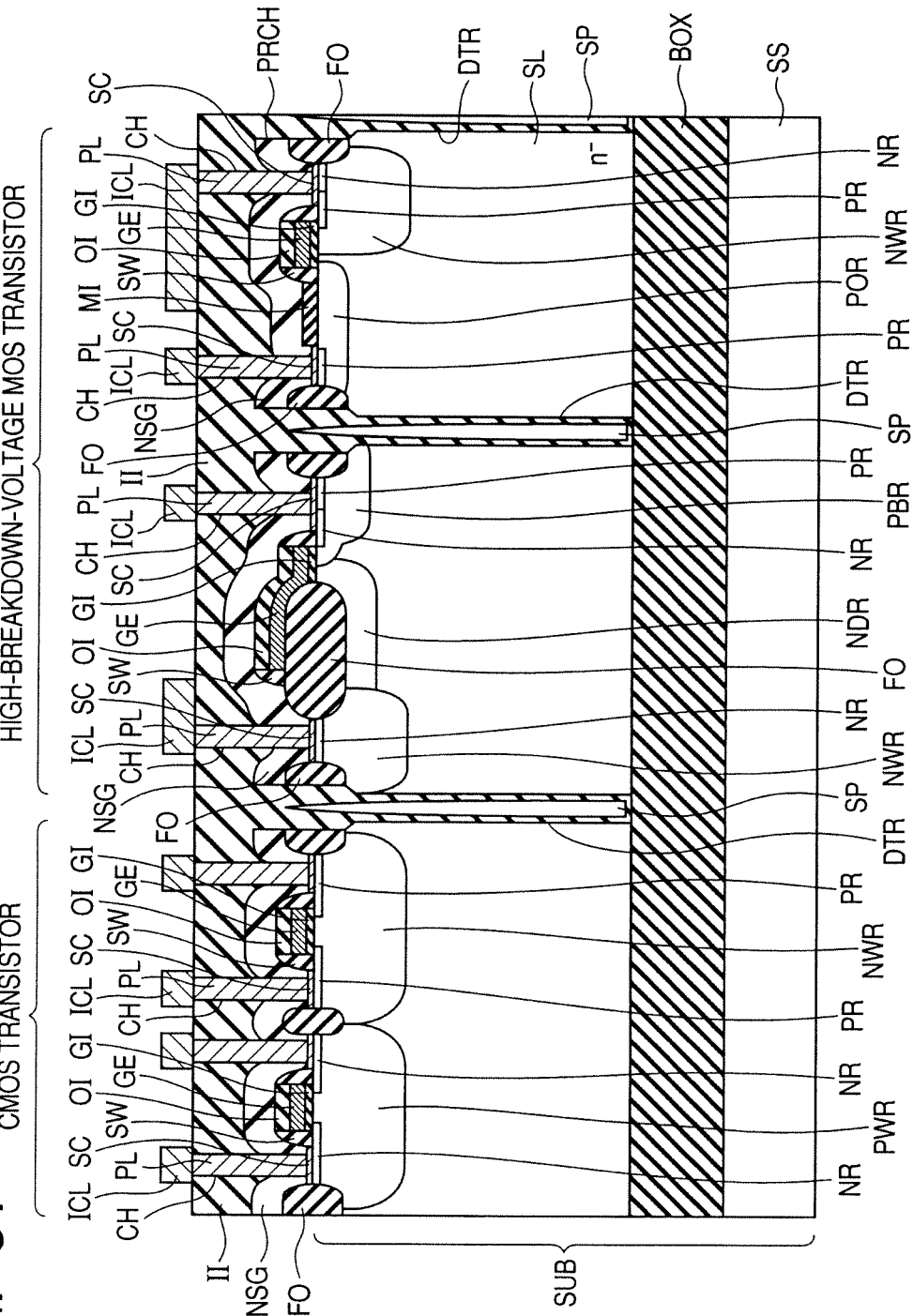
FIG. 61 is a schematic cross-sectional view illustrating the configuration of the another example of the semiconductor device according to Embodiment 3 of the present invention.
Figure 62:
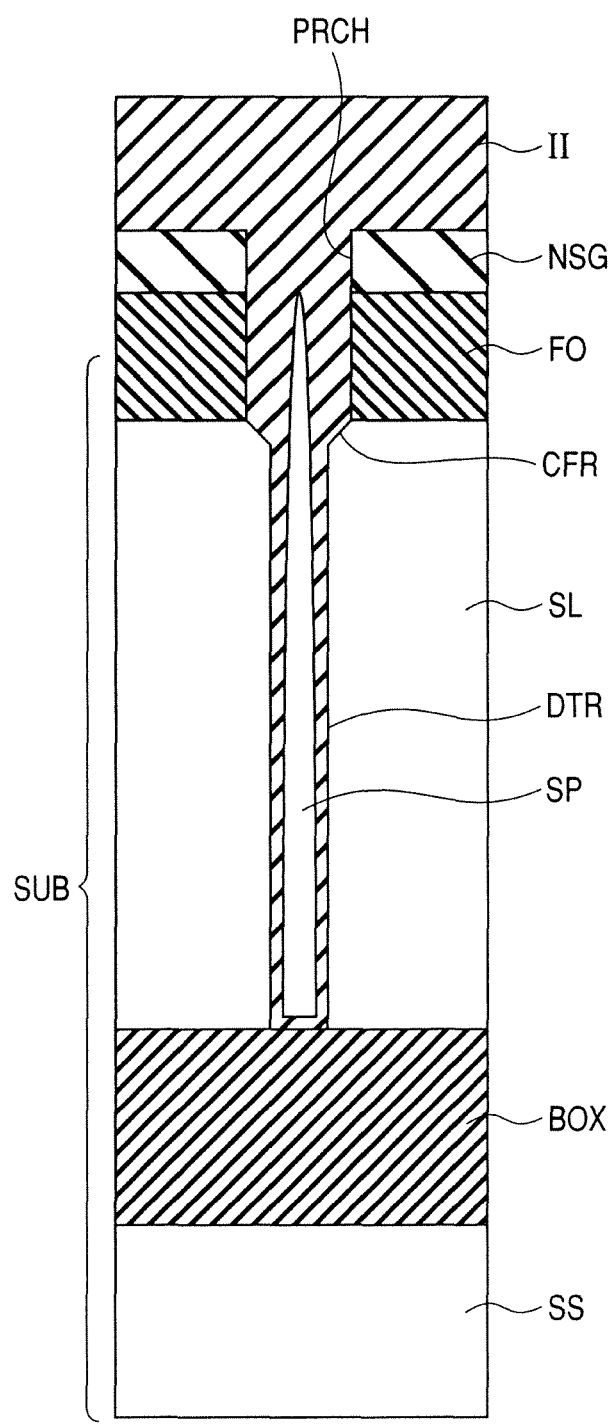
FIG. 62 is an enlarged cross-sectional view of the trench portion of FIG. 61.
Figure 63:
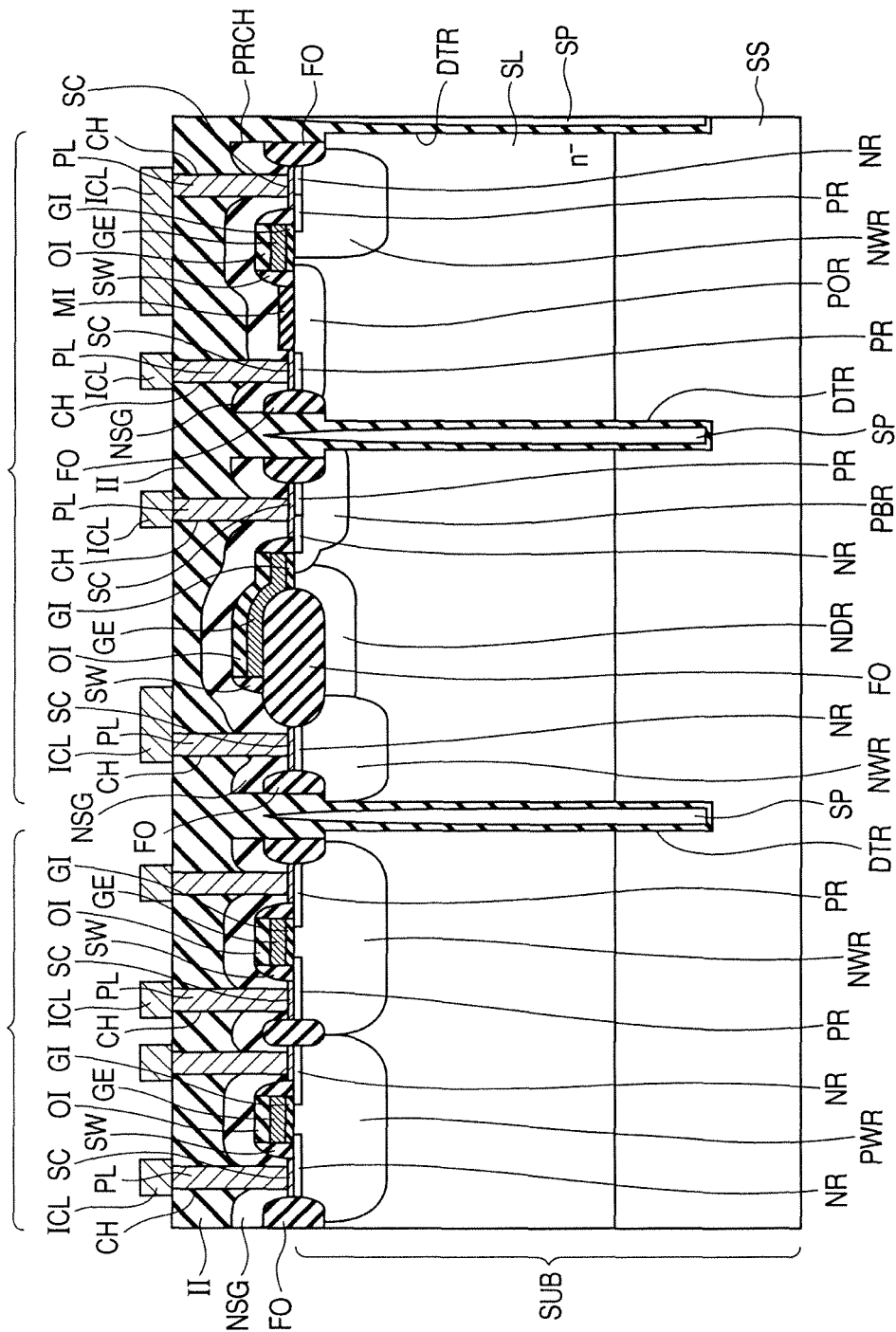
FIG. 63 is a schematic cross-sectional view illustrating the configuration of the one example of the semiconductor device according to Embodiment 3 of the present invention formed using the bulk semiconductor substrate SUB having no buried insulating film BOX.
Figure 64:
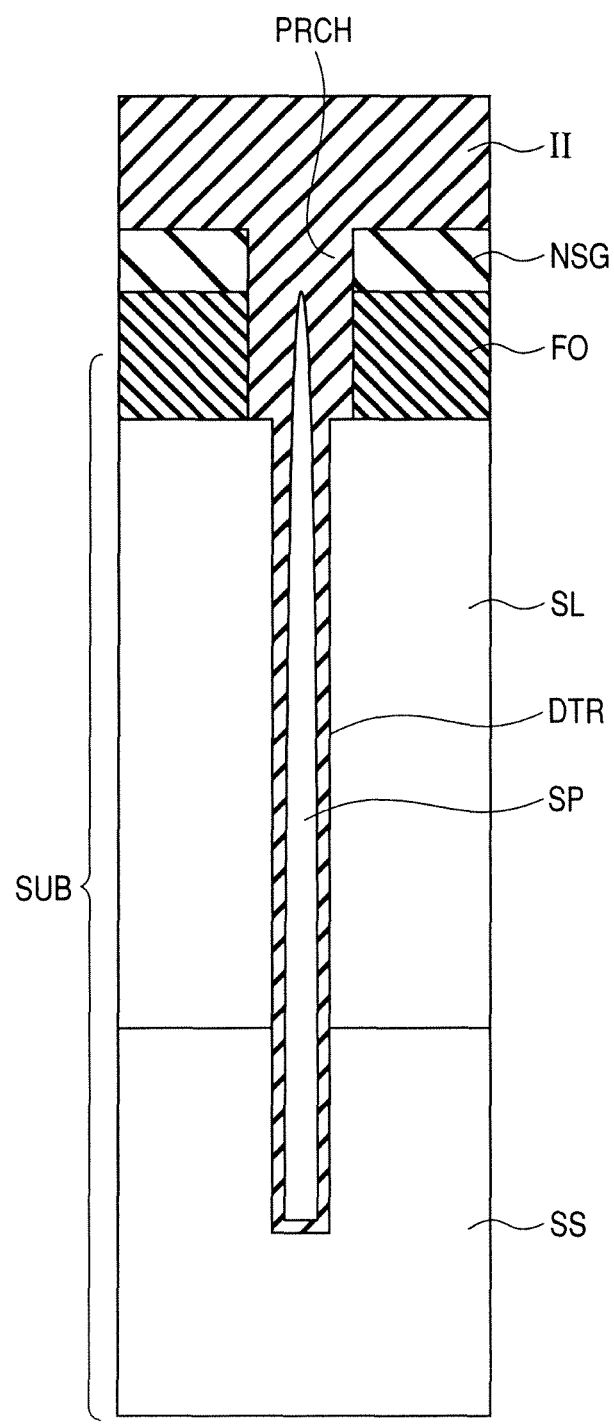
FIG. 64 is an enlarged cross-sectional view of the trench portion of FIG. 63.
Figure 65:
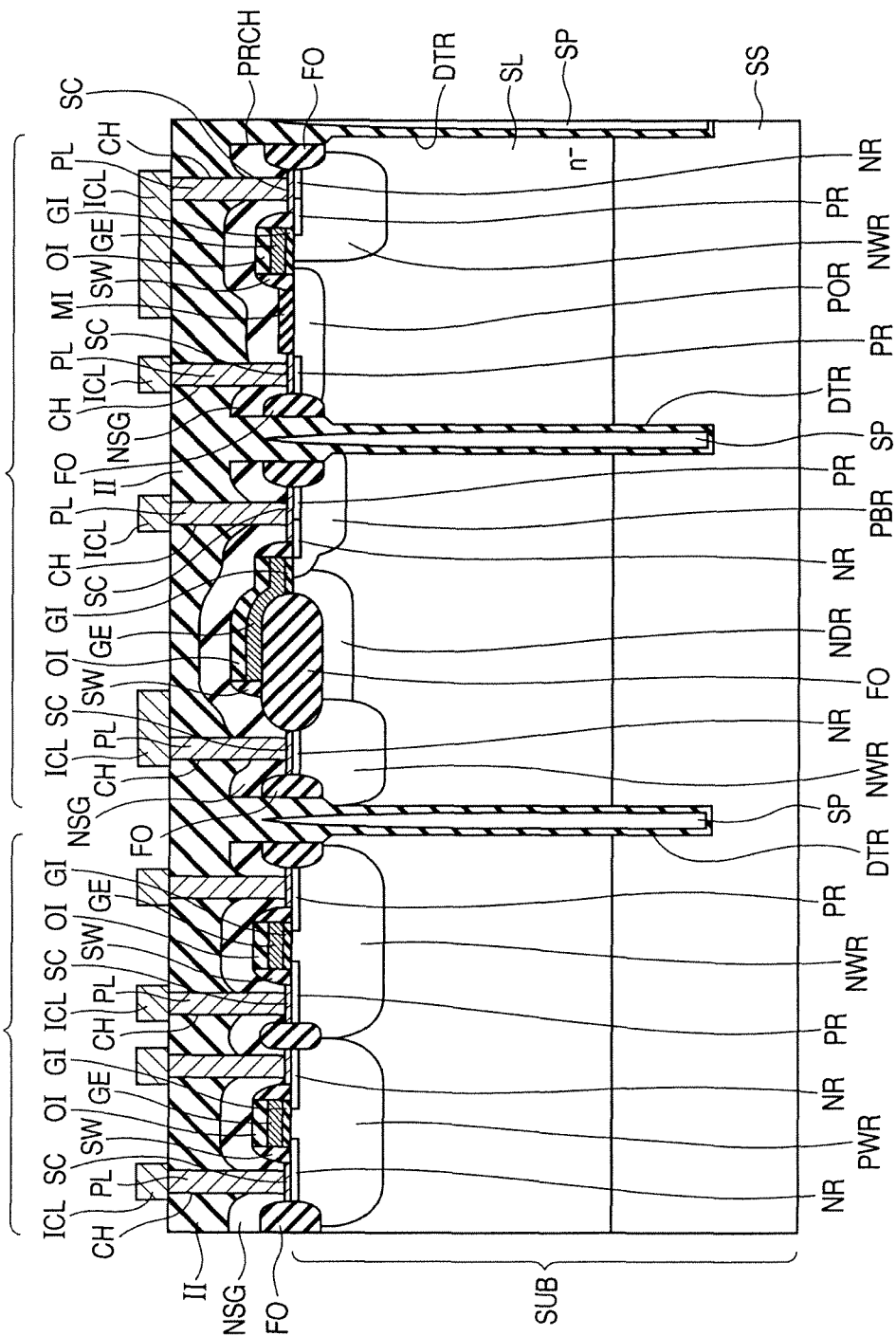
FIG. 65 is a schematic cross-sectional view illustrating the configuration of the another example of the semiconductor device according to Embodiment 3 of the present invention formed using the bulk semiconductor substrate SUB having no buried insulating film BOX.
Figure 66:
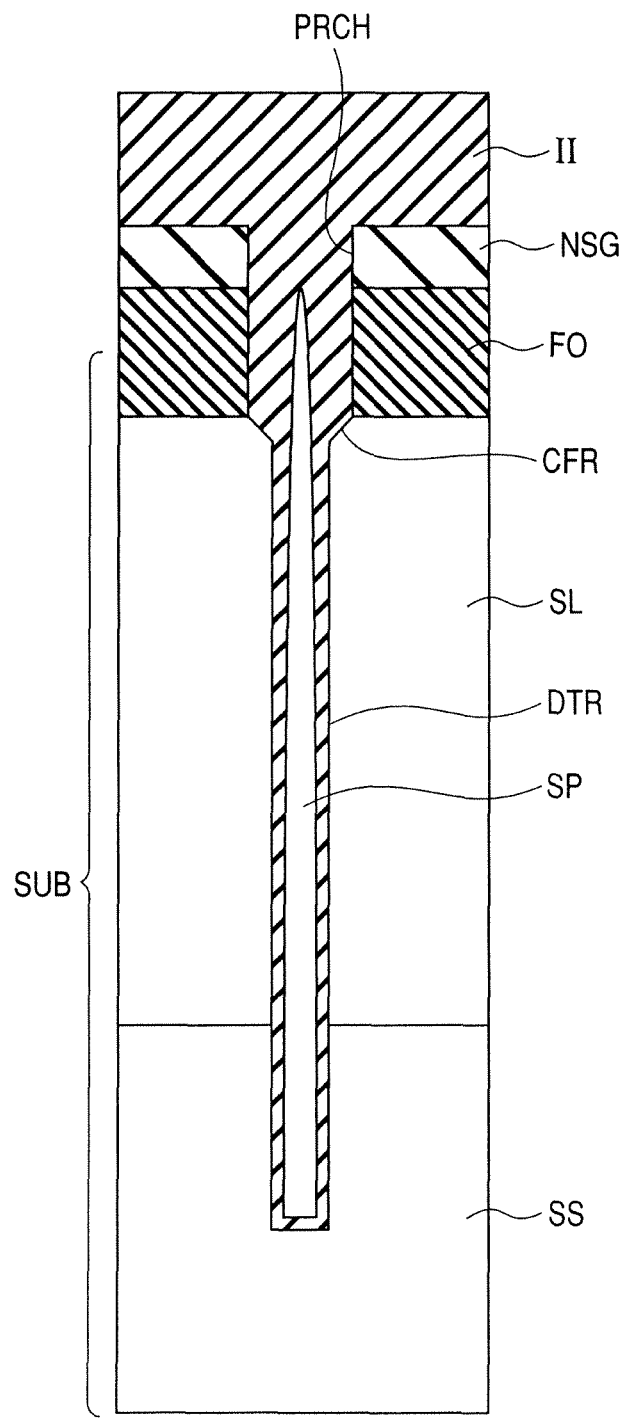
FIG. 66 is an enlarged cross-sectional view of the trench portion of FIG. 65.

A semiconductor device having the trench DTR with the shape illustrated in FIG. 55 has a mode as illustrated in FIG. 59 and an enlarged view of the vicinity of the trench DTR portion is as illustrated in FIG. 60. A semiconductor device having the trench DTR with the shape illustrated in FIG. 56 has a mode as illustrated in FIG. 61 and an enlarged view of the vicinity of the trench DTR portion is as illustrated in FIG. 62. A semiconductor device having the trench DTR with the shape illustrated in FIG. 57 has a mode as illustrated in FIG. 63 and an enlarged view of the vicinity of the trench DTR portion is as illustrated in FIG. 64. A semiconductor device having the trench DTR with the shape illustrated in FIG. 58 has a mode as illustrated in FIG. 65 and an enlarged view of the vicinity of the trench DTR portion is as illustrated in FIG. 66.

FIGS. 59, 61, 63, and 65 are drawings corresponding to FIG. 3 of Embodiment 1. The width of the trench DTR of the semiconductor layer SL illustrated in each of FIGS. 60, 62, 64, and 66 is almost equal to the width of the trench DTR of the semiconductor layer SL of Embodiment 1.

The configuration of the present embodiment is much the same as the configuration of Embodiment 1 except for the above-described points so that in FIGS. 55 to 66, members same as those in Embodiment 1 will be identified by like reference numerals and overlapping descriptions will be omitted.

In Embodiment 3, since the width of the trench DTR (opening PRCH) of the underlying oxide film NSG is made greater than that of the trench DTR of the semiconductor layer SL, it is preferred to conduct a common step (for example, corresponding to FIG. 9 of Embodiment 1) of forming the trench DTR reaching a buried insulating film and then carry out etching so as to increase the width of the trench DTR (opening PRCH) of the underlying oxide film NSG. Upon etching, using a mixed gas of an argon gas, a sulfur hexafluoride ($SF_6$) gas, and an oxygen gas as a gas for etching the underlying oxide film NSG is preferred.

In Embodiment 3, contrary to Embodiment 2, processing is performed so as to make the width of the opening PRCH of the underlying oxide film NSG greater than the width of the trench DTR of the semiconductor layer SL. This is presumed to produce an effect contrary to that of Embodiment 2. Described specifically, since the width of the opening PRCH is large, the air gap top SPT exists at a high position and the interlayer insulating film II thereover seems to be thin. In fact, however, an increase in the width of the opening PRCH over the width of the trench DTR in the semiconductor layer SL enables to embed the interlayer insulating film II, which will be formed in the subsequent step, in the trench DTR more smoothly. This owes to a large width of the opening PRCH of the underlying oxide film NSG, which is an inlet of the interlayer insulating film II into the trench DTR.

When the interlayer insulating film II is embedded in the trench DTR smoothly, a filling percentage of the interlayer insulating film II in the trench DTR increases. With a decrease in the volume of the air gap SP formed in the trench DTR, the air gap top SPT is formed at a lower position. This makes it possible to increase the thickness of the interlayer insulating film II to be formed on the air gap top SPT further, reduce the possibility of the upper portion of the air gap SP undergoing deformation such as expansion, and improve the quality of the trench DTR.

As described above, in order to smoothly embed the trench DTR with the interlayer insulating film II, the underlying oxide film NSG has preferably a thickness of 100 nm or greater. The interlayer insulating film II can be embedded in the trench DTR smoothly also by optimizing a content ratio of a Group III element and a Group V element contained in BP-TEOS configuring the interlayer insulating film II.

Embodiment 3 of the present invention differs from Embodiment 1 of the present invention only in the above-described points. This means that configuration, condition, procedure, and advantage of Embodiment 3 not described above all conform to those of Embodiment 1 of the present invention.

(Embodiment 4)

Figure 67:
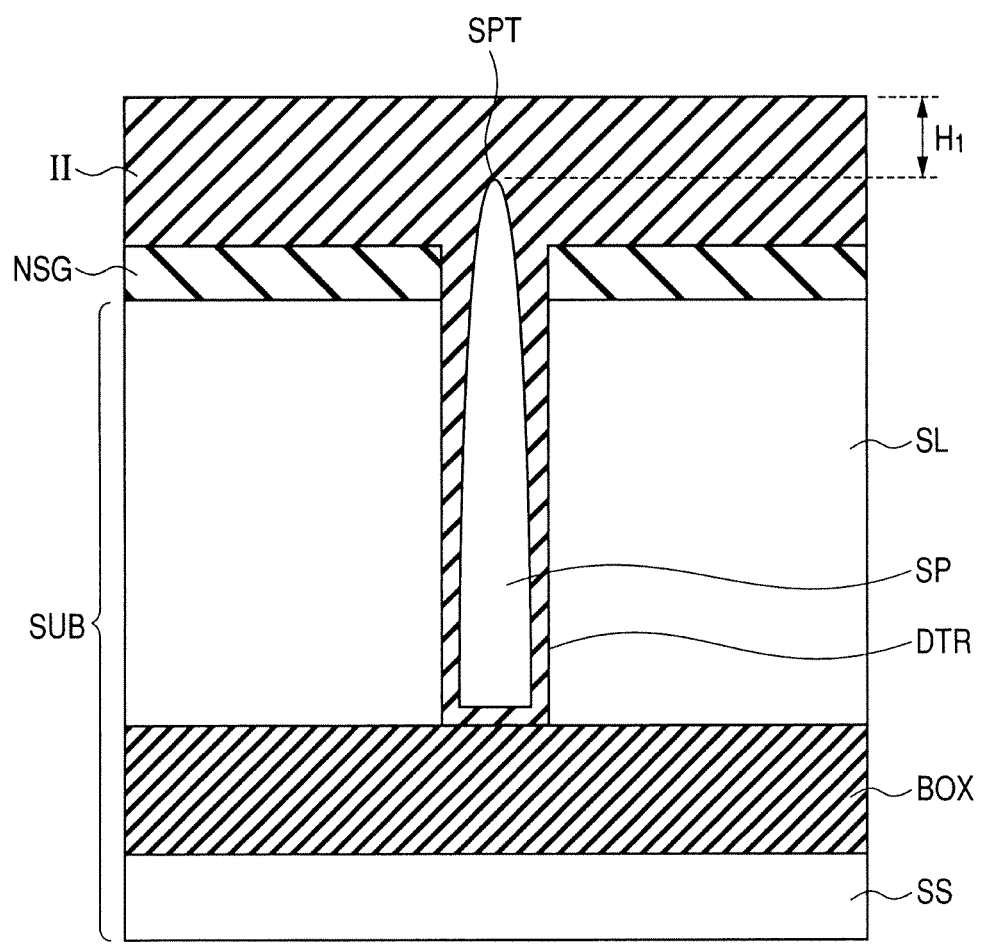
FIG. 67 is a schematic cross-sectional view for describing an increase in the thickness of an interlayer insulating film on the air gap in Embodiment 4 of the present invention.

As described above, when the interlayer insulating film II on the air gap top SPT of the trench DTR is thin, there is a possibility of the air gap SP going through the interlayer insulating film II in a step performed later. In order to suppress this phenomenon, it is preferred to increase the thickness $H_1$ of the interlayer insulating film II on the air gap top SPT as illustrated in FIG. 67, in other words, thicken the entirety of the interlayer insulating film II further. Such a configuration can be manufactured, for example, in the following manner.

For example, after formation of an insulating film thicker than the insulating film IIA formed in FIG. 10 of Embodiment 1, a portion of the film corresponding to the thickness of FIG. 11 of Embodiment 1 is polished and removed by CMP. This makes it possible to form, on the air gap SP, an interlayer insulating film II having a thickness (indicated by $H_1$ in FIG. 67) greater than that of the interlayer insulating film II illustrated in FIG. 11 of Embodiment 1.

Figure 68:
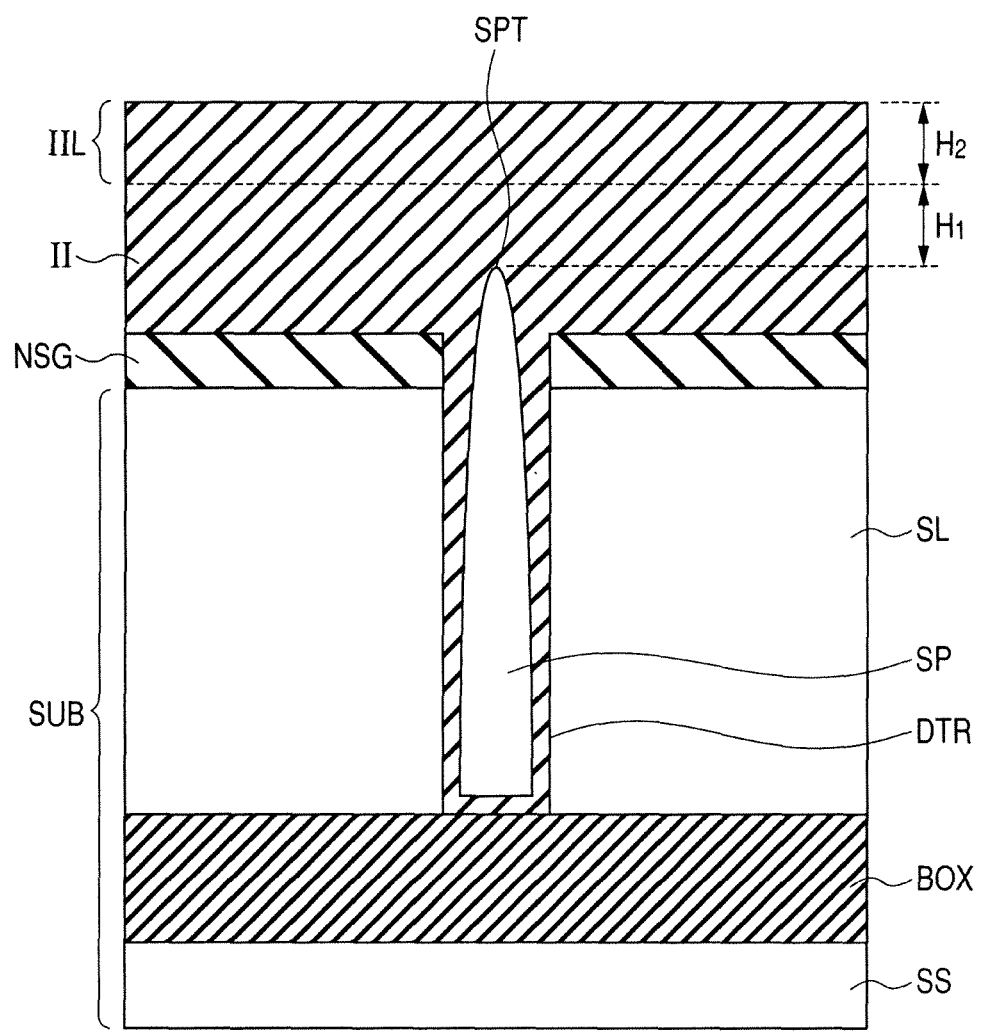
FIG. 68 is a schematic cross-sectional view for describing stacking of another interlayer insulating film over the interlayer insulating film of FIG. 67 in Embodiment 4 of the present invention.

Another method is to form an interlayer insulating film II having a thickness, on the air gap SP, of $H_1$ as illustrated in FIG. 67 and then stack an interlayer insulating film IIL made of a material similar to that of the interlayer insulating film II as illustrated in FIG. 68. As a result, the thickness of the interlayer insulating film II on the air gap SP becomes $H_1+H_2$ as illustrated in FIG. 68. This means that an interlayer insulating film II thicker than the interlayer insulating film II illustrated in FIG. 11 of Embodiment 1 is formed on the air gap SP.

A further method is to form an insulating film having a thickness almost equal to that of the insulating film IIA formed in FIG. 10 of Embodiment 1 and then polish and remove a portion of the film corresponding to the thickness smaller than that of FIG. 11 of Embodiment 1. Also in this case, an interlayer insulating film II having a thickness greater than that (indicated by $H_1$ in FIG. 67) of the interlayer insulating film II illustrated in FIG. 11 of Embodiment 1 is formed.

In FIGS. 67 and 68, the width of the opening of the underlying oxide film NSG is equal to the width of the trench DTR in the semiconductor layer SL as in Embodiment 1. In Embodiment 4, however, the dimensional relationship between the width of the opening of the underlying oxide film NSG and the width of the trench DTR in the semiconductor layer SL may satisfy the relationship in Embodiment 2 or 3. In addition, in Embodiment 4, similar to Embodiment 2 or 3, it does not matter whether the semiconductor substrate SUB is equipped with a buried insulating film BOX or not.

Described specifically, in either the mode of FIG. 67 or the mode of FIG. 68, the thickness of the interlayer insulating film II placed immediately above the air gap SP and a thickness of the interlayer insulating film II and the interlayer insulating film IIL ($H_1$ in FIG. 67 or $H_1+H_2$ in FIG. 68) is preferably 500 nm or greater.

Figure 69:
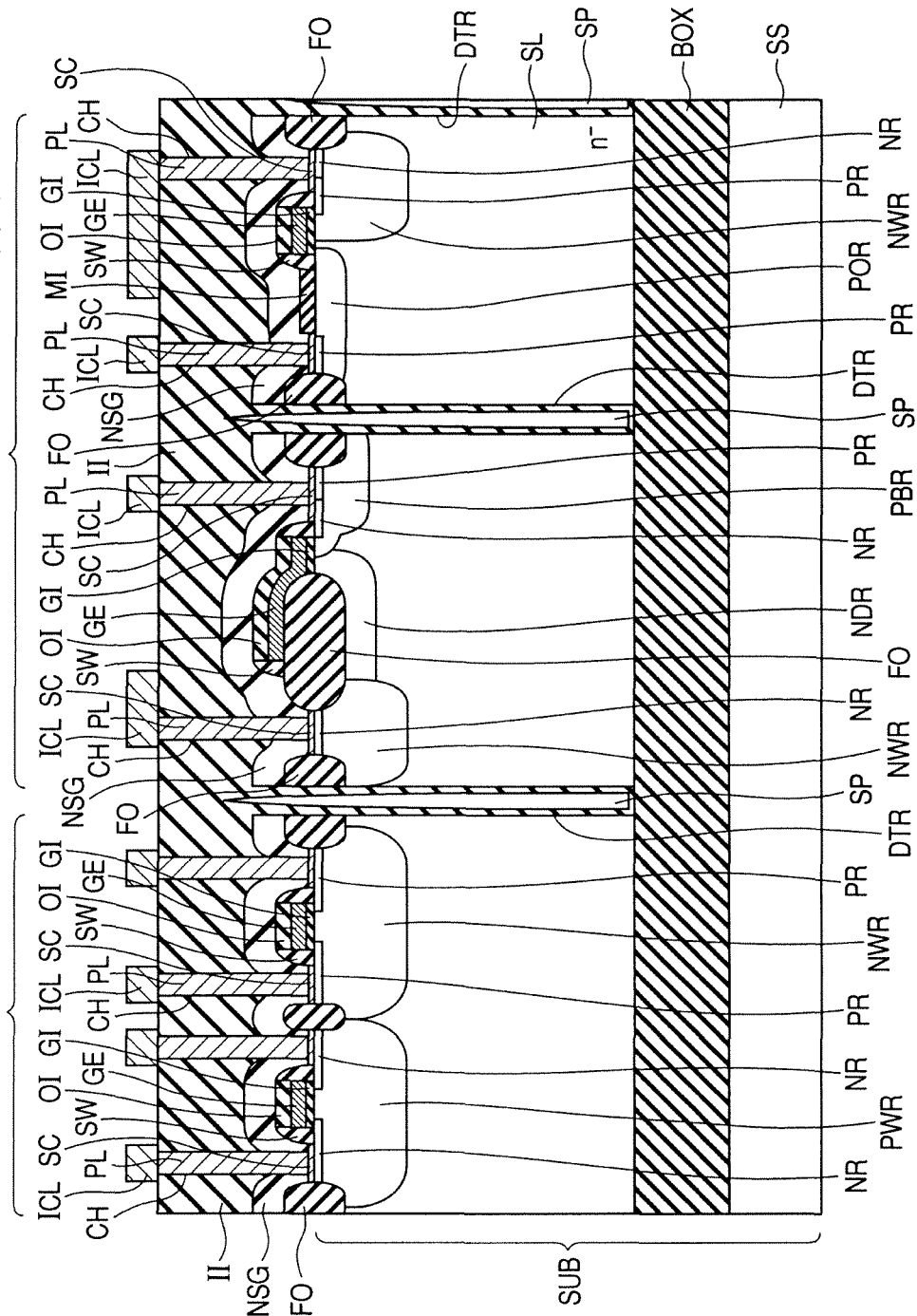
FIG. 69 is a schematic cross-sectional view illustrating the configuration of the semiconductor device according to Embodiment 4 of the present invention.
Figure 70:
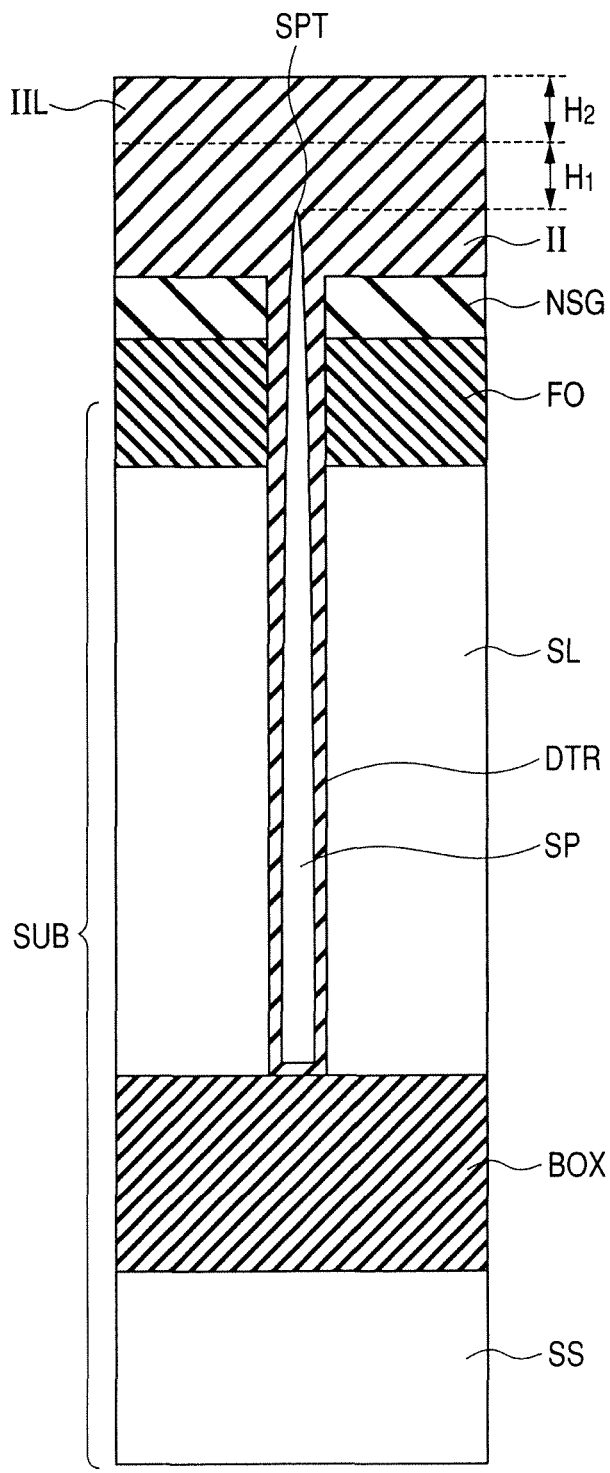
FIG. 70 is an enlarged cross-sectional view of the trench portion of FIG. 69.

A semiconductor device having the trench DTR having the shape of FIG. 68 has a mode as illustrated in FIG. 69 and FIG. 70 is an enlarged view illustrating the vicinity of the trench DTR portion.

Embodiment 4 of the invention is different from Embodiment 1 of the present invention only in the points described above. This means that the configuration, condition, procedure, and advantage of Embodiment 4 not described above all conform to those of Embodiment 1 of the present invention.

(Embodiment 5)

In any of Embodiments 1 to 4 described above, the field oxide film FO is omitted from the schematic cross-sectional views, such as FIG. 24, illustrating only the shape of the trench. A real semiconductor device having elements in combination however has, for example, a field oxide film FO placed in the vicinity of the trench DTR as illustrated in FIG. 3. The field oxide film FO is formed as a LOCOS (element isolating insulating film) for electrically isolating between elements.

Figure 71:
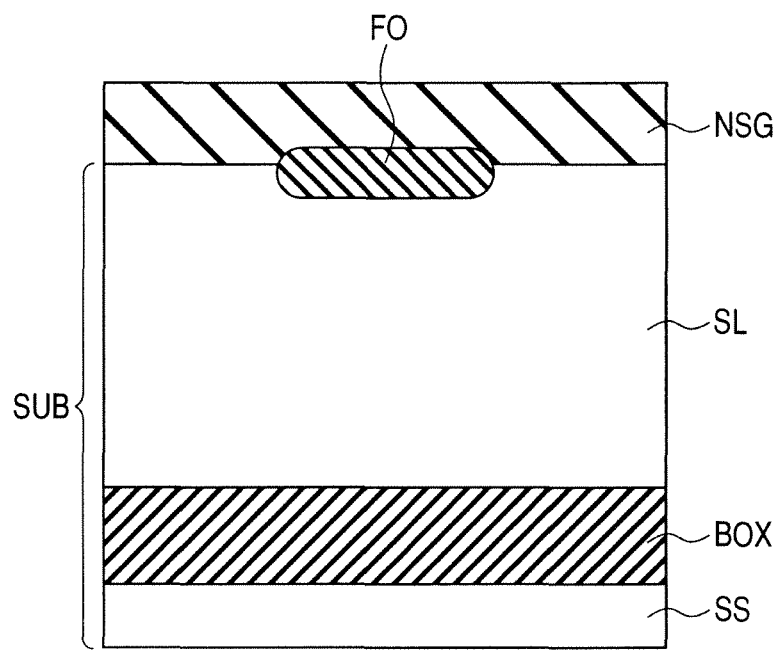
FIG. 71 is a schematic cross-sectional view illustrating an element isolation insulating film (LOCOS) formed in a region in which a trench is to be formed, in Embodiment 5 of the present invention.

Conversely, the trench DTR is preferably formed in a region where LOCOS such as field oxide film FO has been placed. As illustrated in FIG. 71, the field oxide film FO is formed as LOCOS in a part of a region, corresponding to a predetermined depth from the uppermost surface, of the semiconductor layer SL of the semiconductor substrate SUB. An underlying oxide film NSG is formed over the semiconductor substrate SUB (semiconductor layer SL) so as to cover the field oxide film FO. The state illustrated in FIG. 71 corresponds to that after formation of the underlying oxide film NSG illustrated in FIG. 7 of Embodiment 1.

Figure 72:
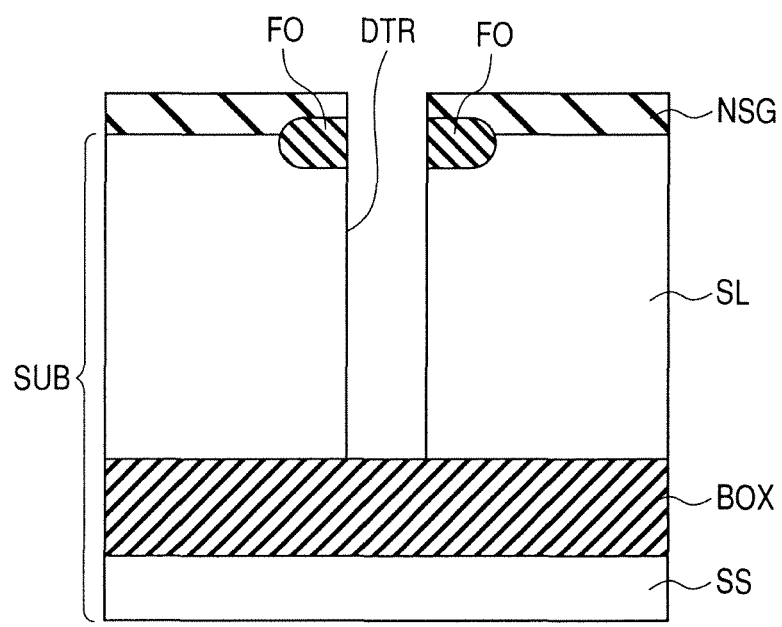
FIG. 72 is a schematic cross-sectional view illustrating the trench penetrating through the element isolation insulating film and reaching a buried insulating film in Embodiment 5 of the present invention.
Figure 73:
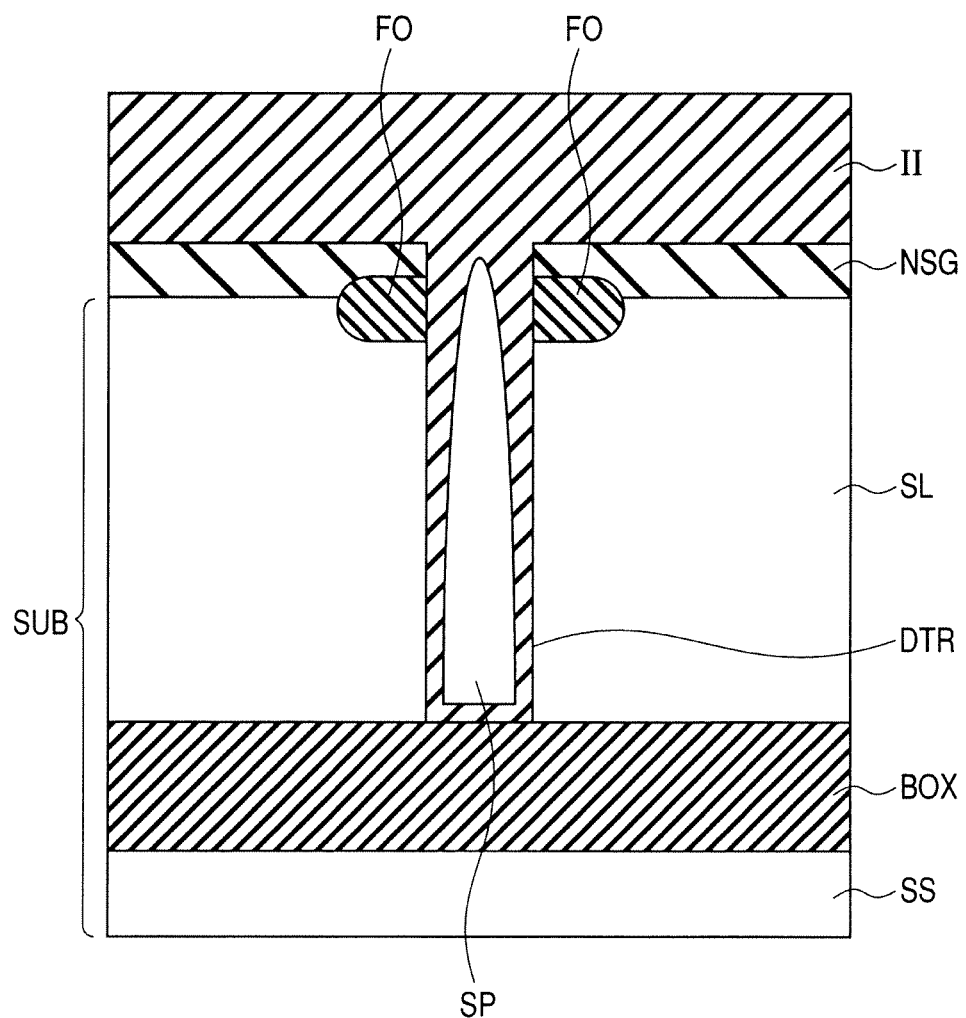
FIG. 73 is a schematic cross-sectional view illustrating an interlayer insulating film formed over an underlying oxide film and in the trench, in Embodiment 5 of the present invention.

As illustrated in FIG. 72, the trench DTR is then formed so as to penetrate the field oxide film FO, the underlying oxide film NSG on the field oxide film FO, and the semiconductor layer SL below the field oxide film FO and reach the buried insulating film BOX. The state illustrated in FIG. 72 corresponds to the state after formation of the trench DTR illustrated in FIG. 9 of Embodiment 1. As illustrated in FIG. 73, then, an interlayer insulating film II is formed, followed by the formation of the interlayer insulating film II in the trench DTR.

Figure 74:
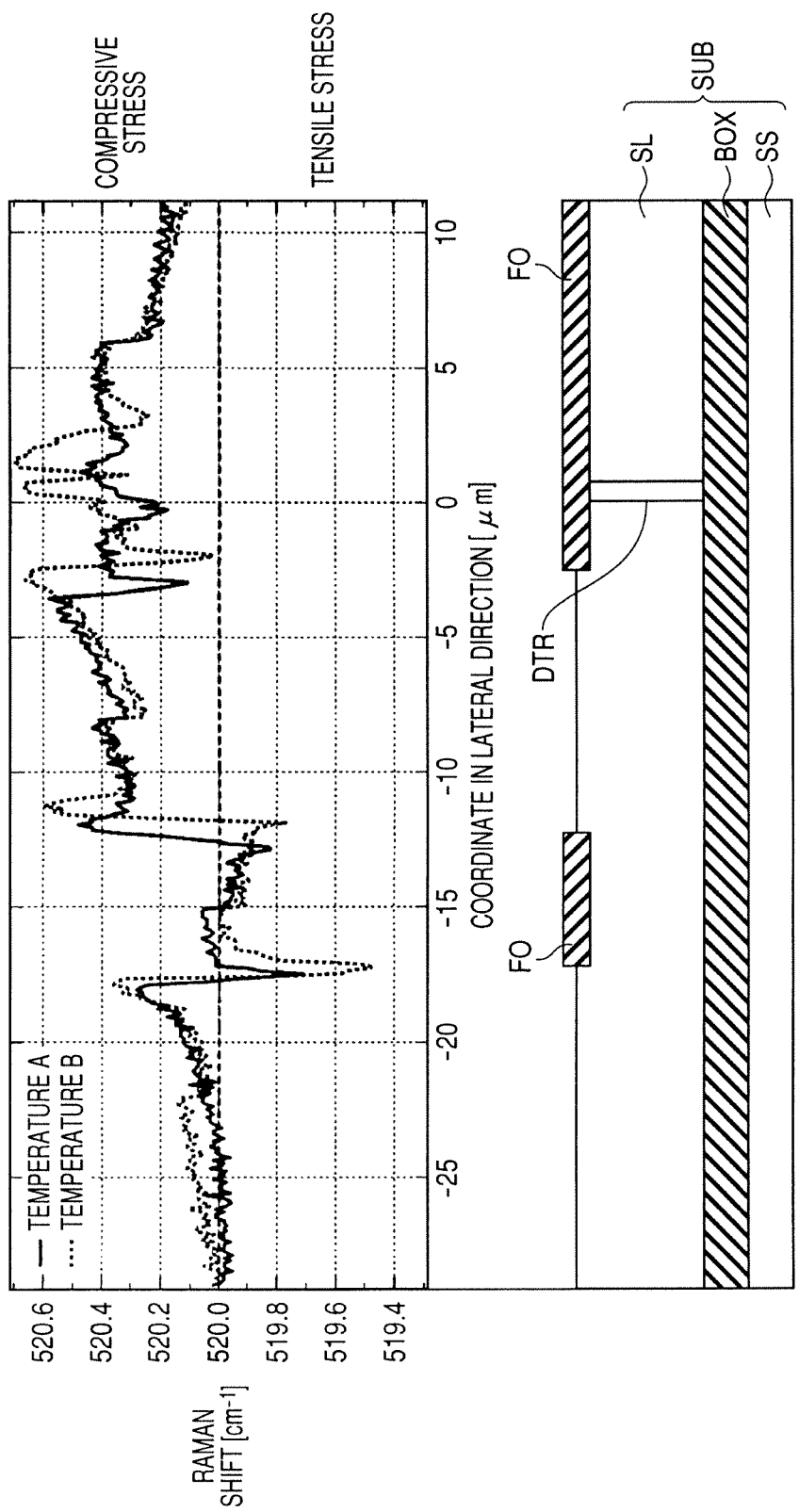
FIG. 74 includes a graph showing an internal stress of an element having an element isolation insulating film and a schematic cross-sectional view of the element.

The abscissa in the graph of FIG. 74 corresponds to each position (coordinate), in the lateral direction, of an element illustrated in the lower side of FIG. 74. The ordinate in the graph of FIG. 74 corresponds to an indicator showing the direction or magnitude of a stress in a region of each coordinate inside the element which indicator is called "Raman shift". A region above 520 cm$^{-1}$, which is at the center in the ordinate, is a region to which a compressive stress has been applied and a region below 520 cm$^{-1}$ is a region to which a tensile stress has been applied.

In FIG. 74, the abscissa of the graph coincides with the position of the element in the lateral direction, which position is indicated by each coordinate of the abscissa. Thus, the specific positions of the coordinate of the abscissa in the graph can be grasped easily. A solid line and a dotted line in the graph of FIG. 74 show the data of the elements formed by heat treatment at different temperatures (temperature A and temperature B), respectively.

It has been understood from the graph of FIG. 74 that independently of the heat treatment temperature, a tensile stress increases in a region where the LOCOS (field oxide film FO) is present. This tensile stress is presumed to be a stress generated due to a difference in thermal expansion coefficient between silicon and a silicon oxide film because the LOCOS is a field oxide film FO made of a silicon oxide film and the field oxide film FO is formed on the semiconductor layer SL made of silicon.

In the region where the trench DTR has been formed, on the other hand, a compressive stress increases. An internal stress in the vicinity of the trench DTR can be reduced by forming the trench DTR in such a manner that it penetrates through the field oxide film FO, because the compressive stress of the trench DTR is offset with the tensile stress of the field oxide film FO.

By reducing the stress in the vicinity of the trench DTR as described above, stress concentration in the vicinity of the trench DTR, on the side surface of the trench DTR, or at the opening portion (opening PRCH of FIG. 28) of the underlying oxide film NSG can be suppressed. Accordingly, generation of crystal defects in the vicinity of the trench DTR or at the opening PRCH can be suppressed more completely. Since the generation of crystal defects can be suppressed, generation of a leakage current due to etching damages (refer to FIGS. 22 and 23) in the vicinity of the side surface of the trench DTR can also be suppressed.

Figure 75:
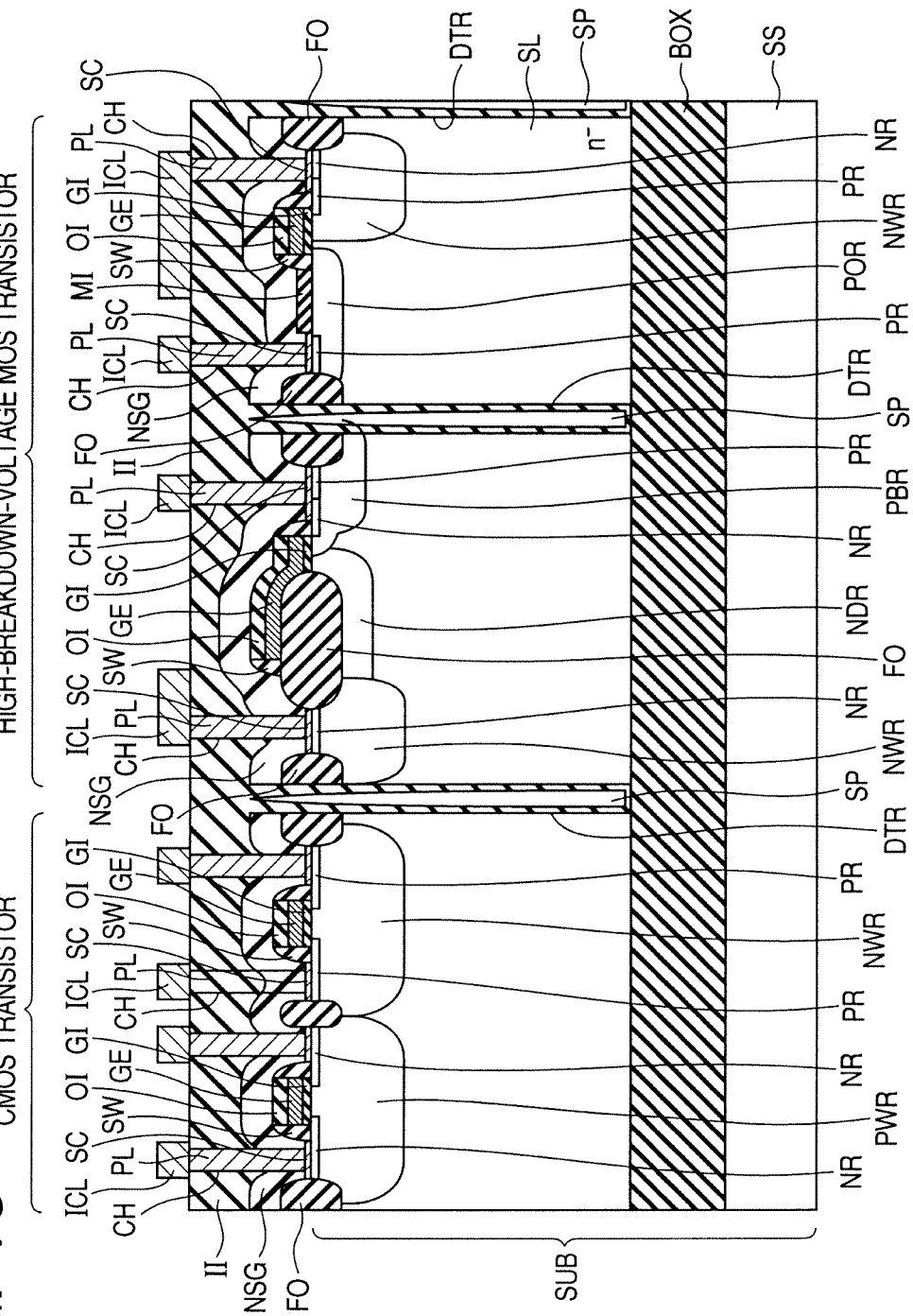
FIG. 75 is a schematic cross-sectional view illustrating the configuration of the semiconductor device according to Embodiment 5 of the present invention.

FIG. 75 is an overall view of a semiconductor device having as a LOCOS a field oxide film FO. It is similar to the overall view of the semiconductor device of FIG. 3.

The semiconductor device having a LOCOS as Embodiment 5 may be formed using a bulk semiconductor substrate SUB not equipped with a buried insulating film BOX (substrate having the semiconductor layer SL on the support substrate SS).

(Embodiment 6)

The present embodiment differs from Embodiment 1 in a mask used for the formation of the trench DTR. The configuration of the present embodiment will hereinafter be described.

Figure 76:
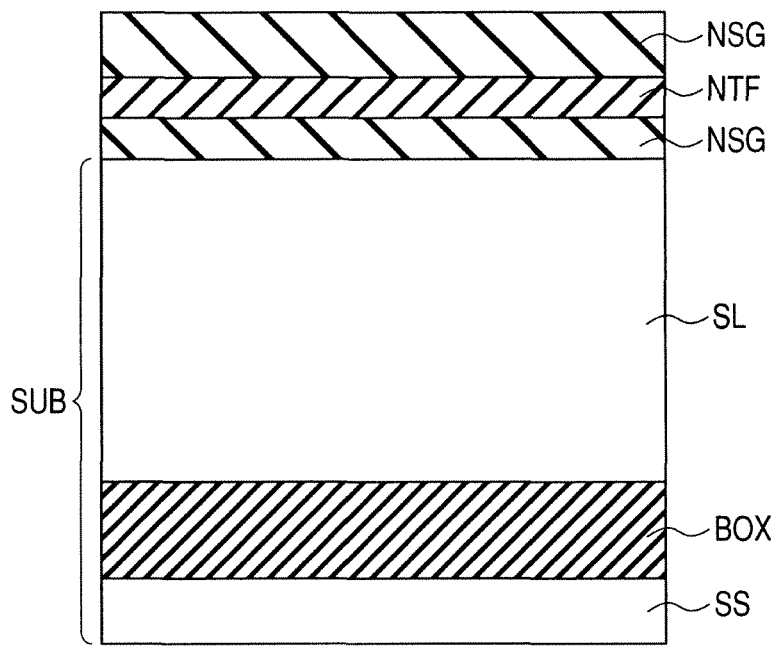
FIG. 76 is a schematic cross-sectional view illustrating an underlying oxide film, an underlying nitride film, and a masking material formed in a region in which a trench is to be formed, in Embodiment 6 of the present invention.

In the present embodiment, as illustrated in FIG. 76, an insulating film formed to cover the element prior to the formation of the trench DTR is composed of, in addition to the underlying oxide film NSG (second insulating film), an underlying nitride film NTF (third insulating film) on the second insulating film and an underlying oxide film NSG (fourth insulating film) on the third insulating film.

This means that the manufacturing method in the present embodiment has, prior to a step of forming the trench DTR, a step of forming the lower underlying oxide film NSG (second insulating film), a step of forming the underlying nitride film NTF (third insulating film) on the underlying oxide film NSG, and a step of forming the upper underlying oxide film NSG (fourth insulating film) on the underlying nitride film NTF.

The underlying nitride film NTF is, for example, a silicon nitride film. The upper and lower underlying oxide films NSG are, for example, non-doped silicon oxide films as described above. The third insulating film is therefore made of a material different from that of the second insulating film and the fourth insulating film is made of a material different from the third insulating film. The state illustrated in FIG. 76 corresponds to the state after formation of the underlying oxide film NSG illustrated in FIG. 7 of Embodiment 1.

Figure 77:
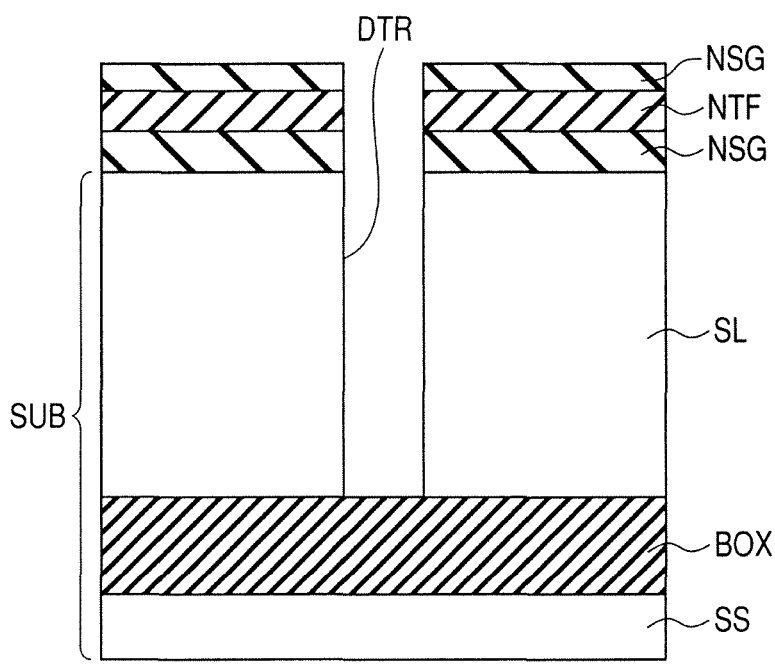
FIG. 77 is a schematic cross-sectional view illustrating the trench formed after the step of FIG. 76 in Embodiment 6 of the present invention.

Thus, after formation of a plurality of insulating films over the semiconductor layer SL, the trench DTR is formed as illustrated in FIG. 77. The state of FIG. 77 corresponds to the state after formation of the trench DTR illustrated in FIG. 9 of Embodiment 1.

Then, a photoresist pattern (not illustrated) is formed on the upper underlying oxide film NSG by commonly used photolithography. With the photoresist pattern as a mask, the upper underlying oxide film NSG, the underlying nitride film NTF, and the lower underlying oxide film NSG are patterned successively by etching. The resist pattern is then removed, for example, by ashing. With the patterned upper underlying oxide film NSG as a mask, the semiconductor layer SL is etched. As a result, a trench DTR reaching the buried insulating film BOX from the main surface of the semiconductor layer SL is formed. After formation of the trench DTR, the upper underlying oxide film NSG and the underlying nitride film NTF are removed to obtain the state illustrated in FIG. 9. Then, steps similar to those in Embodiment 1 are performed to manufacture a semiconductor device having a configuration similar to that of FIG. 3.

When a single layer of the underlying oxide film NSG is used as an etching mask for forming the trench DTR as in Embodiment 1 illustrated in FIG. 9, there may occur variations in film thickness or film quality of the underlying oxide film NSG by etching for forming the trench DTR.

In the present embodiment, on the other hand, with the upper underlying oxide film NSG as a mask, the trench DTR is formed. The upper surface of the lower underlying oxide film NSG is protected with the underlying nitride film NTF and the upper underlying oxide film NSG. Etching upon formation of the trench DTR does not influence the upper surface of the lower underlying oxide film NSG. As a result, variations in the thickness of the lower underlying oxide film NSG can be suppressed.

The semiconductor device manufactured using the manufacturing method shown in Embodiment 6 has a mode similar to that of FIG. 3 or FIG. 75. Also in Embodiment 6, characteristics or manufacturing conditions of the trench DTR shown in Embodiments 2, 3, 4, and 5 may be used in combination as needed.

Embodiment 6 of the present invention differs from Embodiment 1 of the present invention only in the above-described points. This means that the configuration, condition, procedure, and advantage of Embodiment 6 of the present invention not described above all conform to those of Embodiment 1 of the present invention.

(Embodiment 7)

The present embodiment differs from Embodiment 6 in a sidewall insulating film SW formed on the side surface of the trench DTR. The configuration of the present embodiment will hereinafter be described.

In the present embodiment similar to Embodiment 6, a lower underlying oxide film NSG, an underlying nitride film NTF, and an upper underlying oxide film NSG are formed successively on the main surface of a semiconductor layer SL and then, with the upper underlying oxide film NSG as a mask, the semiconductor layer SL is etched, as illustrated in FIG. 77. As a result, a trench DTR is formed in the semiconductor layer SL.

Figure 78:
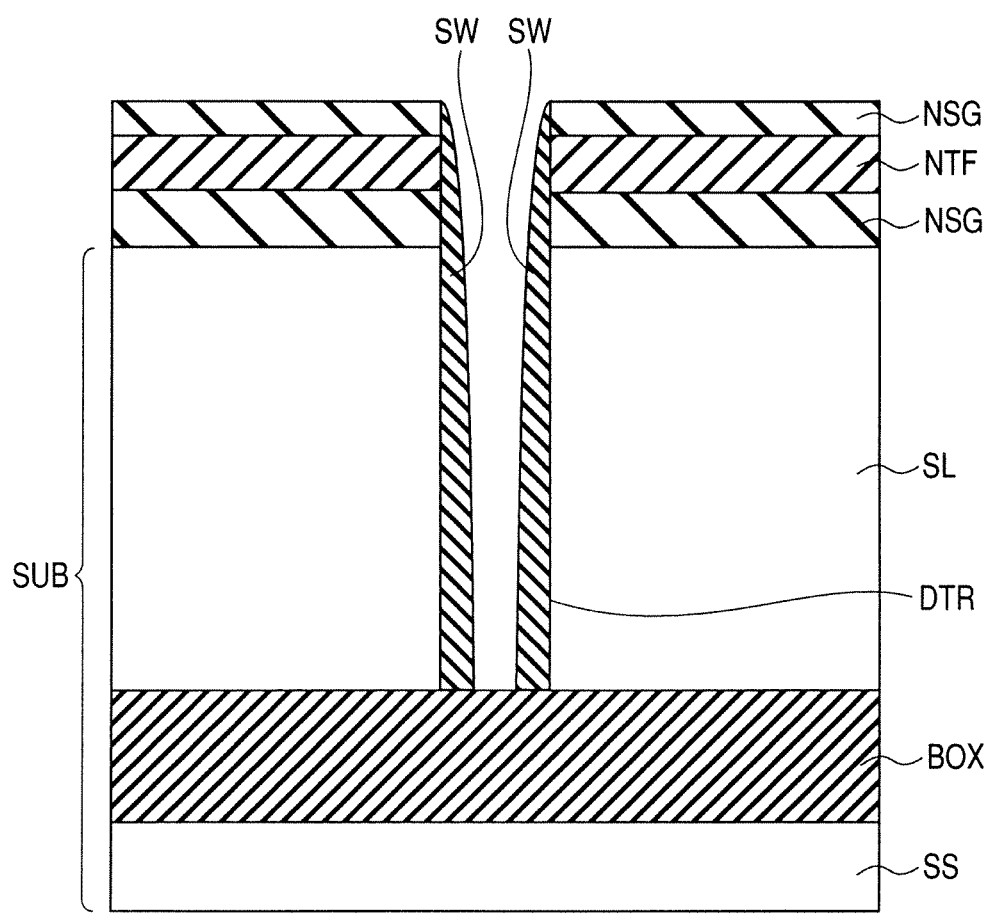
FIG. 78 is a schematic cross-sectional view illustrating a sidewall insulating film formed after the step of FIG. 77 in Embodiment 7 of the present invention.

As illustrated in FIG. 78, an insulating film made of, for example, a silicon oxide film is formed on the inner wall of the trench DTR and on the upper surface of the upper underlying oxide film NSG. Then, the insulating film is etched back until the upper surface of the upper underlying oxide film NSG is exposed. As a result, a sidewall insulating film SW is made of, for example, a silicon oxide film so as to cover the sidewall of the trench DTR. Then, the upper underlying oxide film NSG and the underlying nitride film NTF are removed.

Figure 79:
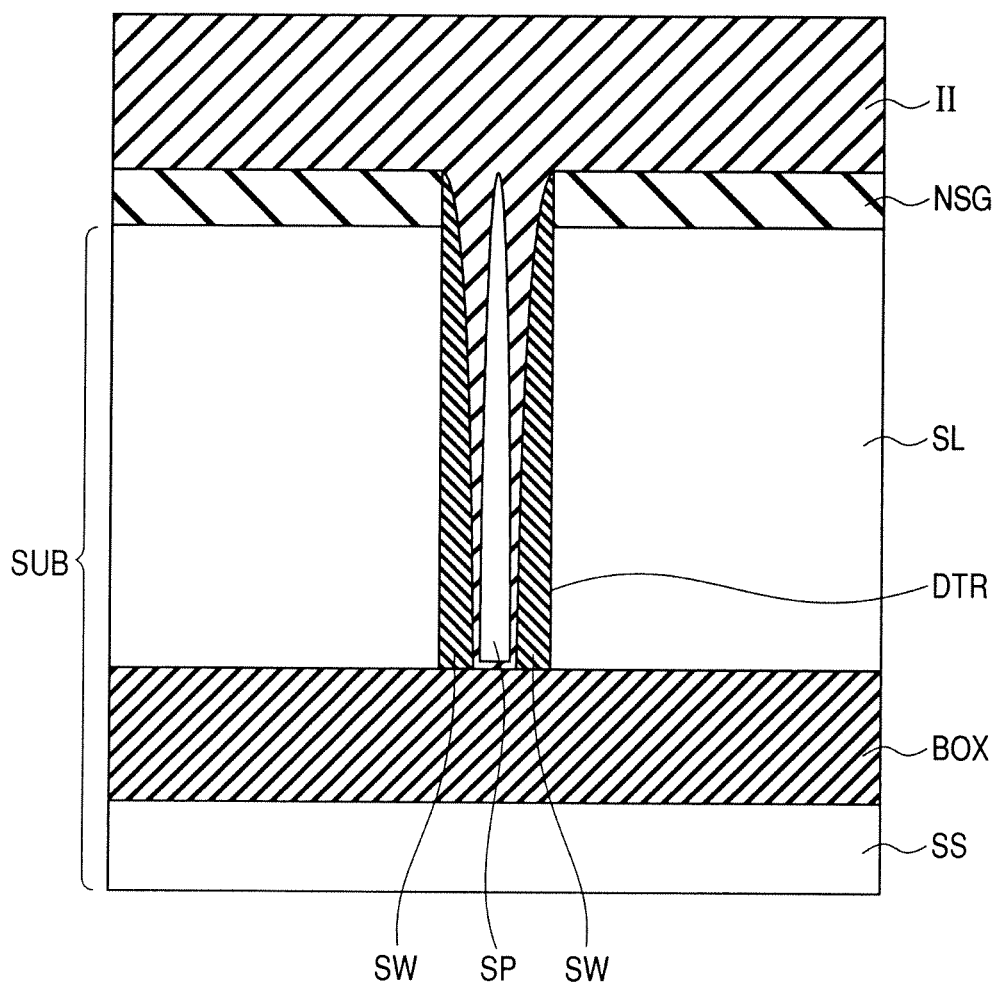
FIG. 79 is a schematic cross-sectional view illustrating the inner state of the trench formed after the step of FIG. 78 in Embodiment 7 of the present invention.

As illustrated in FIG. 79, an interlayer insulating film II is formed on the lower underlying oxide film NSG and in the trench DTR so as to cover the exposed surface of the lower underlying oxide film NSG and form an air gap SP in the trench DTR. Then, steps similar to those in Embodiment 1 are conducted to manufacture a semiconductor device of the present embodiment as illustrated in FIG. 80.

Figure 80:
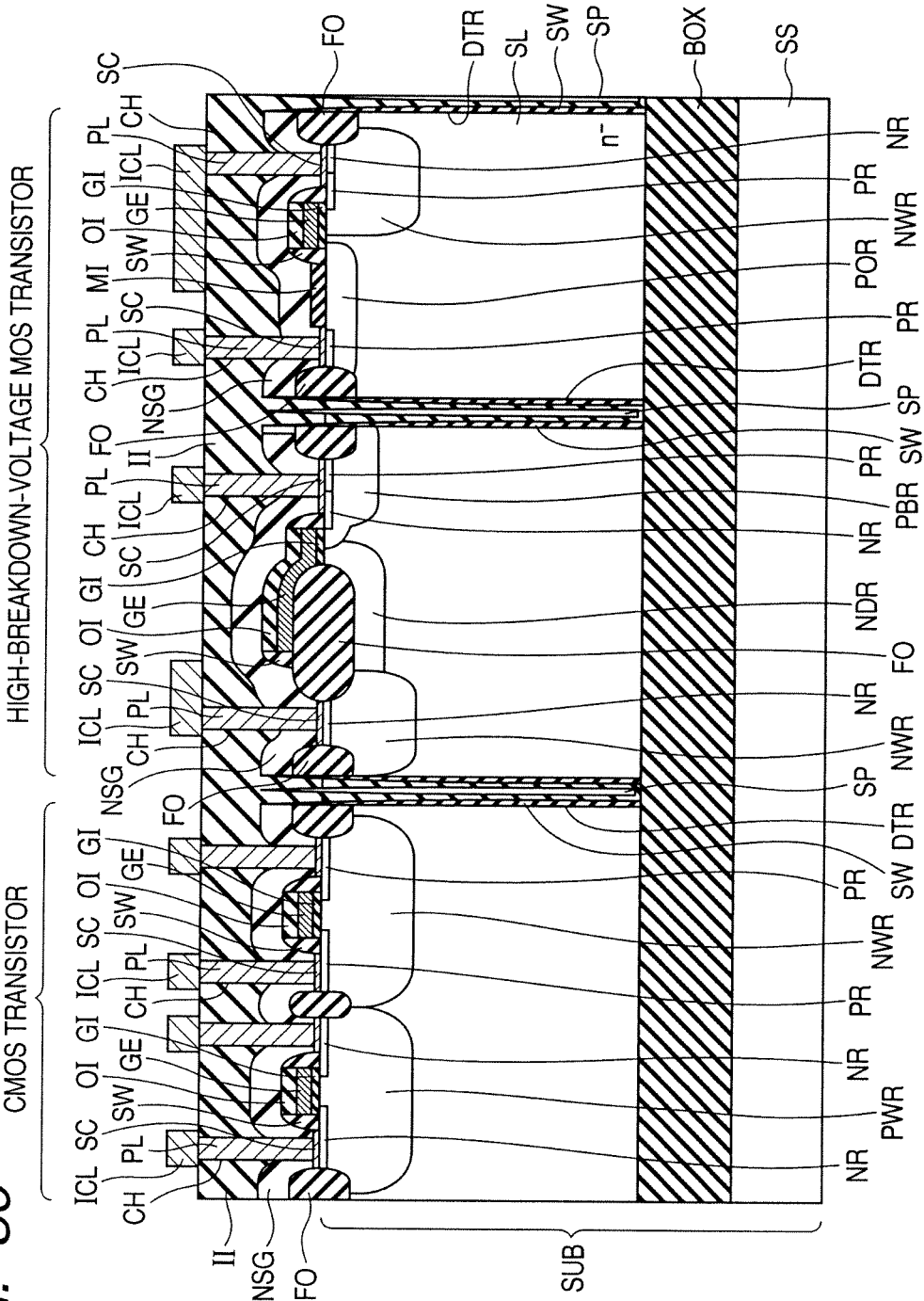
FIG. 80 is a schematic cross-sectional view illustrating the configuration of a semiconductor device according to Embodiment 7 of the present invention.
Figure 81:
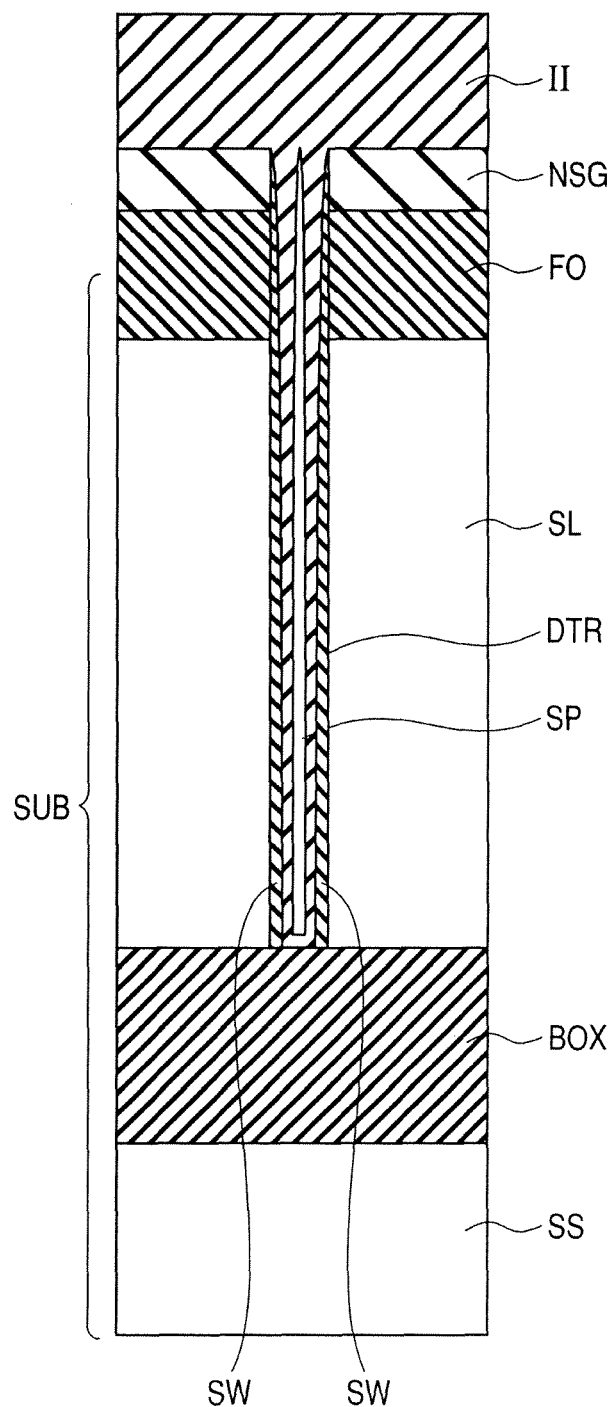
FIG. 81 is an enlarged cross-sectional view of the trench portion of FIG. 80.

The semiconductor device having the trench DTR with the sidewall insulating film SW has a mode as illustrated in FIG. 80 and FIG. 81 is an enlarged view of the vicinity of the trench DTR portion.

The configuration of the present embodiment is much the same as the configuration of Embodiment 1 except that it has the sidewall insulating film SW so that in FIGS. 78 to 81, members same as those in Embodiment 1 will be identified by like reference numerals and description on them is not repeated.

Effect and advantage of the present embodiment will next be described. As illustrated in FIG. 77, a chemical solution of phosphoric acid is ordinarily used in order to remove the underlying nitride film NTF. When the phosphoric acid solution attaches to the surface of the semiconductor layer SL made of silicon, the surface of the semiconductor SL becomes rough in a region to which phosphoric acid has attached. An increase in a leakage current may occur due to the roughness of the surface of the semiconductor layer SL.

By forming the sidewall insulating film SW for protecting the surface (side surface) of the semiconductor layer SL as in the present embodiment, it is possible to suppress exposure of the surface of the semiconductor layer SL directly to phosphoric acid. Thus, it is possible to suppress roughening of the surface of the semiconductor layer SL and thereby suppress an increase in the leakage current.

In addition, since the sidewall insulating film SW is formed, a formation region of the interlayer insulating film II in the trench DTR becomes substantially narrow. The position of the air gap top SPT of the air gap SP formed in the trench DTR at the time of formation of the interlayer insulating film II is lowered. This owes to a decrease in the size of the air gap SP due to narrowing of a region in which the air gap SP can be formed. Similar to Embodiment 2 or 3, it is possible to increase the thickness of the interlayer insulating film II on the air gap top SPT, thereby preventing deformation of the air gap SP or breaking-through of the interlayer insulating film II.

When solid-phase diffusion of a Group III element or Group V element into the element is preferred in view of the properties of the element to be formed, the sidewall insulating film SW is preferably non-doped one.

Also in Embodiment 7, the characteristics or manufacturing conditions of the trench DTR shown in Embodiments 2, 3, 4, and 5 may be used in combination as needed. In the above description, a manufacturing method using an underlying nitride film NTF as in Embodiment 6 is shown as one example. A manufacturing method of forming the sidewall insulating film SW in the trench DTR without using the underlying nitride film NTF as in Embodiment 1 may also be used.

Embodiment 7 of the present invention differs from Embodiment 6 of the present invention only in the above-described points. The configuration, condition, procedure, and advantage of Embodiment 7 of the present invention not described above all conform to those of Embodiment 6 of the present invention.

Embodiments disclosed herein are all exemplary and are not limiting. The scope of the present invention does not depend on the above-described one but defined by the claims. Meanings equivalent to the claims and modifications within the scope may be embraced in the present invention.

The present invention is applied particularly advantageously to a semiconductor device with a trench and a manufacturing method of the semiconductor device.

What is claimed is:

1. A manufacturing method of a semiconductor device, comprising the steps of:
    preparing a semiconductor substrate having a configuration obtained by stacking a support substrate, a buried insulating film, and a semiconductor layer in order of mention;
    completing an element having a conductive portion over the main surface of the semiconductor layer;
    forming a trench encompassing the element therewith in a planar view so that the trench reaches the buried insulating film from the main surface of the semiconductor layer;
    forming a first insulating film over the element and in the trench to cover the element and form an air gap in the trench, respectively; and
    forming, in the first insulating film, a hole reaching the conductive portion of the element.

2. The manufacturing method of a semiconductor device according to claim 1, further comprising a step of forming an element isolation insulating film over the main surface of the semiconductor layer,
    wherein the trench penetrates through the element isolation insulating film and reaches the buried insulating film.

3. The manufacturing method of a semiconductor device according to claim 1 or 2, further comprising, prior to the formation of the trench, the steps of:
    forming a second insulating film over the main surface of the semiconductor layer to cover the element therewith,
    forming a third insulating film made of a material different from the material of the second insulating film; and
    forming a fourth insulating film made of a material different from the material of the third insulating film,
    wherein the trench formation step further comprises a step of selectively removing the semiconductor layer with the fourth insulating film as a mask, and
    wherein the manufacturing method further comprises a step of removing the fourth and third insulating films after formation of the trench.

4. The manufacturing method of a semiconductor device according to claim 1 or 2, further comprising, after formation of the trench but prior to the formation of the first insulating film, a step of forming a sidewall insulating film over the side surface of the trench.

5. A semiconductor device, comprising:
- a semiconductor substrate having a configuration obtained by stacking a support substrate, a buried insulating film, and a semiconductor layer in order of mention;
- an element formed over the main surface of the semiconductor layer and having a conductive portion;
- a trench formed in the semiconductor layer so that the trench encompasses the element therewith in a planar view and reaches the buried insulating film from the main surface of the semiconductor layer; and
- a first insulating film formed over the element and in the trench to cover the element and form an air gap in the trench, respectively, wherein the first insulating film has a hole reaching the conductive portion.

* * * * *